US009443872B2

(12) United States Patent
Miyairi

(10) Patent No.: US 9,443,872 B2
(45) Date of Patent: Sep. 13, 2016

(54) SEMICONDUCTOR DEVICE

(71) Applicant: Semiconductor Energy Laboratory Co., Ltd., Atsugi-shi, Kanagawa-ken (JP)

(72) Inventor: Hidekazu Miyairi, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/638,504

(22) Filed: Mar. 4, 2015

(65) Prior Publication Data

US 2015/0255490 A1    Sep. 10, 2015

(30) Foreign Application Priority Data

Mar. 7, 2014 (JP) ................. 2014-044473
Mar. 12, 2014 (JP) ................. 2014-048727

(51) Int. Cl.
| H01L 27/14 | (2006.01) |
| H01L 27/12 | (2006.01) |
| H01L 29/786 | (2006.01) |
| H01L 23/48 | (2006.01) |
| H01L 27/06 | (2006.01) |

(52) U.S. Cl.
CPC ......... *H01L 27/1207* (2013.01); *H01L 23/481* (2013.01); *H01L 27/0688* (2013.01); *H01L 27/1225* (2013.01); *H01L 27/1255* (2013.01); *H01L 29/7869* (2013.01); *H01L 2924/0002* (2013.01)

(58) Field of Classification Search
CPC ................ H01L 27/10805; H01L 29/7869; H01L 29/78693

USPC ............................................. 257/59, 72, 258
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

R. Brain et al., "A 22nm High Performance Embedded DRAM SoC Technology Featuring Tri-gate Transistors and MIMCAP COB", 2013 Symposium on VLSI Technology: Digest of Technical Papers, Jun. 11, 2013, pp. T16-T17.

(Continued)

*Primary Examiner* — Tan N Tran
(74) *Attorney, Agent, or Firm* — Fish & Richardson P.C.

(57) ABSTRACT

Provided is a semiconductor device suitable for miniaturization and higher density. The semiconductor device includes a first transistor, a second transistor overlapping with the first transistor, a capacitor overlapping with the second transistor, and a first wiring electrically connected to the capacitor. The first wiring includes a region overlapping with an electrode of the second transistor. The first transistor, the second transistor, and the capacitor are electrically connected to one another. A channel of the first transistor includes a single crystal semiconductor. A channel of the second transistor includes an oxide semiconductor.

21 Claims, 35 Drawing Sheets

(56) References Cited

U.S. PATENT DOCUMENTS

| | | |
|---|---|---|
| 5,757,456 A | 5/1998 | Yamazaki et al. |
| 5,952,722 A | 9/1999 | Watanabe |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,037,752 B2 | 5/2006 | Kuwabara et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,422,935 B2 | 9/2008 | Yamazaki |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,485,838 B2 | 2/2009 | Nishi et al. |
| 7,501,293 B2 | 3/2009 | Ito et al. |
| 7,674,650 B2 | 3/2010 | Akimoto et al. |
| 7,683,838 B2 | 3/2010 | Koyama et al. |
| 7,732,819 B2 | 6/2010 | Akimoto et al. |
| 7,785,938 B2 | 8/2010 | Yamaguchi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0151228 A1 | 7/2005 | Tanida et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0229271 A1 | 10/2007 | Shionoiri et al. |
| 2007/0252928 A1 | 11/2007 | Ito et al. |
| 2007/0272922 A1 | 11/2007 | Kim et al. |
| 2007/0284721 A1 | 12/2007 | Sakamoto |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114926 A1 | 5/2009 | Yamazaki |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0213531 A1 | 8/2010 | Asami et al. |
| 2010/0273319 A1 | 10/2010 | Mikami et al. |
| 2010/0282947 A1 | 11/2010 | Yamazaki et al. |
| 2010/0289037 A1 | 11/2010 | Matsumoto et al. |
| 2010/0320496 A1 | 12/2010 | Nishi et al. |
| 2012/0091543 A1 | 4/2012 | Torashima et al. |
| 2012/0248581 A1 | 10/2012 | Sugiyama et al. |
| 2012/0261802 A1 | 10/2012 | Ohmi et al. |
| 2012/0264247 A1 | 10/2012 | Peng et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 11-261001 A | 9/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-336016 A | 11/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold

(56) References Cited

OTHER PUBLICATIONS

Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7,8,9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M—In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crysalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papes, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM '09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th Intenational Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

FIG. 25A
FIG. 25B
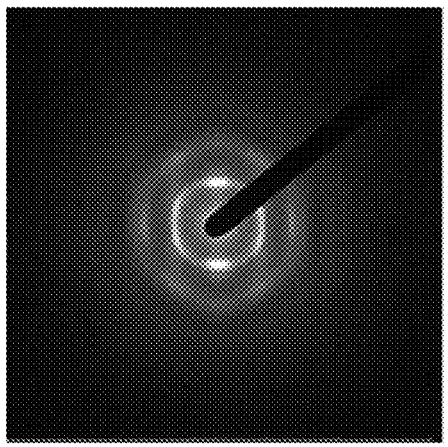
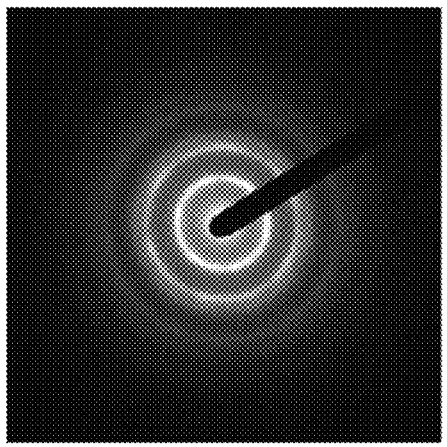

SEMICONDUCTOR DEVICE

BACKGROUND OF THE INVENTION

1. Field of the Invention

One embodiment of the present invention relates to a semiconductor device including a field-effect transistor.

Note that one embodiment of the present invention is not limited to the above technical field. The technical field of one embodiment of the invention disclosed in this specification and the like relates to an object, a method, and a manufacturing method. Furthermore, one embodiment of the present invention relates to a process, a machine, manufacture, and a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

A technique in which a transistor is formed using a semiconductor material has attracted attention. The transistor is applied to a wide range of electronic devices such as an integrated circuit (IC) or an image display device (also simply referred to as a display device). As semiconductor materials applicable to the transistor, silicon-based semiconductor materials have been widely used, but oxide semiconductors have been attracting attention as alternative materials.

For example, a technique for forming a transistor using zinc oxide or an In—Ga—Zn-based oxide semiconductor as an oxide semiconductor is disclosed (see Patent Documents 1 and 2).

In recent years, demand for integrated circuits in which semiconductor elements such as miniaturized transistors are integrated with high density has risen with increased performance and reductions in the size and weight of electronic devices. For example, a tri-gate transistor and a capacitor-over-bitline (COB) MIM capacitor are reported (Non-Patent Document 1).

REFERENCE

Patent Document

[Patent Document 1] Japanese Published Patent Application No. 2007-123861
[Patent Document 2] Japanese Published Patent Application No. 2007-096055

Non-Patent Document

[Non-Patent Document 1] R. Brain et al., "A 22 nm High Performance Embedded DRAM SoC Technology Featuring Tri-gate Transistors and MIMCAP COB", 2013 SYMPOSIUM ON VLSI TECHNOLOGY: DIGEST OF TECHNICAL PAPERS, 2013, pp. T16-T17

SUMMARY OF THE INVENTION

An object of one embodiment of the present invention is to provide a semiconductor device that is suitable for miniaturization and higher density.

Another object of one embodiment of the present invention is to provide a semiconductor device with favorable electrical characteristics. Another object of the present invention is to provide a highly reliable semiconductor device. Another object is to provide a semiconductor device with a novel structure.

Note that the descriptions of these objects do not disturb the existence of other objects. One embodiment of the present invention does not need to achieve all the objects. Other objects will be apparent from and can be derived from the description of the specification, the drawings, the claims, and others.

One embodiment of the present invention is a semiconductor device including a first transistor, a second transistor overlapping with the first transistor, a first capacitor overlapping with the first transistor, a second capacitor overlapping with the second transistor, and a first wiring electrically connected to the second capacitor. The first wiring includes a region overlapping with an electrode of the second transistor. The first transistor, the second transistor, the first capacitor, and the second capacitor are electrically connected to each other. A channel of the first transistor includes a single crystal semiconductor. A channel of the second transistor includes an oxide semiconductor.

Another embodiment of the present invention is a semiconductor device including a first transistor, a second transistor overlapping with the first transistor, a first capacitor overlapping with the first transistor, a second capacitor overlapping with the second transistor, and a first wiring electrically connected to the second capacitor. The first wiring includes a region overlapping with an electrode of the second transistor. The first transistor, the second transistor, the first capacitor, and the second capacitor are electrically connected to each other. A channel of the first transistor includes a single crystal semiconductor. A channel of the second transistor includes an oxide semiconductor. One electrode of the first capacitor includes a projected portion, and the other electrode of the first capacitor includes a depressed portion.

In the above structure, the semiconductor device the semiconductor device includes a second wiring electrically connected to the first capacitor. The second wiring includes a region overlapping with an electrode of the first transistor.

In the above structure, the second wiring may have a function as a common wiring.

In the above structure, the second wiring preferably contains copper.

Another embodiment of the present invention is a semiconductor device includes a first transistor, a second transistor overlapping with the first transistor, a capacitor overlapping with the second transistor, and a first wiring electrically connected to the capacitor. The first wiring includes a region overlapping with an electrode of the second transistor. The first transistor, the second transistor, and the capacitor are electrically connected to each other. A channel of the first transistor includes a single crystal semiconductor. A channel of the second transistor includes an oxide semiconductor.

Another embodiment of the present invention is a semiconductor device includes a first transistor, a second transistor overlapping with the first transistor, a capacitor overlapping with the second transistor, and a first wiring electrically connected to the capacitor. The first wiring includes a region overlapping with an electrode of the second transistor. A channel of the first transistor includes a single crystal semiconductor. A channel of the second transistor includes an oxide semiconductor. The first transistor, the second transistor, and the capacitor are electrically connected to each other. One electrode of the capacitor includes a projected portion, and the other electrode of the capacitor includes a depressed portion.

In the above structure, the capacitor is positioned between the first transistor and the second transistor.

In the above structure, the capacitor is positioned above the second transistor.

In the above structure, the electrode of the second transistor is a gate electrode.

In the above structure, the first wiring preferably has a function as a common wiring.

In the above structure, it is preferable that the first transistor be connected to the second transistor with a plug and the plug contain copper or tungsten.

In the above structure, the first wiring preferably contains copper.

According to one embodiment of the present invention, a semiconductor device that is suitable for miniaturization and higher density can be provided.

A semiconductor device with favorable electrical characteristics can be provided. A highly reliable semiconductor device can be provided. A semiconductor device or the like with a novel structure can be provided. Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

In the accompanying drawings:

FIGS. 25A and 25B show electron diffraction patterns of a CAAC-OS;

DETAILED DESCRIPTION OF THE INVENTION

Figure 1A:
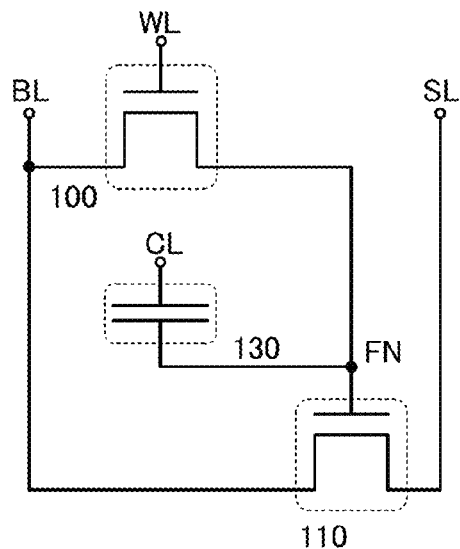
FIGS. 1A and 1B show a circuit diagram and a structure example of a semiconductor device of an embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the descriptions of the embodiments below.

Note that in the structures of the invention described below, the same portions or portions having similar functions are denoted by the same reference numerals in different drawings, and the descriptions of such portions are not repeated. Furthermore, the same hatching pattern is applied to portions having similar functions, and the portions are not specially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first" and "second" are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

[Structure Examples of Stacked-layer Structures]

Figure 3:
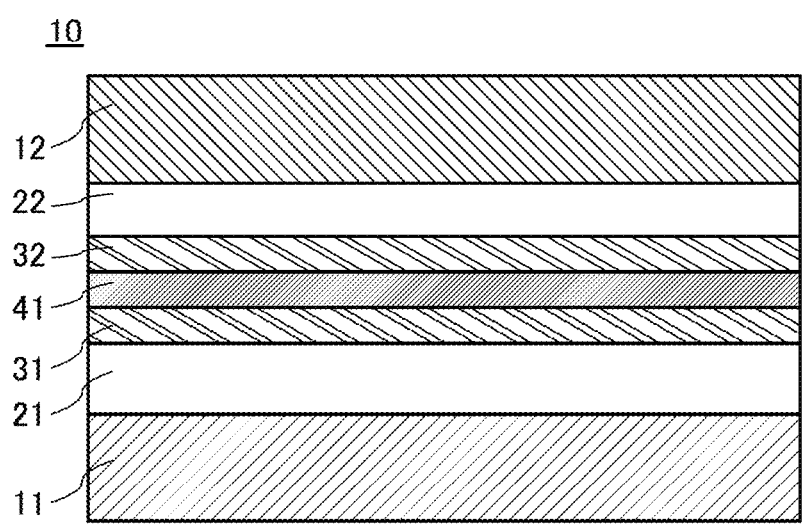
FIG. 3 illustrates a stacked-layer structure included in the semiconductor device of an embodiment.

Examples of stacked-layer structures that can be applied to a semiconductor device of one embodiment of the present invention are described below. FIG. 3 is a schematic cross-sectional view of a laminated structure 10 described below.

The laminated structure 10 includes a first layer 11 including a first transistor, a first insulating film 21, a first wiring layer 31, a barrier film 41, a second wiring layer 32, a second insulating film 22, and a second layer 12 including a second transistor that are stacked in this order.

The first transistor included in the first layer 11 contains a first semiconductor material. The second transistor included in the second layer 12 contains a second semiconductor material. The first semiconductor material and the second semiconductor material may be the same material but they are preferably different semiconductor materials. The first transistor and the second transistor each include a semiconductor film, a gate electrode, a gate insulating film, and a source and a drain electrode (or a source and a drain region).

Examples of semiconductors that can be used as the first semiconductor material or the second semiconductor material include semiconductor materials such as silicon, silicon carbide, germanium, gallium arsenide, gallium arsenide phosphide, or gallium nitride; compound semiconductor materials containing one or more of III-V semiconductor materials typified by B, Al, Ga, In, and Tl in combination with one or more of N, P, As, and Sb; compound semiconductor materials containing one or more of II-VI semiconductor materials typified by Mg, Zn, Cd, and Hg in combination with one or more of O, S, Se, and Te; organic semiconductor materials; and oxide semiconductor materials.

Here, the case where single crystal silicon is used as the first semiconductor material and an oxide semiconductor is used as the second semiconductor material is described.

The barrier film 41 has a function of suppressing diffusion of water and hydrogen from the layers under the barrier film 41. Note that the barrier film 41 may have an opening or a plug for electrically connecting an electrode or a wiring provided above the barrier film 41 to an electrode or a wiring provided below the barrier film 41. For example, the barrier film 41 may have a plug for electrically connecting a wiring or an electrode included in the first wiring layer 31 to a wiring or an electrode included in the second wiring layer 32.

As a material that is used for the wirings or the electrodes included in the first wiring layer 31 and the second wiring layer 32, a conductive metal nitride can be used as well as a metal or an alloy material. A single layer or a stack of two or more layers including any of these materials may be used.

The first insulating film 21 has a function of electrically insulating the first layer 11 from the first wiring layer 31. The first insulating film 21 may have an opening or a plug for electrically connecting the first transistor, an electrode, or a wiring included in the first layer 11 to an electrode or a wiring included in the first wiring layer 31.

The second insulating film 22 has a function of electrically insulating the second layer 12 from the second wiring layer 32. The second insulating film 22 may have an opening or a plug for electrically connecting the second transistor, an electrode, or a wiring included in the second layer 12 to an electrode or a wiring included in the second wiring layer 32.

The second insulating film 22 preferably contains an oxide. In particular, the second insulating film 22 preferably contains an oxide material from which part of oxygen is released by heating. The second insulating film 22 preferably contains an oxide containing oxygen more than that in the stoichiometric composition. In the case where an oxide semiconductor is used as the second semiconductor material, oxygen released from the second insulating film 22 is supplied to the oxide semiconductor, so that oxygen vacancies in the oxide semiconductor can be reduced. Consequently, changes in the electrical characteristics of the second transistor can be reduced to improve the reliability of the second transistor.

It is preferable that hydrogen, water, or the like in the layers under the barrier film 41 be reduced as much as possible. It is preferable that hydrogen, water, and the like be reduced as much as possible. Hydrogen or water might become a factor that causes changes in the electrical characteristics of an oxide semiconductor. Hydrogen or water diffusing from the layers under the barrier film 41 to the layers over the barrier film 41 can be suppressed by the barrier film 41; however, the hydrogen or water might diffuse to the layers over the barrier film 41 through an opening, a plug, or the like provided in the barrier film 41.

In order to reduce hydrogen or water contained in the layers under the barrier film 41 or reduce diffusion of hydrogen or water, heat treatment for removing the hydrogen or the water is preferably performed before the formation of the barrier film 41 or immediately after the formation of an opening for forming a plug in the barrier film 41. The temperature of the heat treatment is preferably as high as possible as long as the heat resistance of a conductive film and the like included in a semiconductor device is considered and the electrical characteristics of the transistor do not deteriorate. Specifically, the temperature may be, for example, 450° C. or higher, preferably 490° C. or higher, further preferably 530° C. or higher, or may be 650° C. or higher. It is preferable that the heat treatment be performed under an inert gas atmosphere or a reduced pressure atmosphere for 1 hour or longer, preferably 5 hours or longer, further preferably 10 hours or longer. In addition, the temperature of the heat treatment may be determined in consideration of the heat resistance of a material of the first layer 11, a material of a wiring or an electrode included in the first wiring layer 31, or a material of a plug provided in the first insulating film 21; in the case where the heat resistance of the material is low, the heat treatment may be performed at 550° C. or lower, 600° C. or lower, 650° C. or lower, or 800° C. or lower. Such heat treatment may be performed at least once but is preferably performed more than once.

It is preferable that the amount of released hydrogen molecules (m/z=2) of the insulating film provided under the barrier film 41, which is measured by thermal desorption spectrometry (TDS) analysis, at a substrate surface temperature of 400° C. be lower than or equal to 130%, preferably lower than or equal to 110% of that at a substrate surface temperature of 300° C. Alternatively, it is preferable that the amount of released hydrogen molecules measured by TDS analysis at a substrate surface temperature of 450° C. be lower than or equal to 130%, preferably lower than or equal to 110% of that at a substrate surface temperature of 350° C.

It is preferable that water or hydrogen contained in the barrier film 41 be also reduced. For example, it is preferable to use, for the barrier film 41, a material having an amount of released hydrogen molecules measured by TDS of less than $2 \times 10^{15}/cm^2$, preferably less than $1 \times 10^{15}/cm^2$, further preferably less than $5 \times 10^{14}/cm^2$ at a substrate surface temperature ranging from 20° C. to 600° C. Alternatively, it is preferable to use, for the barrier film 41, a material having an amount of released hydrogen molecules (m/z=18) measured by TDS of less than $1 \times 10^{16}/cm^2$, preferably $5 \times 10^{15}/cm^2$, further preferably less than $2 \times 10^{12}/cm^2$ at a substrate surface temperature ranging from 20° C. to 600° C.

In the case where single crystal silicon is used for a semiconductor film in the first transistor included in the first layer 11, the heat treatment can also serve as treatment (also referred to as hydrogenation treatment) for terminating dangling bonds of silicon with hydrogen. By the hydrogenation treatment, part of hydrogen contained in the first layer 11 and the first insulating film 21 diffuses to the semiconductor film in the first transistor to terminate dangling bonds of silicon, so that the reliability and static characteristics of the first transistor can be improved.

Examples of materials that can be used for the barrier film 41 are silicon nitride, silicon nitride oxide, aluminum oxide, aluminum oxynitride, gallium oxide, gallium oxynitride, yttrium oxide, yttrium oxynitride, hafnium oxide, and hafnium oxynitride. Aluminum oxide is particularly preferable because of its excellent barrier property against water or hydrogen.

The barrier film 41 may be a stack of a film of a material relatively impermeable to water or hydrogen and a film containing an insulating material. The barrier film 41 may be, for example, a stack of a film containing silicon oxide or silicon oxynitride, a film containing a metal oxide, and the like.

For the barrier film 41, a material relatively impermeable to oxygen is preferably used. The materials given above have excellent barrier properties against oxygen as well as hydrogen and water. The use of any of the materials can suppress diffusion of oxygen released when the second insulating film 22 is heated to the layers under the barrier film 41. Consequently, the amount of oxygen that is released from the second insulating film 22 and is likely to be supplied to a semiconductor film in the second transistor included in the second layer 12 can be increased.

As described above, diffusion of hydrogen or water from the barrier film 41 to the second layer is suppressed by reducing the concentration of hydrogen or water contained in the layers under the barrier film 41, or by removing hydrogen or water. In addition, the barrier film 41 suppresses diffusion of hydrogen or water. Thus, the amount of hydrogen or water contained in the second insulating film 22 or each layer in the second transistor included in the second layer can be extremely low. The concentration of hydrogen contained in the second insulating film 22 and the semiconductor film or the gate insulating film in the second transistor can be reduced to, for example, lower than $5 \times 10^{18}$ cm$^{-3}$, preferably lower than $1 \times 10^{18}$ cm$^{-3}$, further preferably lower than $3 \times 10^{17}$ cm$^{-3}$.

By employing the laminated structure 10 for a semiconductor device of one embodiment of the present invention, the first transistor included in the first layer 11 and the second transistor included in the second layer 12 both can have high reliability, so that the semiconductor device can have extremely high reliability.

[Structure Example]

FIG. 1A is an example of a circuit diagram of a semiconductor device of one embodiment of the present invention. A semiconductor device shown in FIG. 1A includes a first transistor 110, a second transistor 100, a capacitor 130, a wiring SL, a wiring BL, a wiring WL, and a wiring CL.

One of a source and a drain of the first transistor 110 is electrically connected to the wiring BL, the other is electrically connected to the wiring SL, and a gate of the first transistor 110 is electrically connected to one of a source and a drain of the second transistor 100 and one electrode of the capacitor 130. The other of the source and the drain of the second transistor 100 is electrically connected to the wiring BL, and a gate of the second transistor 100 is electrically connected to the wiring WL. The other electrode of the capacitor 130 is electrically connected to the wiring CL. Note that a node between the gate of the first transistor 110, the one of the source and the drain of the second transistor 100, and the one electrode of the capacitor 130 is referred to as a node FN.

A semiconductor device shown in FIG. 1A supplies a potential corresponding to the potential of the wiring BL to the node FN when the second transistor 100 is in a conductive state (i.e., is on). Meanwhile, the semiconductor device has a function of retaining the potential of the node FN when the second transistor 100 is in a non-conductive state (i.e., is off). In other words, the semiconductor device shown in FIG. 1A functions as a memory cell of a memory device. Note that the semiconductor device shown in FIG. 1A can function as a pixel of a display device in the case where the semiconductor device includes a display element such as a liquid crystal element or an organic electroluminescence (EL) element electrically connected to the node FN.

The on/off state of the second transistor 100 can be selected in accordance with the potential supplied to the wiring WL. The threshold voltage of the second transistor 100 can be controlled by a potential supplied to the wiring WL. By using a transistor with a small off-state current as the second transistor 100, the potential of the node FN can be retained for a long period when the transistor is off. This can reduce the frequency of refresh operations of the semiconductor device; thus, the semiconductor device can have low power consumption. An example of the transistor with a small off-state current is a transistor including an oxide semiconductor.

Note that a reference potential, a ground potential, or a fixed potential such as an arbitrary fixed potential is supplied to the wiring CL. At this time, the apparent threshold voltage of the second transistor 100 changes depending on the potential of the node FN. Conduction and non-conduction states of the first transistor 110 change in response to the change in the apparent threshold voltage; thus, data of a potential retained in the node FN can be read as data.

In the semiconductor device of one embodiment of the present invention, the concentration of hydrogen contained in the layers under the barrier film is sufficiently reduced or diffusion or release of hydrogen is suppressed; thus, the transistor including an oxide semiconductor over the barrier film can have an extremely small off-state current.

A plurality of the semiconductor devices shown in FIG. 1A can be arranged in a matrix, whereby a memory device (memory cell array) can be formed.

Figure 1B:
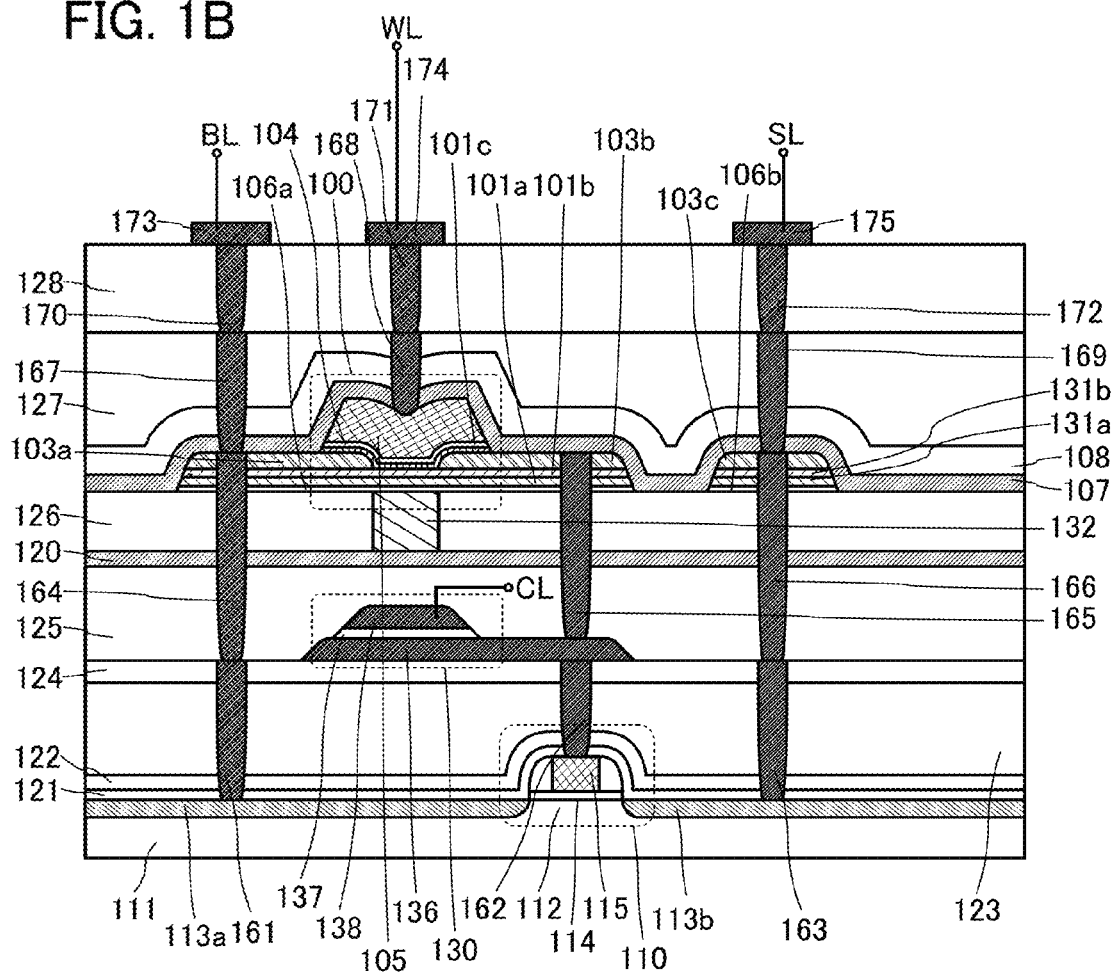
Figure 2A:
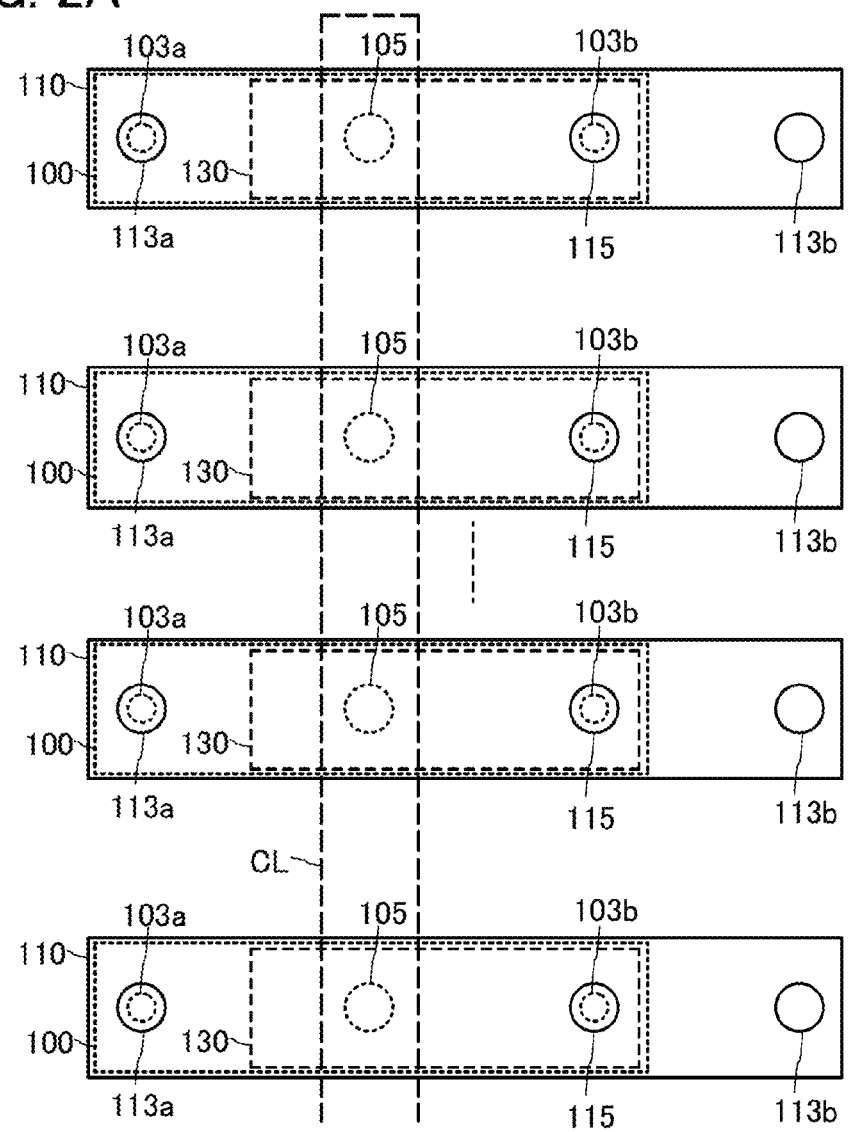
FIGS. 2A and 2B are top views of arranged semiconductor devices of an embodiment.

FIG. 1B illustrates an example of a cross-sectional structure of a semiconductor device for providing the circuit shown in FIG. 1A. FIG. 2A illustrates a top view of arranged semiconductor devices shown in FIG. 1B. Note that the semiconductor devices share the wiring CL serving as a common wiring.

Figure 2B:
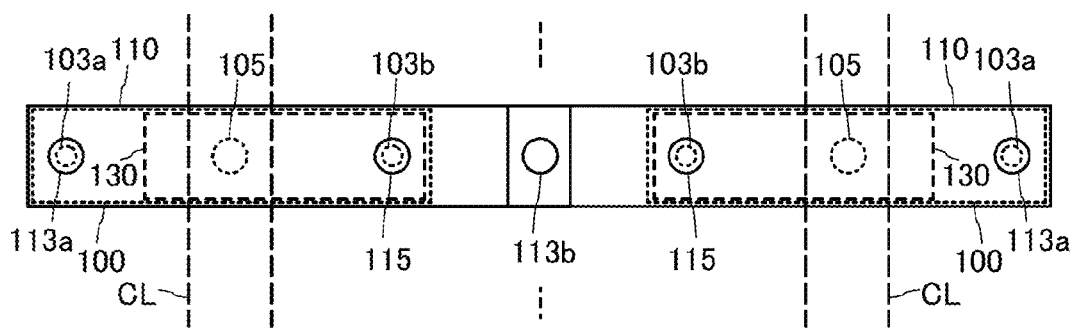

As shown in FIG. 2A, the second transistor 100 and the capacitor 130 are provided within the area occupied by the first transistor 110. When the semiconductor devices are arranged in matrix, the wiring SL (a low-resistance layer 113*b*) may be shared with adjacent devices as shown in FIG. 2B.

The semiconductor device illustrated in FIG. 1B includes the first transistor 110, the second transistor 100, and the capacitor 130. The second transistor 100 is provided above the first transistor 110, and a barrier film 120 is provided between the first transistor 110 and the second transistor 100.

The first transistor 110 is provided on a semiconductor substrate 111 and includes a semiconductor film 112 which is a portion of the semiconductor substrate 111, a gate insulating film 114, a gate electrode 115, and low-resistance layers 113*a* and 113*b* serving as source and drain regions.

The first transistor 110 may be either a p-channel transistor or an n-channel transistor, and an appropriate transistor may be used depending on the circuit configuration or the driving method.

It is preferable that a region of the semiconductor film 112 where a channel is formed, a region in the vicinity thereof, the low-resistance layers 113*a* and 113*b* serving as source and drain regions, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the first transistor 110 may be a high-electron-mobility transistor (HEMT) with GaAs, GaAlAs, or the like.

The low-resistance layers 113*a* and 113*b* contain an element which imparts n-type conductivity, such as arsenic or phosphorus, or an element which imparts p-type conductivity, such as boron, in addition to a semiconductor material used for the semiconductor film 112.

The gate electrode 115 can be formed using a semiconductor material such as silicon containing the element that imparts n-type conductivity, such as arsenic or phosphorus, or the element that imparts p-type conductivity, such as boron, or a conductive material such as a metal material, an alloy material, or a metal oxide material. In order to adjust the threshold voltage, it is preferable to use a gate electrode to adjust the work function. Specifically, it is preferable to use titanium nitride, tantalum nitride, or the like for the gate electrode. In addition, in order to ensure conductivity and embeddability of the gate electrode, it is preferable that the gate electrode is a laminated layer of metal materials such as tungsten and aluminum. In particular, tungsten is preferable in terms of heat resistance.

Here, a structure including the first transistor 110 corresponds to the first layer 11 in the laminated structure 10.

Figure 4:
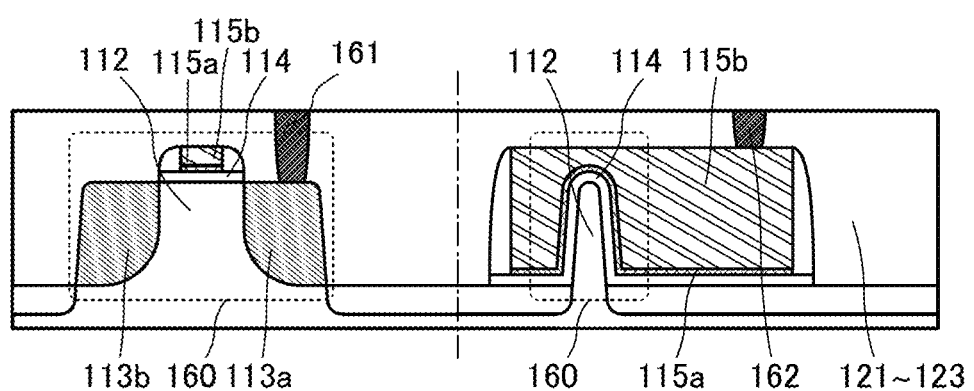
FIG. 4 illustrates a structure example of the semiconductor device of an embodiment.

Here, a transistor 160 illustrated in FIG. 4 may be used instead of the first transistor 110. FIG. 4 illustrates a cross section of the transistor 160 in a channel length direction on the left side of the dashed-dotted line and a cross section thereof in a channel width direction on the right side of the dashed-dotted line. In the transistor 160 illustrated in FIG. 4, the semiconductor film 112 (part of the semiconductor substrate) in which a channel is formed has a protrusion, and the gate insulating film 114 and gate electrodes 115*a* and 115*b* are provided along top and side surfaces of the protrusion. Note that the gate electrode 115*a* may be formed using a material with an adjusted work function. The transistor 160 having such a shape is also referred to as a FIN transistor because it utilizes a protruding portion of the semiconductor substrate. Note that an insulating film serving as a mask for forming the protruding portion may be provided in contact with the top of the protruding portion. Although the case where the protruding portion is formed by processing part of the semiconductor substrate is described here, a semiconductor film having a protruding shape may be formed by processing an SOI substrate.

The first transistor 110 is covered with an insulating film 121, an insulating film 122, an insulating film 123, and an insulating film 124 that are stacked in this order.

In the case where a silicon-based semiconductor material is used for the semiconductor film 112, the insulating film 122 preferably contains hydrogen. When the insulating film 122 containing hydrogen is provided over the first transistor 110 and heat treatment is performed, dangling bonds in the semiconductor film 112 are terminated by hydrogen contained in the insulating film 122, so that the reliability of the first transistor 110 can be improved.

The insulating film 123 functions as a planarization film for eliminating a level difference caused by the first transistor 110 or the like underlying the insulating film 123. A top surface of the insulating film 123 may be planarized by planarization treatment using a chemical mechanical polishing (CMP) method or the like in order to increase the planarity.

The insulating film 124 may have a function as a barrier film. The insulating film 124 is not necessarily provided.

In the insulating films 121, 122, 123, and 124, plugs 161 and 163 electrically connected to the low-resistance layers 113*a* and 113*b*, and the like are embedded, and a plug 162 electrically connected to the gate electrode 115 of the first transistor 110, and the like are embedded. Note that in this specification and the like, an electrode and a wiring electrically connected to the electrode may be a single component. In other words, there are cases where a portion of a wiring functions as an electrode and where a portion of an electrode functions as a wiring.

The structure including the insulating films 121, 122, 123, 124 corresponds to the first insulating film 21 in the laminated structure 10.

An electrode 136 which is one electrode of the capacitor 130 is provided over the insulating film 124 and the plug 162. The electrode 136 is electrically connected to the plug 162.

An insulating film 137 is provided over the electrode 136 of the capacitor 130, and an electrode 138 which is the other electrode of the capacitor 130 is provided over the insulating film 137. Note that the electrode 138 is electrically connected to a wiring CL. The wiring CL includes a region overlapping with the gate electrode 105 of the second transistor 100.

Here, the structure including the electrodes 136 and 138, the wiring CL, and the like corresponds to the first wiring layer 31 in the laminated structure 10.

Each of the plugs (the plugs 161 to 163), the electrodes 136 and 138, and the like can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. A low-resistant conductive material such as copper is also preferable.

The wiring CL can be formed using a conductive material such as a metal material, an alloy material, or a metal oxide material. In particular, a low resistance conductive material such as aluminum and copper is preferable to reduce the wiring resistance.

Furthermore, it is preferable that the wirings 136 and 138, the wiring CL, and the like be embedded in the insulating film 125 whose top surface is planarized.

The barrier film 120 is provided so as to cover the top surface of the insulating film 125. The barrier film 120 corresponds to the barrier film 41 in the laminated structure 10. The description of the barrier film 41 can be referred to for a material of the barrier film 120.

The barrier film 120 has openings in which plugs 164, 165, and 166 described later are embedded.

A wiring 132 is provided over the barrier film 120. A structure including the wiring 132 corresponds to the second wiring layer 32 in the laminated structure 10.

Part of the wiring 132 is overlapped with a channel formation region of the second transistor 100, which is described later, and functions as a second gate electrode of the second transistor 100.

Here, the wiring 132 and the like can be formed using a conductive material such as a metal material, an alloy material, or a metal oxide material. In the case where heat resistance is required, it is particularly preferable to use a high-melting-point material such as tungsten or molybdenum. A low-resistance metal material or a low-resistance alloy material is preferably used in consideration of conductivity; a single layer or a stack using a metal material such as aluminum, chromium, copper, tantalum, or titanium or an alloy material containing any of the metal materials may be used.

It is preferable to use a metal oxide containing an element other than a main component such as phosphorus, boron, carbon, nitrogen, or a transition metal element as a material for forming the wirings 132 and the like. Such a metal oxide can have high conductivity. For example, a material in which any of the above elements is contained in a metal oxide such as an In—Ga-based oxide, an In—Zn-based oxide, or an In-M-Zn-based oxide (M is Al, Ti, Ga, Y, Zr, La, Ce, Nd, or Hf) to increase the conductivity can be used.

The insulating film 126 is provided to cover the barrier film 120, the wiring 132, and the like. Here, a region including the insulating film 126 corresponds to the second insulating film 22 in the laminated structure 10.

It is preferable that the top surface of the insulating film 126 be planarized by the planarization treatment described above.

An oxide material from which oxygen is partly released because of heating is preferably used for the insulating film 126.

As the oxide material from which oxygen is released by heating, an oxide containing oxygen more than that in the stoichiometric composition is preferably used. Part of oxygen is released by heating from an oxide film containing oxygen more than that in the stoichiometric composition. The oxide film containing oxygen more than that in the stoichiometric composition is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The second transistor 100 is provided over the insulating film 126. A structure including the second transistor 100 corresponds to the second layer 12 in the laminated structure 10.

The second transistor 100 includes an insulating film 106a in contact with the top surface of the insulating film 126, an oxide semiconductor film 101a in contact with the top surface of the insulating film 106a, an oxide semiconductor film 101b in contact with a top surface of the oxide semiconductor film 101a, an electrode 103a and an electrode 103b in contact with a top surface of the oxide semiconductor film 101b and apart from each other in a region overlapping with the oxide semiconductor film 101b, an oxide semiconductor film 101c in contact with the top surface of the oxide semiconductor film 101b and top surfaces of the electrodes 103a and 103b, a gate insulating film 104 over the oxide semiconductor film 101c, and a gate electrode 105 overlapping with the oxide semiconductor film 101b with the gate insulating film 104 and the oxide semiconductor film 101c provided therebetween. The second transistor 100 is covered with an insulating film 107, an insulating film 108, and an insulating film 127.

The plug 164 electrically connected to the plug 161 and the electrode 103a is embedded in the insulating film 125, the barrier film 120, the insulating film 126, the insulating film 106a, the oxide semiconductor film 101a, the oxide semiconductor film 101b, and the electrode 103a. The plug 165 electrically connected to the electrodes 136 and 103b is embedded in the insulating film 125, the barrier film 120, the insulating films 126 and 106a, the oxide semiconductor film 101a, the oxide semiconductor film 101b, and the electrode 103b.

At the same time the second transistor 100 is formed, the insulating film 106b, an oxide semiconductor film 131a, an oxide semiconductor film 131b, and an electrode 103c are formed, and the plug 166 electrically connected to the plug 163 and the electrode 103c is provided so as to be embedded in the insulating film 125, the barrier film 120, the insulating films 126 and 106b, the oxide semiconductor film 131a, the oxide semiconductor film 131b, and the electrode 103c.

A node including the gate electrode 115 of the first transistor 110, the electrode 136 of the capacitor 130, and the electrode 103b of the second transistor 100 corresponds to the node FN illustrated in FIG. 1A.

Note that at least part (or all) of the electrode 103a (and/or the electrode 103b) is provided on at least part (or all) of a surface, a side surface, a top surface, and/or a bottom surface of the semiconductor film(s) such as the oxide semiconductor film 101b and/or the oxide semiconductor film 101a.

Alternatively, at least part (or all) of the electrode 103a (and/or the electrode 103b) is in contact with at least part (or all) of a surface, a side surface, a top surface, and/or a bottom surface of the semiconductor film(s) such as the oxide semiconductor film 101b and/or the oxide semiconductor film 101a. Alternatively, at least part (or all) of the electrode 103a (and/or the electrode 103b) is in contact with at least part (or all) of the semiconductor film(s) such as the oxide semiconductor film 101b and/or the oxide semiconductor film 101a.

Alternatively, at least part (or all) of the electrode 103a (and/or the electrode 103b) is electrically connected to at least part (or all) of a surface, a side surface, a top surface, and/or a bottom surface of the semiconductor film(s) such as the oxide semiconductor film 101b and/or the oxide semiconductor film 101a. Alternatively, at least part (or all) of the electrode 103a (and/or the electrode 103b) is electrically connected to at least part (or all) of the semiconductor film(s) such as the oxide semiconductor film 101b and/or the oxide semiconductor film 101a.

Alternatively, at least part (or all) of the electrode 103a (and/or the electrode 103b) is provided near at least part (or all) of a surface, a side surface, a top surface, and/or a bottom surface of the semiconductor film(s) such as the oxide semiconductor film 101b and/or the oxide semiconductor film 101a. Alternatively, at least part (or all) of the electrode 103a (and/or the electrode 103b) is provided near at least part (or all) of the semiconductor film such as the oxide semiconductor film 101b and/or the oxide semiconductor film 101a.

Alternatively, at least part (or all) of the electrode 103a (and/or the electrode 103b) is placed on a side of at least part (or all) of a surface, a side surface, a top surface, and/or a bottom surface of the semiconductor film(s) such as the oxide semiconductor film 101b and/or the oxide semiconductor film 101a. Alternatively, at least part (or all) of the electrode 103a (and/or the electrode 103b) is placed on a side of at least part (or all) of the semiconductor film(s) such as the oxide semiconductor film 101b and/or the oxide semiconductor film 101a.

Alternatively, at least part (or all) of the electrode 103a (and/or the electrode 103b) is provided obliquely above at least part (or all) of a surface, a side surface, a top surface, and/or a bottom surface of a semiconductor film such as the oxide semiconductor film 101b (and/or the oxide semiconductor film 101a). Alternatively, at least part (or all) of the electrode 103a (and/or the electrode 103b) is provided obliquely above at least part (or all) of a semiconductor film such as the oxide semiconductor film 101b (and/or the oxide semiconductor film 101a).

Alternatively, at least part (or all) of the electrode 103a (and/or the electrode 103b) is provided above at least part (or all) of a surface, a side surface, a top surface, and/or a bottom surface of a semiconductor film such as the oxide semiconductor film 101b (and/or the oxide semiconductor film 101a). Alternatively, at least part (or all) of the electrode 103a (and/or the electrode 103b) is provided above at least part (or all) of a semiconductor film such as the oxide semiconductor film 101b (and/or the oxide semiconductor film 101a).

For example, the oxide semiconductor preferably contains at least indium (In) or zinc (Zn). More preferably, the oxide semiconductor contains an oxide represented by an In-M-Zn-based oxide (M is a metal such as Al, Ti, Ga, Ge, Y, Zr, Sn, La, Ce, and Hf).

As the semiconductor film, it is particularly preferable to use an oxide semiconductor film including a plurality of crystal parts whose c-axes are aligned perpendicular to a surface on which the semiconductor film is formed or the top surface of the semiconductor film and in which the adjacent crystal parts have no grain boundary.

The use of such materials for the semiconductor film makes it possible to provide a highly reliable transistor in which changes in the electrical characteristics are suppressed.

Note that details of a preferable mode and a formation method of an oxide semiconductor that can be used for the semiconductor film are described in an embodiment below.

A semiconductor device of one embodiment of the present invention preferably includes, between an oxide semiconductor film and an insulating film overlapping the oxide semiconductor film, a first oxide semiconductor film that contains as its constituent element at least one of the metal elements constituting the oxide semiconductor film. This can prevent formation of a trap state at the interface between the oxide semiconductor film and the insulating film overlapping the oxide semiconductor film.

That is, one embodiment of the present invention preferably has a structure in which each of the top surface and the bottom surface of at least the channel formation region of the oxide semiconductor film is in contact with an oxide film that functions as a barrier film for preventing formation of an interface state of the oxide semiconductor film. With this structure, formation of oxygen vacancies and entry of impurities that cause generation of carriers in the oxide semiconductor film and at the interface can be prevented. Thus, a highly purified intrinsic oxide semiconductor film can be obtained. Obtaining a highly purified intrinsic oxide semiconductor film refers to purifying or substantially purifying the oxide semiconductor film to be an intrinsic or substantially intrinsic oxide semiconductor film. In this way, changes in the electrical characteristics of a transistor including the oxide semiconductor film can be suppressed, and a highly reliable semiconductor device can be provided.

Note that in this specification and the like, in the case of the substantially purified oxide semiconductor film, the carrier density thereof is lower than $1\times10^{17}/cm^3$, lower than $1\times10^{15}/cm^3$, or lower than $1\times10^{13}/cm^3$. With a highly purified intrinsic oxide semiconductor film, the transistor can have stable electric characteristics.

The oxide semiconductor film 101a is provided between the insulating film 106a and the oxide semiconductor film 101b.

The oxide semiconductor film 101c is provided between the oxide semiconductor film 101b and the gate insulating film 104. Specifically, the bottom surface of the oxide semiconductor film 101c is in contact with the bottom surface of the gate insulating film 104, and the top surface of the oxide semiconductor film 101c is in contact with the top surfaces of the electrodes 103a and 103b.

The oxide semiconductor film 101a and the oxide semiconductor film 101c each contain an oxide containing one or more metal elements that are also contained in the oxide semiconductor film 101b.

Note that the boundary between the oxide semiconductor film 101b and the oxide semiconductor film 101a or the boundary between the oxide semiconductor film 101b and the oxide semiconductor film 101c is not clear in some cases.

For example, the oxide semiconductor film 101a and the oxide semiconductor film 101c contain In or Ga; typically, a material such as an In—Ga-based oxide, an In—Zn-based oxide, or an In-M-Zn-based oxide (M is Al, Ti, Ga, Y, Zr, La, Ce, Nd, or Hf) that has an energy level of the conduction band minimum closer to the vacuum level than that of the oxide semiconductor film 101b is used. Typically, the difference in energy at the bottom of the conduction band between the oxide semiconductor film 101a or the oxide semiconductor film 101c and the oxide semiconductor film 101b is preferably 0.05 eV or more, 0.07 eV or more, 0.1 eV or more, or 0.15 eV or more and 2 eV or less, 1 eV or less, 0.5 eV or less, or 0.4 eV or less.

An oxide having a Ga (serving as a stabilizer) content higher than that of the oxide semiconductor film 101b is used for the oxide films 101a and 101c, between which the oxide semiconductor film 101b is sandwiched. In that case, release of oxygen from the oxide semiconductor film 101b can be inhibited.

When an In—Ga—Zn-based oxide in which the atomic ratio of In to Ga and Zn is 1:1:1 or 3:1:2 is used for the oxide semiconductor film 101b, for example, an In—Ga—Zn-based oxide in which the atomic ratio of In to Ga and Zn is 1:3:2, 1:3:4, 1:3:6, 1:6:4, 1:6:8, 1:6:10, or 1:9:6 can be used for the oxide semiconductor film 101a or the oxide semiconductor film 101c. Note that the atomic ratio of each of the oxide semiconductor film 101b, the oxide semiconductor film 101a, and the oxide semiconductor film 101c may vary within a range of ±20% of any of the above-described atomic ratios as an error. For the oxide semiconductor films 101a and 101c, materials with the same composition or material with different compositions may be used.

When an In-M-Zn-based oxide is used for the oxide semiconductor film 101b, an oxide containing metal elements in the atomic ratio satisfying the following conditions is preferably used for a target for forming the semiconductor film serving as the oxide semiconductor film 101b. Given that the atomic ratio of the metal elements in the oxide is In:M:Zn=$x_1$:$y_1$:$z_1$, $x_1/y_1$ is greater than or equal to ⅓ and less than or equal to 6, preferably greater than or equal to 1 and less than or equal to 6, and $z_1/y_1$ is greater than or equal to ⅓ and less than or equal to 6, preferably greater than or equal to 1 and less than or equal to 6. Note that when $z_1/y_1$ is less than or equal to 6, a CAAC-OS film to be described later is easily formed. Typical examples of the atomic ratio of the metal elements in the target are In:M:Zn=1:1:1 and In:M:Zn=3:1:2.

When an In-M-Zn-based oxide is used for the oxide semiconductor films 101a and 101c, an oxide containing metal elements in the following atomic ratio is preferably used for a target for depositing oxide films serving as the oxide semiconductor films 101a and 101c. Given that the atomic ratio of the metal elements in the target is In:M:Zn=$x_2$:$y_2$:$z_2$, it is preferable that $x_2/y_2$ be less than $x_1/y_1$, and $z_2/y_2$ be greater than or equal to ⅓ and less than or equal to 6, preferably greater than or equal to 1 and less than or equal to 6. Note that when $z_2/y_2$ is less than or equal to 6, a CAAC-OS film to be described later is easily formed.

Typical examples of the atomic ratio of the metal elements in the target are In:M:Zn=1:3:4, In:M:Zn=1:3:6, and In:M:Zn=1:3:8.

By using a material in which the energy at the bottom of the conduction band is closer to the vacuum level than that of the oxide semiconductor film 101b is used for the oxide semiconductor films 101a and 101c, a channel is mainly formed in the oxide semiconductor film 101b, so that the oxide semiconductor film 101b serves as a main current path. When the oxide semiconductor film 101b in which a channel is formed is sandwiched between the oxide semiconductor film 101a and the oxide semiconductor film 101c, formation of interface states between these films is prevented; thus, the reliability of the electrical characteristics of the transistor is improved.

Note that, without limitation to those described above, a material with an appropriate composition may be used depending on required semiconductor characteristics and electrical characteristics (e.g., field-effect mobility and threshold voltage) of a transistor. In order to obtain the required semiconductor characteristics of the transistor, it is preferable that the carrier density, the impurity concentration, the defect density, the atomic ratio of a metal element to oxygen, the interatomic distance, the density, and the like of each of the oxide semiconductor film 101b, the oxide semiconductor film 101a, and the oxide semiconductor film 101c be set to appropriate values.

Here, a mixed region of the oxide semiconductor film 101a and the oxide semiconductor film 101b might exist between the oxide semiconductor film 101a and the oxide semiconductor film 101b. A mixed region of the oxide semiconductor film 101b and the oxide semiconductor film 101c might exist between the oxide semiconductor film 101b and the oxide semiconductor film 101c. The mixed region has a low density of interface states. For that reason, the stack including the oxide semiconductor film 101a, the oxide semiconductor film 101b, and the oxide semiconductor film 101c has a band structure where energy at each interface and in the vicinity of the interface is changed continuously (continuous junction).

Here, the band structure is described. For easy understanding, the band structure is illustrated with the energy (Ec) at the bottom of the conduction band of each of the insulating film 125, the oxide semiconductor film 101a, the oxide semiconductor film 101b, the oxide semiconductor film 101c, and the gate insulating film 104.

Figure 5A:
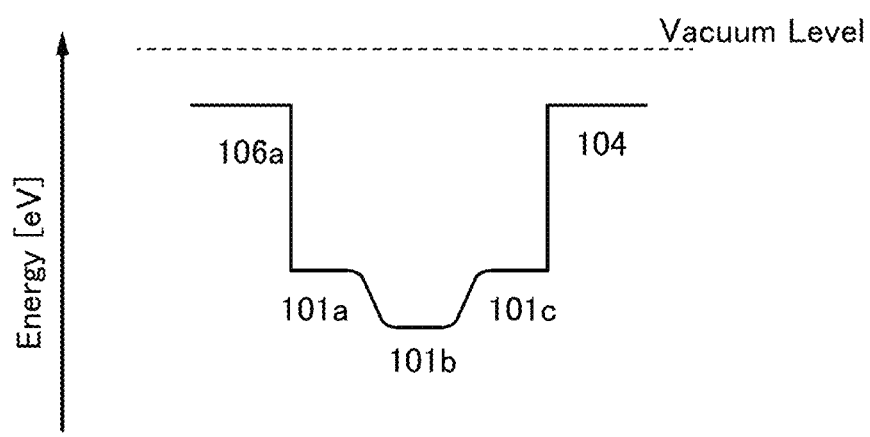
FIGS. 5A and 5B each illustrate a band structure according to an embodiment.
Figure 5B:
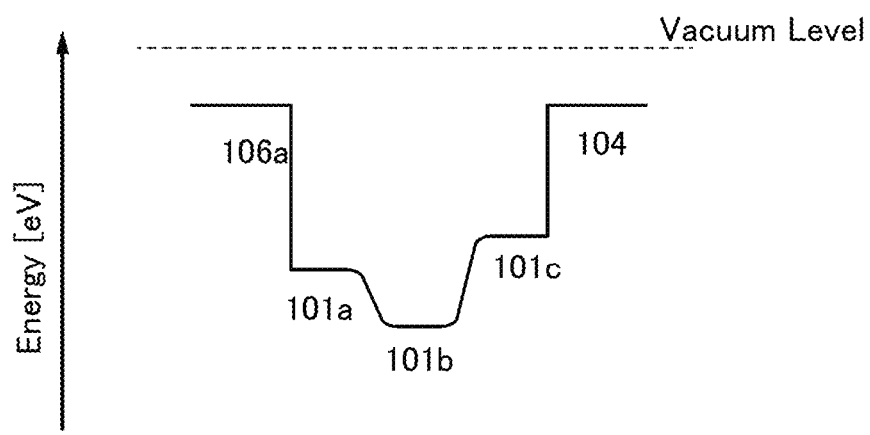

As illustrated in FIGS. 5A and 5B, the energy at the bottom of the conduction band changes continuously in the oxide semiconductor film 101a, the oxide semiconductor film 101b, and the oxide semiconductor film 101c. This can be understood also from the fact that the constituent elements are common among the oxide semiconductor film 101a, the oxide semiconductor film 101b, and the oxide semiconductor film 101c and oxygen easily diffuses among the oxide semiconductor film 101a, the oxide semiconductor film 101b, and the oxide semiconductor film 101c. Thus, the oxide semiconductor film 101a, the oxide semiconductor film 101b, and the oxide semiconductor film 101c have a continuous physical property although they are a stack of films having different compositions.

The oxide films, which contain the same main components and are stacked, are not simply stacked but formed to have continuous junction (here, particularly a U-shaped well structure where the energy at the bottom of the conduction band is continuously changed between the films. In other words, a stacked-layer structure is formed such that there exist no impurities that form a defect level such as a trap center or a recombination center at each interface. If impurities exist between the stacked layers in the multilayer film, the continuity of the energy band is lost and carriers disappear by a trap or recombination.

Note that FIG. 5A illustrates the case where the Ec of the oxide semiconductor film 101a and the Ec of the oxide semiconductor film 101c are equal to each other; however, they may be different from each other. For example, part of the band structure in the case where the Ec of the oxide semiconductor film 101c is higher than the Ec of the oxide semiconductor film 101a is illustrated in FIG. 5B.

As illustrated in FIGS. 5A and 5B, the oxide semiconductor film 101b serves as a well and a channel of the second transistor 100 is formed in the oxide semiconductor film 101b. Note that since the energies at the bottoms of the conduction bands are changed continuously, the oxide semiconductor film 101a, the oxide semiconductor film 101b, and the oxide semiconductor film 101c can also be referred to as a U-shaped well. A channel formed to have such a structure can also be referred to as a buried channel.

Note that trap states caused by impurities or defects might be formed in the vicinity of the interface between an insulating film such as a silicon oxide film and each of the oxide semiconductor film 101a and the oxide semiconductor film 101c. The oxide semiconductor film 101b can be distanced away from the trap states owing to the existence of the oxide semiconductor film 101a and the oxide semiconductor film 101c. However, when the energy difference between the Ec of the oxide semiconductor film 101a or the oxide semiconductor film 101c and the Ec of the oxide semiconductor film 101b is small, electrons in the oxide semiconductor film 101b might reach the trap states across the energy difference. When the electrons are captured by the trap states, a negative fixed charge is generated at the interface with the insulating film, whereby the threshold voltage of the transistor is shifted in the positive direction.

Thus, to reduce changes in the threshold voltage of the transistor, an energy difference between the Ec of the oxide semiconductor film 101b and the Ec of each of the oxide semiconductor film 101a and the oxide semiconductor film 101c is necessary. Each of the energy differences is preferably greater than or equal to 0.1 eV, further preferably greater than or equal to 0.15 eV.

The oxide semiconductor film 101a, the oxide semiconductor film 101b, and the oxide semiconductor film 101c preferably include crystal parts. In particular, when crystals with c-axis alignment are used, the transistor can have stable electrical characteristics.

In the band structure illustrated in FIG. 5B, instead of the oxide semiconductor film 101c, an In—Ga oxide (e.g., with an atomic ratio of In:Ga=7:93) may be provided between the oxide semiconductor film 101b and the gate insulating film 104.

For the oxide semiconductor film 101b, an oxide having an electron affinity lower than those of the oxide semiconductor film 101a and the oxide semiconductor film 101c is used. For example, for the oxide semiconductor film 101b, an oxide having an electron affinity higher than that of each of the oxide semiconductor film 101a and the oxide semiconductor film 101c by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used. Note that the electron affinity refers to an energy gap between the vacuum level and the bottom of the conduction band.

Here, the thickness of the oxide semiconductor film 101b is preferably larger than that of the oxide semiconductor film 101a. The thicker the oxide semiconductor film 101b is, the larger the on-state current of the transistor is. The thickness of the oxide semiconductor film 101a may be set as appropriate as long as formation of an interface state at an interface with the oxide semiconductor film 101b is inhibited. For example, the thickness of the oxide semiconductor film 101b is larger than that of the oxide semiconductor film 101a, preferably 2 times or more, further preferably 4 times or more, still further preferably 6 times or more as large as that of the oxide semiconductor film 101a. Note that the above does not apply in the case where the on-state current of the transistor does not need to be increased, and the thickness of the oxide semiconductor film 101a may be larger than that of the oxide semiconductor film 101b.

The thickness of the oxide semiconductor film 101c may be set as appropriate, in a manner similar to that of the oxide semiconductor film 101a, as long as generation of an interface state at an interface with the oxide semiconductor film 101b is inhibited. For example, the thickness of the oxide semiconductor film 101c may be set smaller than or equal to that of the oxide semiconductor film 101a. If the oxide semiconductor film 101c is thick, it might become difficult for an electric field from the gate electrode to reach the oxide semiconductor film 101b. Therefore, it is preferable that the oxide semiconductor film 101c be thin, for example, thinner than the oxide semiconductor film 101b. Note that the thickness of the oxide semiconductor film 101c is not limited to the above, and may be set as appropriate depending on driving voltage of the transistor in consideration of the withstand voltage of the gate insulating film 104.

Here, in the case where the oxide semiconductor film 101b is in contact with an insulating film containing different constituent elements (e.g., an insulating film containing a silicon oxide film), an interface state is sometimes formed at the interface between the two films and the interface state forms a channel. In this case, a second transistor having a different threshold voltage appears, so that an apparent threshold voltage of the transistor changes. In the transistor having this structure, however, the oxide semiconductor film 101a containing one or more kinds of metal elements constituting the oxide semiconductor film 101b is provided, which makes it difficult for an interface state to be formed at the interface between the oxide semiconductor film 101a and the oxide semiconductor film 101b. Thus, providing the oxide semiconductor film 101a makes it possible to reduce variations or changes in the electrical characteristics of the transistor, such as threshold voltage.

When a channel is formed at the interface between the gate insulating film 104 and the oxide semiconductor film 101b, interface scattering occurs at the interface and the field-effect mobility of the transistor is reduced in some cases. In the transistor having this structure, however, since the oxide semiconductor film 101c contains one or more kinds of metal elements constituting the oxide semiconductor film 101b, scattering of carriers is less likely to occur at the interface between the oxide semiconductor film 101b and the oxide semiconductor film 101c; thus, the field-effect mobility of the transistor can be increased.

One of the electrodes 103a and 103b serves as a source electrode and the other serves as a drain electrode.

Each of the electrodes 103a and 103b is formed to have a single-layer structure or a stacked-layer structure using any of metals such as aluminum, titanium, chromium, nickel, copper, yttrium, zirconium, molybdenum, silver, tantalum, and tungsten, or an alloy containing any of these metals as a main component. Examples of the structure include a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

The gate insulating film 104 can be formed to have a single-layer structure or a stacked-layer structure using, for example, one or more of an insulating film containing a so-called high-k material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), and $(Ba,Sr)TiO_3$ (BST). Alternatively, aluminum oxide, bismuth oxide, germanium oxide, niobium oxide, silicon oxide, titanium oxide, tungsten oxide, yttrium oxide, or zirconium oxide may be added to the insulating film, for example. Alternatively, the insulating film may be subjected to nitriding treatment. Silicon oxide, silicon oxynitride, or silicon nitride may be stacked over the above insulating film.

As the gate insulating film 104, like the insulating film 126, an oxide insulating film that contains oxygen more than that in the stoichiometric composition is preferably used.

When the specific material is used for the gate insulating film, electrons are trapped in the gate insulating film under the specific conditions and the threshold voltage can be increased. For example, like a stacked-layer film of silicon oxide and hafnium oxide, part of the gate insulating film uses a material having a lot of electron trap states, such as hafnium oxide, aluminum oxide, and tantalum oxide, and the state where the potential of the gate electrode is higher than that of the source electrode or the drain electrode is kept for one second or more, typically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower). Thus, electrons are moved from the semiconductor film to the gate electrode, and some of the electrons are captured by the electron trap states.

In the transistor in which a necessary amount of electrons is captured by the electron trap states in this manner, the threshold voltage is shifted in the positive direction. By controlling the voltage of the gate electrode, the amount of electrons to be trapped can be controlled, and thus the threshold voltage can be controlled. Furthermore, the treatment for trapping the electrons may be performed in the manufacturing process of the transistor.

For example, the treatment is preferably performed at any step before factory shipment, such as after the formation of a wiring connected to the source electrode or the drain electrode of the transistor, after the preceding process (wafer processing), after a wafer-dicing step, or after packaging. In any case, it is preferable that the transistor not be exposed to a temperature higher than or equal to 125° C. for one hour or more after that.

The gate electrode 105 can be formed using, for example, a metal selected from aluminum, chromium, copper, tantalum, titanium, molybdenum, and tungsten; an alloy containing any of these metals as a component; an alloy containing any of these metals in combination; or the like. Alternatively, one or both of manganese and zirconium may be used. Alternatively, a semiconductor typified by polycrystalline silicon doped with an impurity element such as phosphorus, or a silicide such as nickel silicide may be used for the gate electrode. Examples of the structure include a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, and a three-layer structure in which a titanium film, an aluminum film, and a titanium film are stacked in this order. Alternatively, an alloy film or a nitride film that contains aluminum and one or more metals selected from titanium, tantalum, tungsten, molybdenum, chromium, neodymium, and scandium may be used.

The gate electrode 105 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

A plug 167 electrically connected to the plug 164 is embedded in the insulating film 127, the insulating film 108, and the insulating film 107. A plug 168 electrically connected to the gate electrode 105 is embedded in the insulating film 127, the insulating film 108, and the insulating film 107. A plug 169 electrically connected to the plug 166 is embedded in the insulating film 127, the insulating film 108, and the insulating film 107.

Furthermore, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode 105 and the gate insulating film 104. These films each have a work function higher than or equal to 5 eV, preferably higher than or equal to 5.5 eV, which is higher than the electron affinity of an oxide semiconductor. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, in the case of using an In—Ga—Zn-based oxynitride semiconductor film, an In—Ga—Zn-based oxynitride semiconductor film having a higher nitrogen concentration than that of at least the oxide semiconductor film 101b, specifically, an In—Ga—Zn-based oxynitride semiconductor film having a nitrogen concentration of 7 at. % or higher is used.

For the insulating film 107, as in the case of the barrier film 120, a material to which water or hydrogen does not easily diffuse is preferably used. In particular, a material that is relatively impermeable to oxygen is preferably used for the insulating film 107.

By covering the oxide semiconductor film 101b with the insulating film 107 including a material relatively impermeable to oxygen, oxygen can be prevented from being released from the oxide semiconductor film 101b to a portion above the insulating film 107. Furthermore, oxygen released from the insulating film 126 can be trapped below the insulating film 107, resulting in an increase in the amount of oxygen to be supplied to the oxide semiconductor film 101b.

The insulating film 107 that is relatively impermeable to water or hydrogen can inhibit entry of water or hydrogen, which is an impurity for an oxide semiconductor, so that changes in the electrical characteristics of the second transistor 100 can be suppressed and the second transistor 100 can have high reliability.

Note that an insulating film from which oxygen is released by heating, like the insulating film 126, may be provided under the insulating film 107 to supply oxygen also from a portion over the oxide semiconductor film 101b through the gate insulating film 104.

Figure 6A:
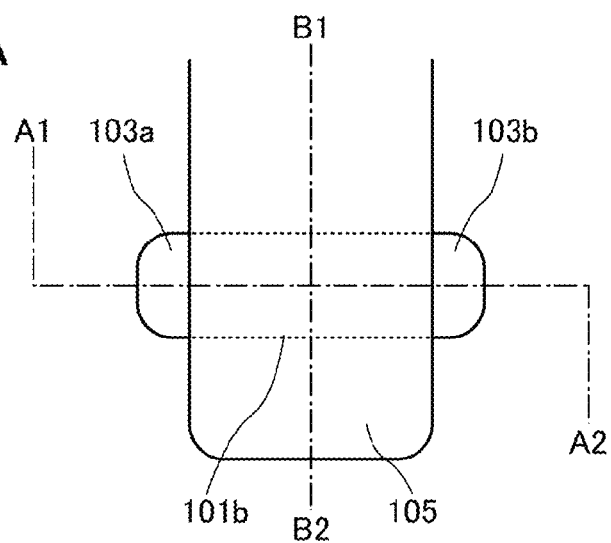
FIGS. 6A to 6C illustrate a structure example of the semiconductor device of an embodiment.
Figure 6B:
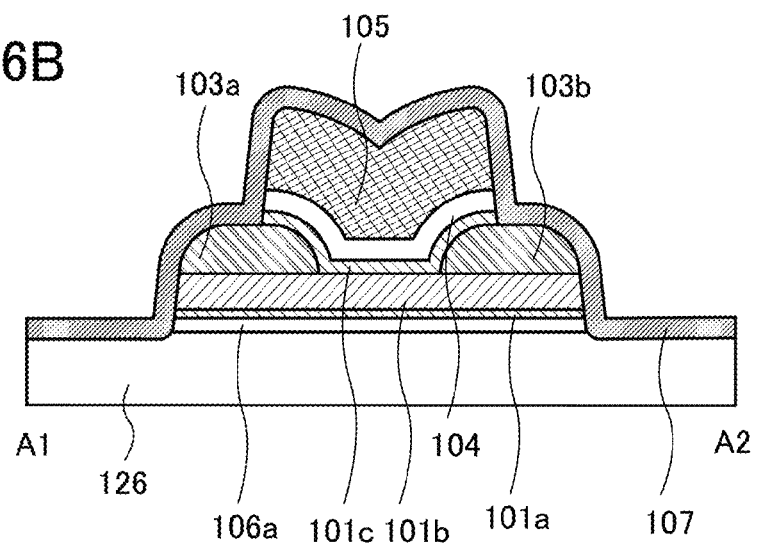
Figure 6C:
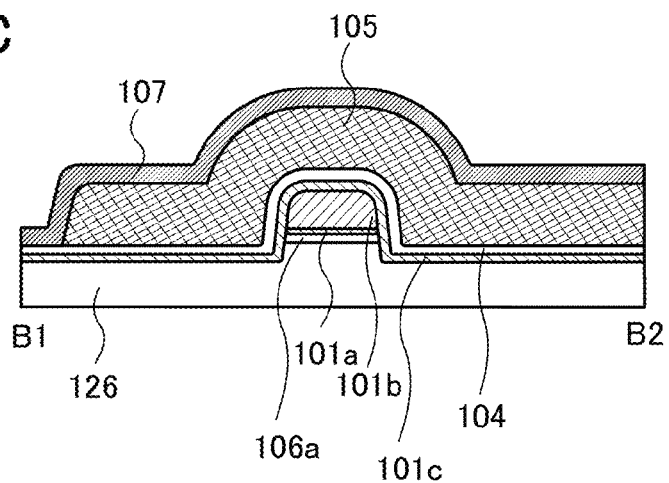

Here, another example of a structure of a transistor that can be used as the second transistor 100 is described. FIG. 6A is a schematic top view of a transistor described below as an example, and FIGS. 6B and 6C are schematic cross-sectional views taken along the section lines A1-A2 and B1-B2, respectively, in FIG. 6A. Note that FIG. 6B corresponds to a cross section of the transistor in a channel length direction, and FIG. 6C corresponds to a cross section of the transistor in a channel width direction.

As illustrated in FIG. 6C, the gate electrode is provided so as to face top and side surfaces of the oxide semiconductor film 101b in the cross section of the transistor in the channel width direction. Thus, a channel is formed not only in the vicinity of the top surface but also in the vicinity of the side surface of the oxide semiconductor film 101b, and the effective channel width is increased, which results in increased current in an on state of the transistor (i.e., on-state current). In particular, in the case where the width of the oxide semiconductor film 101b is very small (e.g., 50 nm or less, preferably 30 nm or less, further preferably 20 nm or less), a region where the channel is formed expands to an inner portion of the oxide semiconductor film 101b. Thus, as miniaturization advances, contribution of this structure to on-state current increases.

Figure 7A:
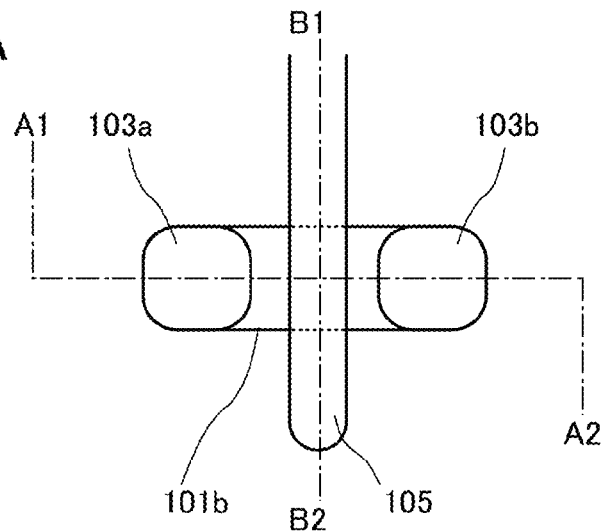
FIGS. 7A to 7C illustrate a structure example of the semiconductor device of an embodiment.
Figure 7B:
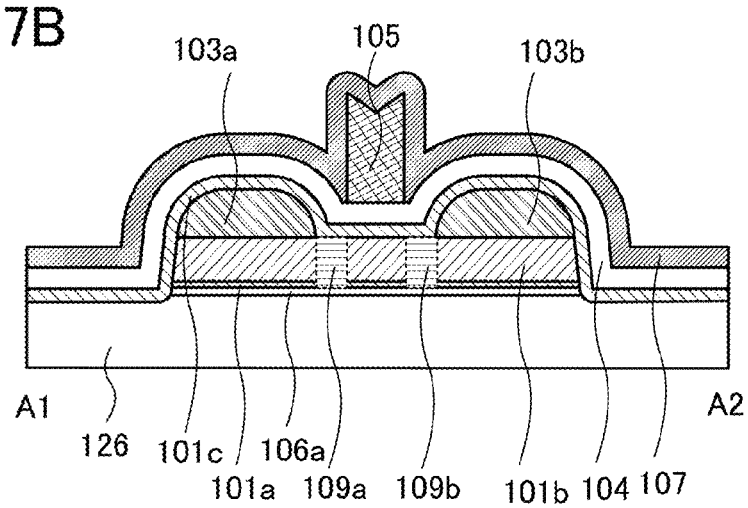
Figure 7C:
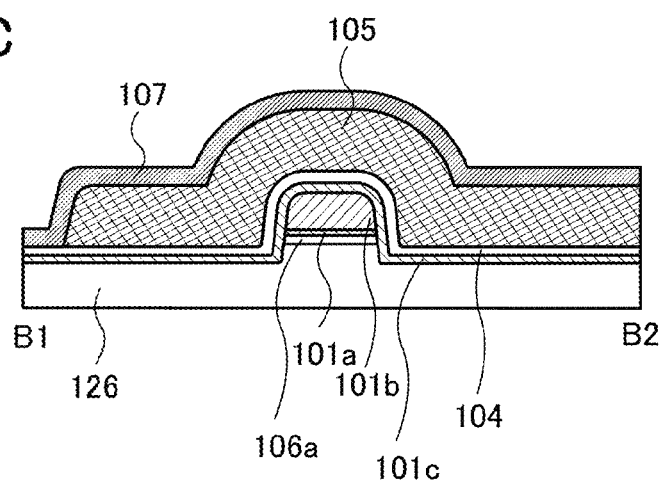

Note that the width of the gate electrode 105 may be made small as illustrated in FIGS. 7A to 7C. In that case, an impurity such as argon, hydrogen, phosphorus, or boron can be introduced into the oxide semiconductor film 101b or the like using, for example, the electrodes 103a and 103b and the gate electrode 105 as a mask. As a result, low-resistance regions 109a and 109b can be provided in the oxide semiconductor film 101b or the like. Note that the low-resistance regions 109a and 109b are not necessarily provided. Note that the width of the gate electrode 105 can be made small not only in FIGS. 6A to 6C but also in other diagrams.

Figure 8A:
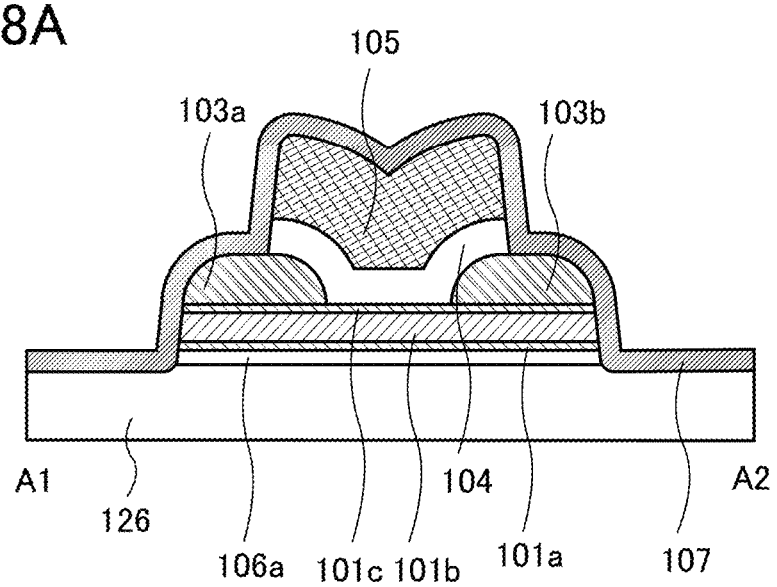
FIGS. 8A and 8B illustrate a structure example of the semiconductor device of an embodiment.
Figure 8B:
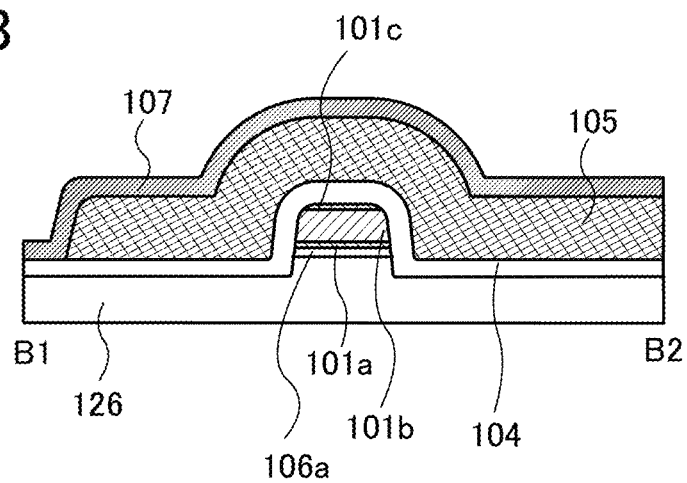

A transistor illustrated in FIGS. 8A and 8B is mainly different from the transistor illustrated in FIGS. 6A to 6C in that the oxide semiconductor film 101c is provided in contact with bottom surfaces of the electrodes 103a and 103b.

Such a structure enables films used for the oxide semiconductor film 101a, the oxide semiconductor film 101b, and the oxide semiconductor film 101c to be formed successively without contact with the air, which can reduce defects at each interface.

Although the oxide semiconductor film 101a and the oxide semiconductor film 101c are provided in contact with the oxide semiconductor film 101b in the above-described structure, only one of the oxide semiconductor films 101a and 101c or neither of them may be provided.

Figure 9A:
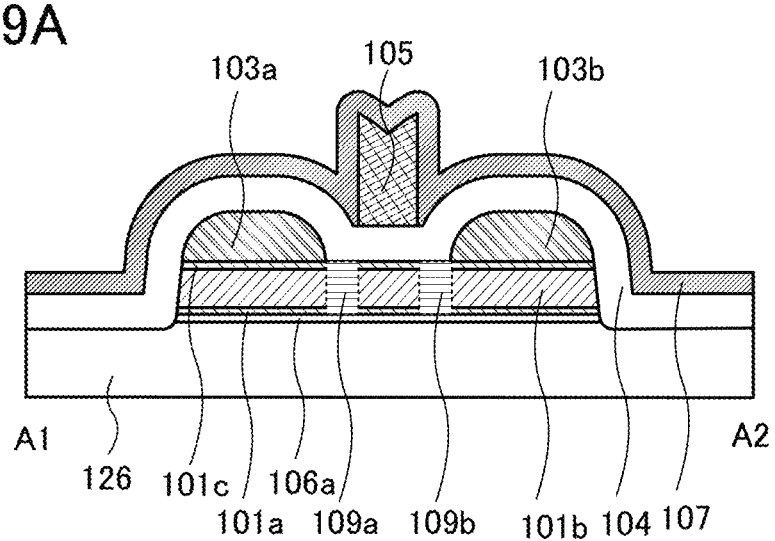
FIGS. 9A and 9B illustrate a structure example of the semiconductor device of an embodiment.
Figure 9B:
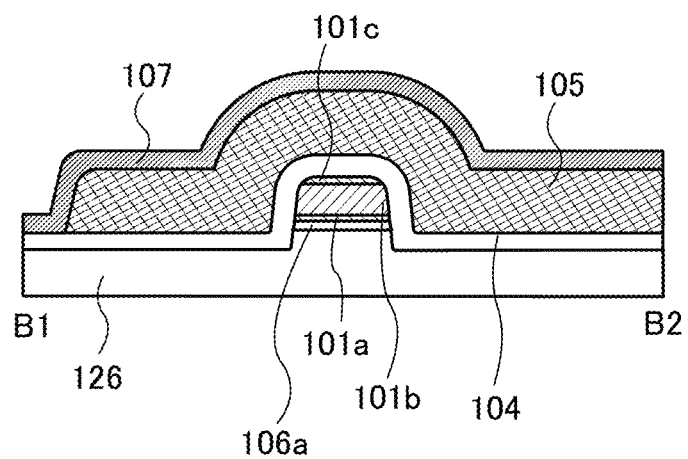

Note that the width of the gate electrode 105 can be made small in FIGS. 8A and 8B as well as in FIGS. 6A to 6C. An example in that case is illustrated in FIGS. 9A and 9B. Note that the width of the gate electrode 105 can be made small not only in FIGS. 6A to 6C and FIGS. 8A and 8B but also in other diagrams.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap each other or a region where a channel is formed in a top view of the transistor. In one transistor, channel lengths in all regions do not necessarily have the same value. In other words, the channel length of one transistor is not fixed to one value in some cases. Therefore, in this specification, the channel length is any one of values, the maximum value, the minimum value, or the average value in a region where a channel is formed.

The channel width refers to, for example, the width of a source or a drain in a region where a semiconductor (or a portion where a current flows in a semiconductor when a transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where the field-effect mobility, current value per channel width, and the like of a transistor are obtained by calculation, a surrounded channel width may be used for the calculation. In that case, a value different from one in the case where an effective channel width is used for the calculation is obtained in some cases.

The above is the description of the second transistor 100.

The insulating film 127 covering the second transistor 100 functions as a planarization film which covers an uneven surface shape of an underlying layer. The insulating film 108 may function as a protective film when the insulating film 127 is formed. The insulating film 108 is not necessarily provided.

A plug 170 is embedded in an insulating film 128 and is electrically connected to the plug 167. A plug 171 is embedded in the insulating film 128 and is electrically connected to the plug 168. A plug 172 is embedded in the insulating film 128 and is electrically connected to the plug 169.

An electrode 173 is electrically connected to the plug 170 and the wiring BL. An electrode 174 is electrically connected to the plug 171 and the wiring WL. An electrode 175 is electrically connected to the plug 172 and the wiring SL.

The semiconductor device in one embodiment of the present invention includes the first transistor 110 and the second transistor 100 above the first transistor. Since these transistors are laminated, the area occupied by the elements can be decreased. Furthermore, the capacitor 130 is located below the second transistor 100; thus, the area occupied by the elements can be decreased. Since the wiring CL and the gate electrode 105 of the second transistor 100 overlap with each other, the area occupied by the elements can be further decreased. The barrier film 120 provided between the first transistor 110 and the second transistor 100 can suppress diffusion of impurities such as water and hydrogen from an underlying layer to the second transistor 100 side.

The above is the description of the structure example.

MANUFACTURING METHOD EXAMPLE

An example of a method for manufacturing the semiconductor device described in the above Structure Example is described below with reference to FIGS. 13A to 13D, FIGS. 14A to 14C, FIGS. 15A to 15C, and FIGS. 16A and 16B.

First, the semiconductor substrate 111 is prepared. As the semiconductor substrate 111, for example, a single crystal silicon substrate (including a p-type semiconductor substrate or an n-type semiconductor substrate), or a compound semiconductor substrate containing silicon carbide or gallium nitride can be used. An SOI substrate may also be used as the semiconductor substrate 111. In the following description, single crystal silicon is used for the semiconductor substrate 111.

Next, an element isolation layer, which is not illustrated, is formed in the semiconductor substrate 111. The element isolation layer may be formed by a local oxidation of silicon (LOCOS) method, a shallow trench isolation (STI) method, or others.

In the case where a p-channel transistor and an n-channel transistor are formed on the same substrate, an n-well or a p-well may be formed in part of the semiconductor substrate 111. For example, a p-well may be formed by adding an impurity element imparting p-type conductivity, such as boron, to an n-type semiconductor substrate 111, and an n-channel transistor and a p-channel transistor may be formed on the same substrate.

Next, an insulating film to be the gate insulating film 114 is formed over the semiconductor substrate 111. For example, after surface nitriding treatment, oxidizing treatment may be performed to oxidize the interface between silicon and silicon nitride, whereby a silicon oxynitride film may be formed. For example, a silicon oxynitride film can be obtained by performing oxygen radical oxidation after a thermal silicon nitride film is formed on the surface at 700° C. in an $NH_3$ atmosphere.

The insulating film may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or others.

Next, a conductive film to be the gate electrode 115 is formed. It is preferable that the conductive film be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Further alternatively, a stacked-layer structure of a film of metal nitride and a film of any of the above metals may be used. As the metal nitride, tungsten nitride, molybdenum nitride, or titanium nitride can be used. When the metal nitride film is provided, adhesiveness of the metal film can be increased to prevent separation. A metal film which controls the work function of the gate electrode 115 may be provided.

The conductive film can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage.

Next, a resist mask is formed over the conductive film by a photolithography process or the like and an unnecessary portion of the conductive film is removed. After that, the resist mask is removed, whereby the gate electrode 115 can be formed.

Here, a method for processing a film is described. In the case of finely processing a film, a variety of fine processing techniques can be used. For example, it is possible to use a method in which a resist mask formed by a photolithography process or the like is subjected to slimming treatment. Alternatively, a dummy pattern is formed by a photolithography process or the like, the dummy pattern is provided with a sidewall and is then removed, and a film is etched using the remaining sidewall as a resist mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light (EUV), X-rays, or an electron beam because extremely minute processing can be performed. Note that in the case of performing exposure by scanning of a beam such as an electron beam, a photomask is not needed.

An organic resin film having a function of improving the adhesion between a film to be processed and a resist film may be formed before the resist film serving as a resist mask is formed. The organic resin film can be formed to planarize a surface by covering a step under the film by a spin coating method or the like, and thus can reduce variation in thickness of the resist mask over the organic resin film. In the case of fine processing, in particular, a material serving as a film preventing reflection of light for the exposure is preferably used for the organic resin film. Examples of the organic resin film having such a function include a bottom anti-reflection coating (BARC) film. The organic resin film may be removed at the same time as the removal of the resist mask or after the removal of the resist mask.

After the gate electrode 115 is formed, a sidewall covering a side surface of the gate electrode 115 may be formed. The sidewall can be formed in such a manner that an insulating film thicker than the gate electrode 115 is formed and subjected to anisotropic etching so that only a portion of the insulating film on the side surface of the gate electrode 115 remains.

The insulating film to be the gate insulating film 114 is etched at the same time as the formation of the sidewall, whereby the gate insulating film 114 is formed under the gate electrode 115 and the sidewall. Alternatively, after the gate electrode 115 is formed, the gate insulating film 114 may be formed by etching the insulating film using the gate electrode 115 or a resist mask for forming the gate electrode 115 as an etching mask. Alternatively, the insulating film can be used as the gate insulating film 114 without being processed by etching.

Figure 10A:
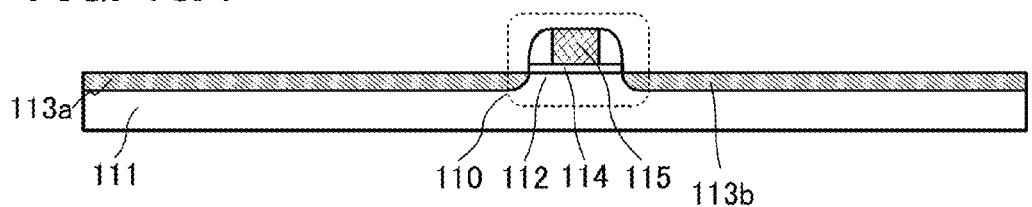
FIGS. 10A to 10D illustrate an example of a method for manufacturing the semiconductor device of an embodiment.

Next, an element imparting n-type conductivity, such as phosphorus, or an element imparting p-type conductivity, such as boron, is added to a region of the semiconductor substrate 111 where the gate electrode 115 (and the sidewall) is not provided. FIG. 10A is a schematic cross-sectional view at this stage.

Next, the insulating film 121 is formed, and then, first heat treatment is performed to activate the aforementioned element that imparts conductivity The insulating film 121 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, or aluminum nitride. The insulating film 121 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

The first heat treatment can be performed at a temperature higher than or equal to 400° C. and lower than the strain point of the substrate in an inert gas atmosphere such as a rare gas atmosphere or a nitrogen gas atmosphere or in a reduced-pressure atmosphere.

At this stage, the first transistor 110 is formed.

Next, the insulating film 122 and the insulating film 123 are formed.

The insulating film 122 can be formed using any of the materials that can be used for the insulating film 121, and is preferably formed using silicon nitride containing oxygen and hydrogen (SiNOH) because the amount of hydrogen released by heating can be increased. The insulating film 123 can be formed using any of the materials that can be used for the insulating film 121, and is preferably formed using silicon oxide with high step coverage that is formed by reacting tetraethyl orthosilicate (TEOS), silane, or the like with oxygen, nitrous oxide, or the like.

The insulating film 122 and the insulating film 123 can be formed by, for example, a sputtering method, a CVD method (including a thermal CVD method, an MOCVD method, a PECVD method, and the like), an MBE method, an ALD method, or a PLD method. In particular, it is preferable that the insulating films 122 and 123 be formed by a CVD method, further preferably a plasma CVD method because coverage can be further improved. It is preferable to use a thermal CVD method, an MOCVD method, or an ALD method in order to reduce plasma damage.

Next, a top surface of the insulating film 123 is planarized by a CMP method or the like.

After that, second heat treatment is performed so that dangling bonds in the semiconductor film 112 are terminated by hydrogen released from the insulating film 122.

The second heat treatment can be performed under the conditions given as an example in the description of the laminated structure 10.

Then, the insulating film 124 is formed over the insulating film 123.

Figure 10B:
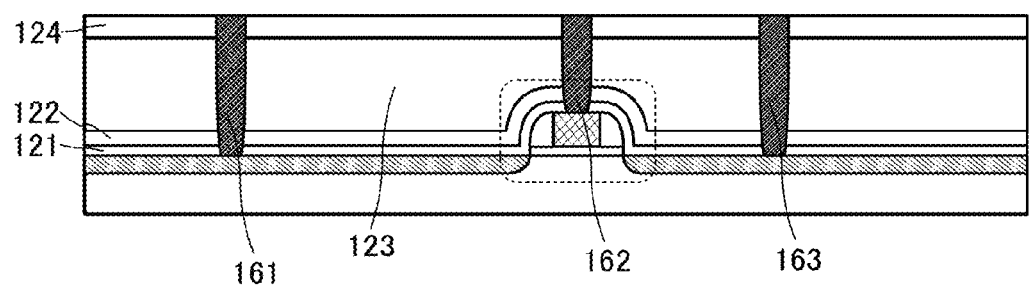

Next, openings are formed in the insulating films 121, 122, 123, and 124 so as to reach the low-resistance layers 113a and 113b, the gate electrode 115, and the like. After that, a conductive film is formed so as to fill the openings, and the conductive film is subjected to planarization treatment to expose a top surface of the insulating film 124, whereby the plug 161, the plug 162, the plug 163, and the like are formed. The conductive film can be formed by a sputtering method, a CVD method (including a thermal CVD method, an MOCVD method, a PECVD method, and the like), an MBE method, an ALD method, a PLD method, or others. FIG. 10B is a schematic cross-sectional view at this stage.

Next, a conductive film is formed over the insulating film 124. Then, a resist mask is formed by a method similar to that described above, and unnecessary portions of the conductive film are removed by etching. Then, the resist mask is removed, so that the electrode 136 which is one electrode of the capacitor is formed.

The insulating film 137 and the electrode 138 are formed over the electrode 136 using a resist mask as in the former method. Note that it is preferable to form the electrode 138 so as to overlap with the gate electrode 105 of the second transistor 100 which is formed later.

The electrode 138 is electrically connected to the wiring CL. The wiring CL and the gate electrode 105 of the second transistor 100 overlap with each other; thus, the area occupied by the elements can be further decreased.

Figure 10C:
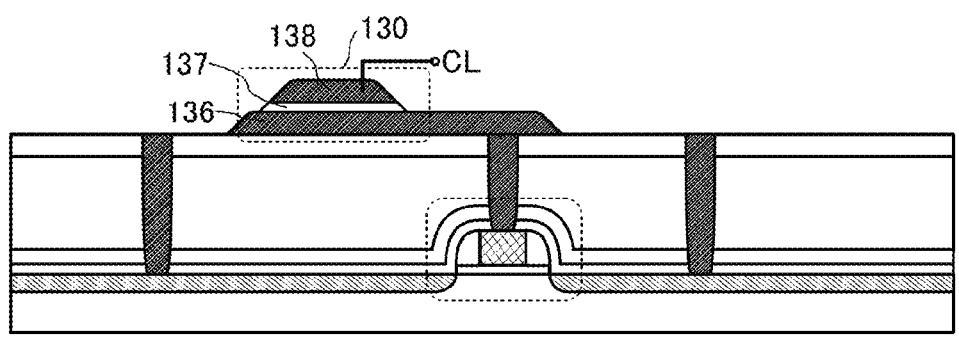

At this stage, the capacitor 130 is formed (see FIG. 10C).

Next, an insulating film is formed to cover the capacitor 130, and is subjected to planarization treatment to expose top surfaces of the wirings, whereby the insulating film 125 is formed. An insulating film to be the insulating film 125 can be formed using a material and a method similar to those for the insulating film 121 or the like.

After the insulating film 125 is formed, third heat treatment is preferably performed. By the third heat treatment, water and hydrogen are released from each layer; thus, the contents of water and hydrogen can be reduced. In the case where the third heat treatment is performed shortly before formation of the barrier film 120 to be described later to thoroughly remove hydrogen and water from layers under the barrier film 120 and then the barrier film 120 is formed, it is possible to suppress diffusion and release of water and hydrogen to the side under the barrier film 120 in a later step.

The third heat treatment can be performed under the conditions given as an example in the above description of the laminated structure 10.

Figure 10D:
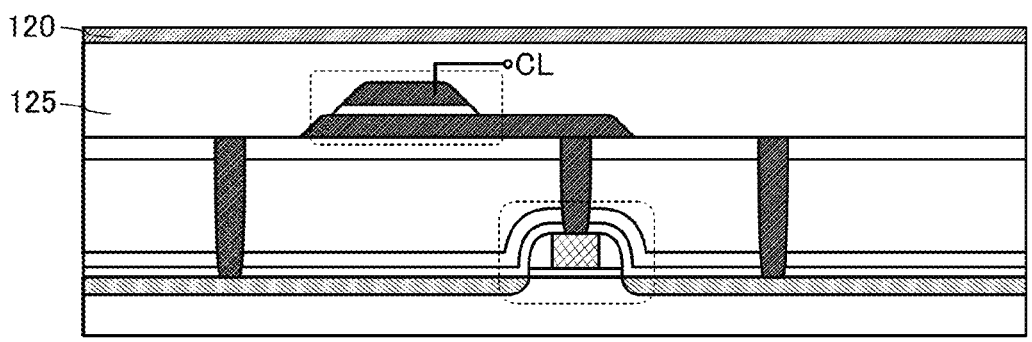

The barrier film 120 is formed over the insulating film 125 (see FIG. 10D).

The barrier film 120 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

After the barrier film 120 is formed, heat treatment may be performed to reduce water and hydrogen contained in the barrier film 120 or inhibit release of gas.

A conductive film is formed over the barrier film 120. A resist mask is formed by a method similar to that described above. Unnecessary portions of the conductive film are removed by etching. The resist mask is then removed, so that the wiring 132 is obtained.

An insulating film to be the insulating film 126 is formed. The insulating film to be the insulating film 126 can be formed by a sputtering method, a CVD method (including a thermal CVD method, an MOCVD method, a PECVD method, and the like), an MBE method, an ALD method, a PLD method, or the like. A CVD method, particularly a plasma CVD method is preferable to improve coverage. A thermal CVD method, an MOCVD method, or an ALD method is preferable in order to reduce plasma damage.

In order to make the insulating film to be the insulating film 126 contain excess oxygen, the insulating film 125 may be formed in an oxygen atmosphere, for example. Alternatively, a region containing excess oxygen may be formed by introducing oxygen into the insulating film to be the insulating film 126 that has been formed. These two methods may be combined.

For example, oxygen (at least including any of oxygen radicals, oxygen atoms, and oxygen ions) is introduced into the insulating film to be the insulating film 126 that has been formed, whereby a region containing excess oxygen is formed. Oxygen can be introduced by an ion implantation method, an ion doping method, a plasma immersion ion implantation method, plasma treatment, or the like.

A gas containing oxygen can be used for introducing oxygen. As the gas containing oxygen, oxygen, dinitrogen monoxide, nitrogen dioxide, carbon dioxide, carbon monoxide, and the like can be used. A rare gas may be contained in the oxygen-containing gas in introducing oxygen. For example, a mixed gas of carbon dioxide, hydrogen, and argon can be used.

Figure 11A:
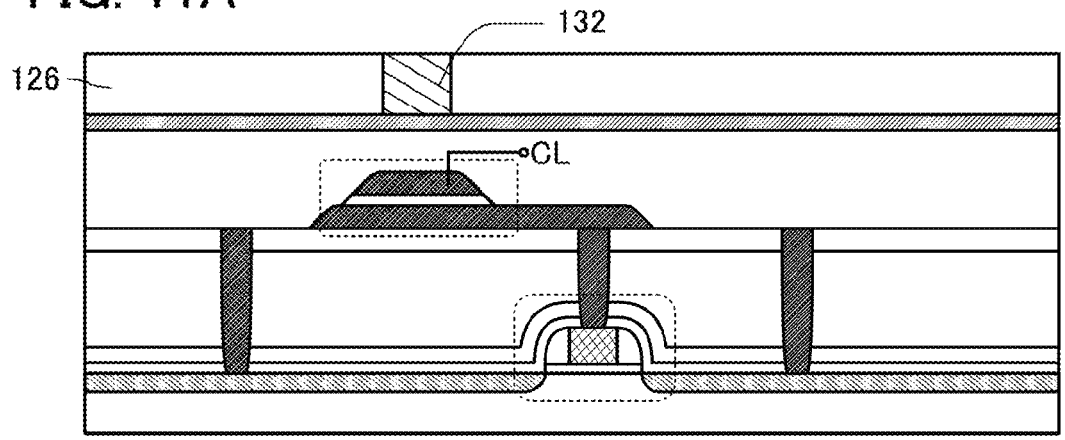
FIGS. 11A to 11C illustrate an example of a method for manufacturing the semiconductor device of an embodiment.

After the insulating film to be the insulating film 126 is formed, the insulating film 126 is formed by performing planarization treatment using a CMP method or the like to improve the planarity of the top surface of the insulating film (see FIG. 11A).

The wiring 132 may be formed after the insulating film 126 is formed. First, an insulating film to be the insulating film 126 is formed over the barrier film 120, a resist mask is formed over the insulating film, unnecessary portions of the insulating film is removed by etching, so that the insulating film 126 is formed. Then, a conductive film is formed thereover, a resist mask is formed over the conductive film, unnecessary portions of the conductive film is removed by etching, so that the wiring 132 is obtained.

Next, an insulating film to be the insulating film 106a, an oxide semiconductor film to be the oxide semiconductor film 101a, and an oxide semiconductor film to be the oxide semiconductor film 101b are formed in this order. The oxide semiconductor films are preferably formed successively without contact with the air.

After an oxide semiconductor film to be the oxide semiconductor film 101b is formed, fourth heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. The heat treatment may be performed directly after the formation of an oxide semiconductor film to be the oxide semiconductor film 101b or may be performed after an oxide semiconductor film to be the oxide semiconductor film 101b is processed into the island-shaped oxide semiconductor film 101b. Through the heat treatment, oxygen can be supplied to the oxide semiconductor film from insulating films to be the insulating films 126 and 106a; thus, oxygen vacancies in the semiconductor film can be reduced.

Figure 11B:
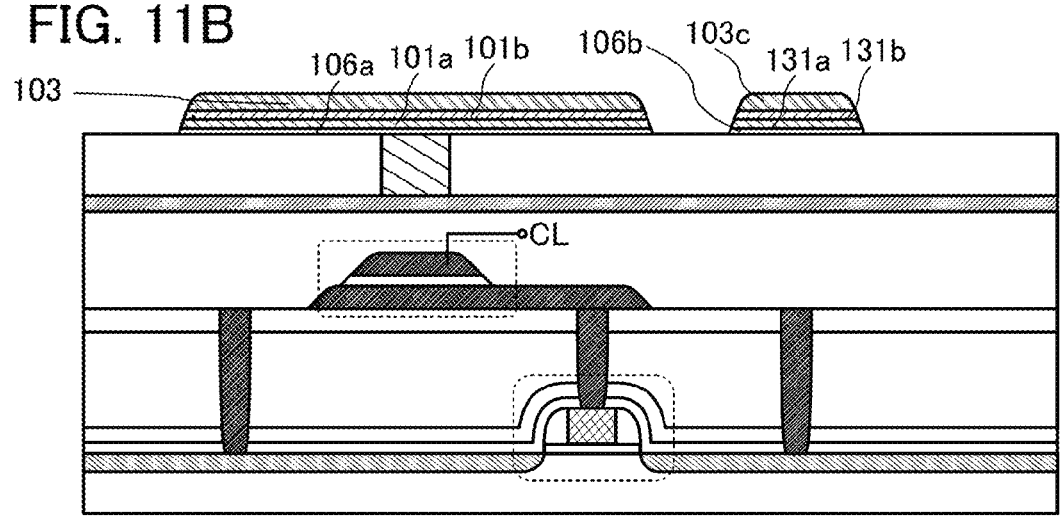

Next, a conductive film to be a hard mask and a resist mask are formed over an oxide semiconductor film to be the oxide semiconductor film 101b by a method similar to that described above, and an unnecessary portion of the conductive film is removed by etching. After that, unnecessary portions of the insulating film to be the insulating film 106a and the oxide semiconductor film are removed by etching using the conductive film as a mask. Then, the resist mask is removed. In this manner, a stacked-layer structure including an island-shaped conductive film 103, the insulating film 106a, the island-shaped oxide semiconductor film 101a, and the island-shaped oxide semiconductor film 101b can be formed (see FIG. 11B).

At the same time, a stacked-layer structure including the electrode 103c, the insulating film 106b, the island-shaped oxide semiconductor film 131a, and the island-shaped oxide semiconductor film 131b can be formed.

The conductive film can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

Next, a resist mask is formed over the conductive film 103 by a method similar to that described above, and an unnecessary portion of the conductive film 103 is removed by etching. After that, the resist mask is removed. In this manner, the electrodes 103a and 103b can be formed.

Next, a resist mask is formed over the insulating film 126 and the electrodes 103a and 103b by a method similar to the above-described one. With the resist mask, an opening reaching the plug 161 and an opening reaching the electrode 136 through the oxide semiconductor films 101b and 101a, the insulating films 106a and 126, the barrier film 120, and the insulating film 125 are formed. A resist mask is also formed on the electrode 103c. With the resist mask, an opening reaching the plug 163 through the oxide semiconductor films 131b and 131a, the insulating films 106b and 126, the barrier film 120, and the insulating film 125 is formed.

Figure 11C:
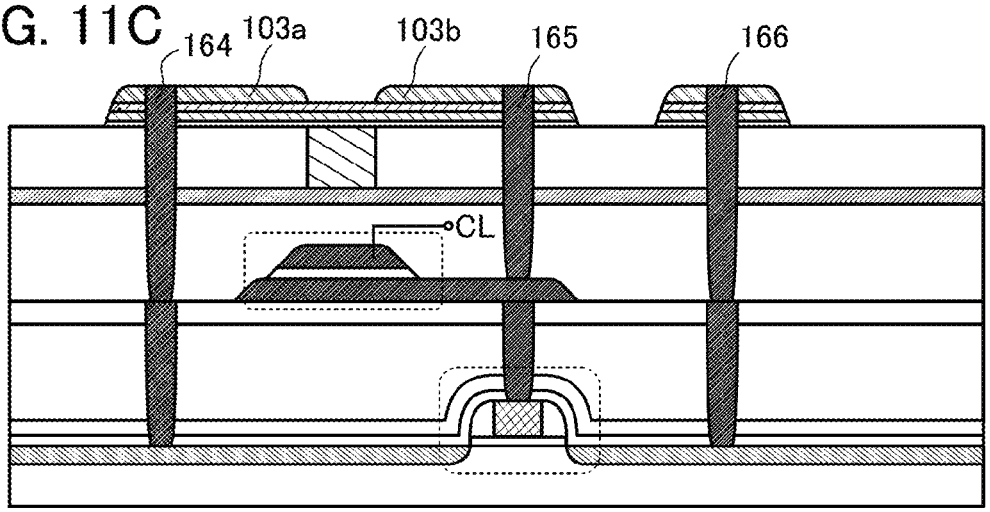

A conductive film is deposited, thereby forming the plugs 164, 165, and 166 (see FIG. 11C).

Figure 12A:
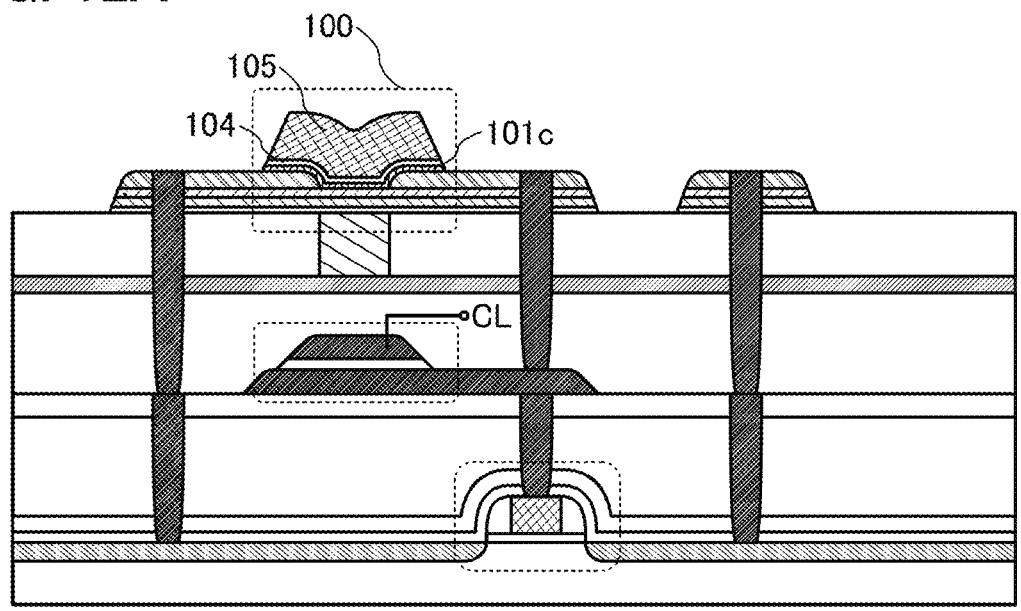
FIGS. 12A and 12B illustrate an example of a method for manufacturing the semiconductor device of an embodiment.

Next, the oxide semiconductor film 101c, the gate insulating film 104, and the gate electrode 105 are formed (see FIG. 12A).

At this stage, the second transistor 100 is obtained.

Next, the insulating film 107 is formed. The insulating film 107 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

After the insulating film 107 is formed, fifth heat treatment is preferably performed. Through the heat treatment, oxygen can be supplied to the oxide semiconductor film 101b from the insulating film 126 and the like; thus, oxygen vacancies in the oxide semiconductor film 101b can be reduced. At this time, oxygen released from the insulating film 126 is blocked by the barrier film 120 and the insulating film 107 and does not diffuse to a film under the barrier film 120 and a film over the insulating film 107; thus, oxygen can be effectively confined. Thus, the amount of oxygen supplied to the oxide semiconductor film 101b can be increased, so that oxygen vacancies in the oxide semiconductor film 101b can be effectively reduced.

Figure 12B:
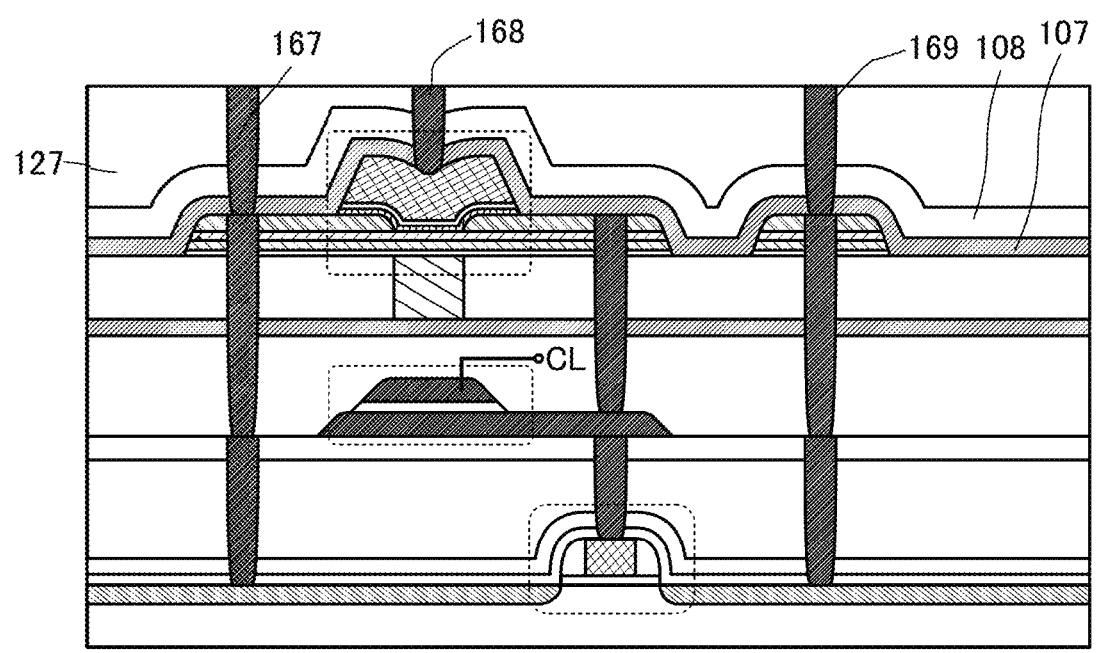

Next, the insulating film 108 and the insulating film 127 are formed in this order (FIG. 12B). The insulating film 108 and the insulating film 127 can be formed by, for example, a sputtering method, a CVD method (including a thermal CVD method, an MOCVD method, a PECVD method, an atmospheric pressure CVD (APCVD) method, and the like), an MBE method, an ALD method, or a PLD method. In particular, the insulating film 108 is preferably formed by a DC sputtering method, in which case a film with a high barrier property can be formed thick with high productivity. It is also preferable that the insulating film 108 be formed by an ALD method because ion damage can be reduced and good coverage can be achieved. In the case where the insulating film 127 is formed using an organic insulating material such as an organic resin, a coating method such as a spin coating method may be used. After the insulating film 127 is formed, a top surface thereof is preferably subjected to planarization treatment. It may be planarized through fluidization by heat treatment. In order to achieve higher planarity, after the insulating film 127 is formed, it is preferable that an insulating film be stacked by a CVD method and a top surface thereof be subjected to planarization treatment.

Next, by a method similar to that described above, openings are formed in the insulating film 126, the insulating film 108, and the insulating film 107, and the plug 167 reaching the plug 164, the plug 168 reaching the gate electrode 105, and the plug 169 reaching the plug 166 are formed.

Next, the insulating film 128 is formed. Not that the description of the insulating film 127 can be referred to for the insulating film 128.

Next, by a method similar to that described above, openings are formed in the insulating film 128, and the plug 170 reaching the plug 167, the plug 171 reaching the plug 168, and the plug 172 reaching the plug 169 are formed.

Next, the electrode 173 electrically connected to the plug 170, the electrode 174 electrically connected to the plug 171, and the electrode 175 electrically connected to the plug 172 are formed.

Furthermore, the electrodes 173, 174, and 175 are electrically connected to the wirings BL, WL, and SL, respectively (see FIG. 1B). Note that the material of the wiring CL can be used for the wirings BL, WL, and SL as well.

Through the above steps, the semiconductor device in one embodiment of the present invention can be manufactured.

Modification Example 1

Figure 13A:
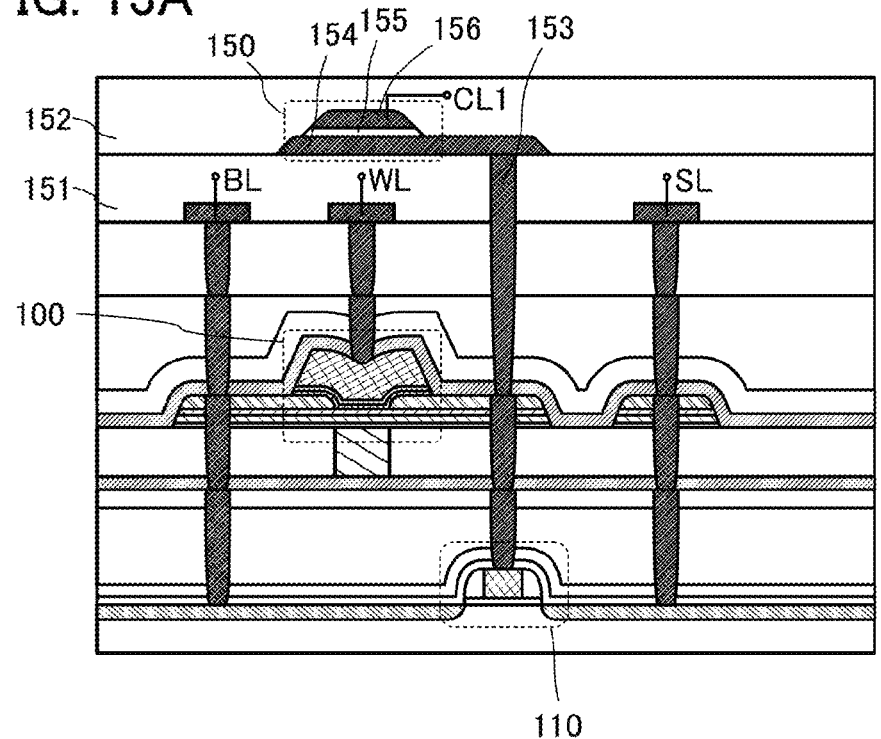
FIGS. 13A and 13B illustrate a structure example of the semiconductor device of an embodiment.

FIG. 13A illustrates a modification example of this embodiment, in which the capacitor is positioned above the second transistor 100. Specifically, an insulating film 151 is formed over the wirings BL, WL, and SL and the insulating film 128. Then, an opening is formed in the insulating films 151, 128, 127, 108, and 107 to form a plug 153 therein which is electrically connected to the plug 165. An electrode 154 electrically connected to the plug 153, an insulating film 155 over the electrode 154, and an electrode 156 over the insulating film 155 are formed, so that a capacitor 150 is obtained. Then, an insulating film 152 covering the capacitor 150 is formed. Note that the electrode 156 is electrically connected to a wiring CL1 and includes a region overlapping with the gate electrode 105.

Figure 13B:
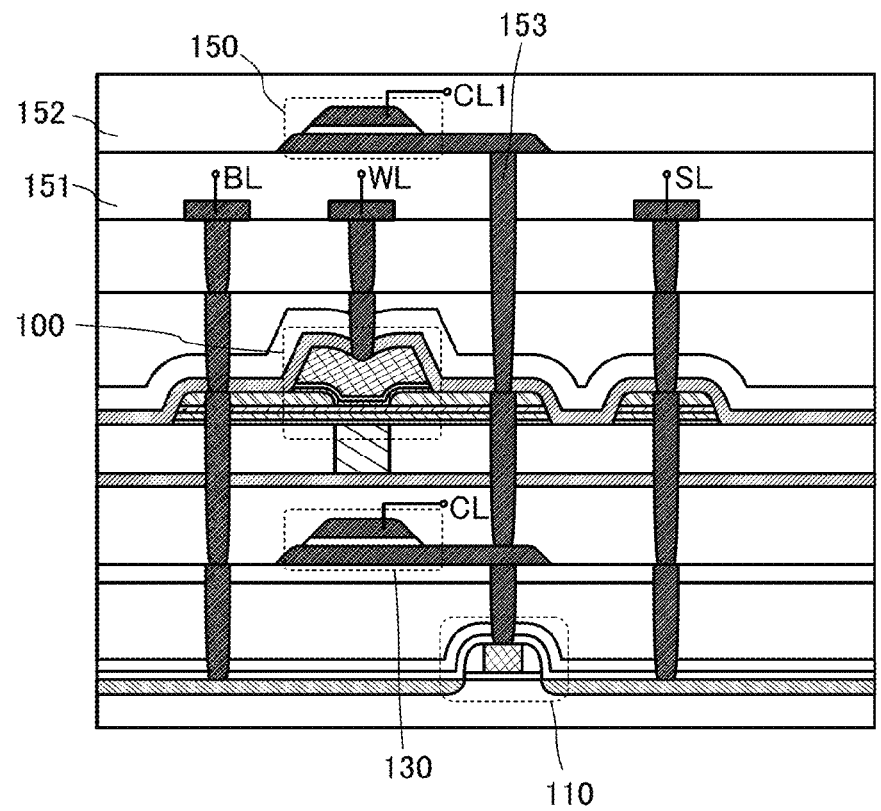

FIG. 13B illustrates another example in which the capacitor 130 is positioned below the gate electrode 105 of the second transistor 100 and the capacitor 150 is positioned above the gate electrode 105.

Modification Example 2

Figure 14:
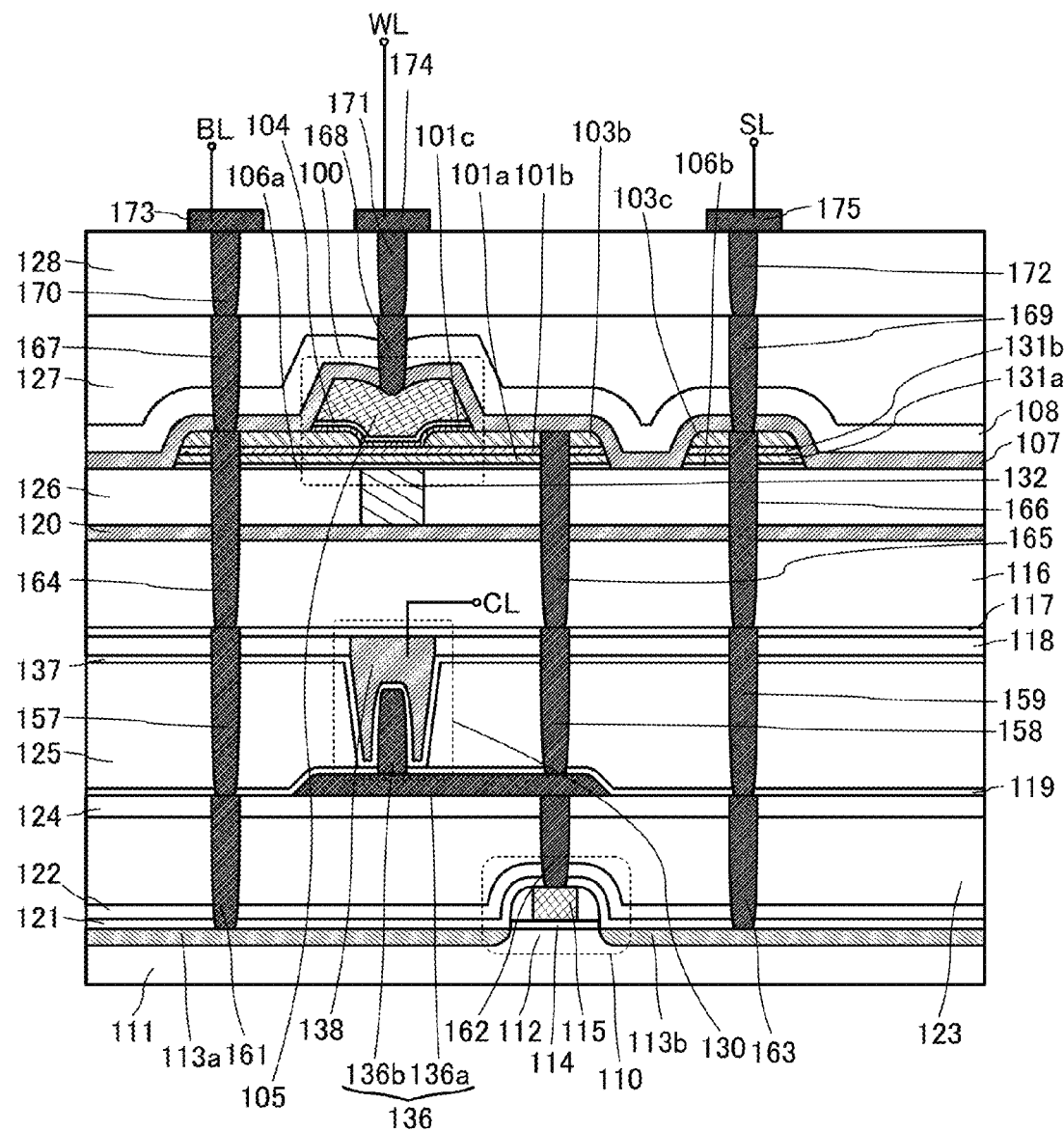
FIG. 14 illustrates a structure example of the semiconductor device of an embodiment.

FIG. 14 illustrates another modification example of this embodiment. The shape of the capacitor 130 is different from that in FIG. 1B. The specific configuration will be described.

An electrode 136a to be part of the electrode 136, which is one electrode of the capacitor 130 is formed over the insulating film 124. An insulating film 119 covering the electrode 136a is formed. A resist mask is formed over the insulating film 119. An opening is formed in the insulating film 119 using the mask, so that an electrode 136b electrically connected to the electrode 136a is obtained. An insulating film to be the insulating film 125 is deposited and subjected to planarization treatment. With the resist mask, an opening exposing the electrode 136b and the insulating film 119 is formed in the insulating film 125. The insulating film 128 can be referred to for the insulating film to be the insulating film 125.

Then, an insulating film 137 is formed over the insulating film 125, the electrode 136b, and the insulating film 119. An electrode 138 is formed so as to fill the opening in the insulating film 125. Insulating films 118, 117, and 116 are formed. Note that the electrode 138 is electrically connected to the wiring CL and includes a region overlapping with the gate electrode 105.

Next, openings are formed in the insulating films 118, 117, 116, 137, 125, and 119, and plugs 157, 158, and 159 are formed therein. Note that the plug 157 is electrically connected to the plugs 161 and 164, the plug 158 is electrically connected to the electrode 136 and the plug 165, and the plug 159 is electrically connected to the plugs 163 and 166.

Modification Example 3

Figure 15:
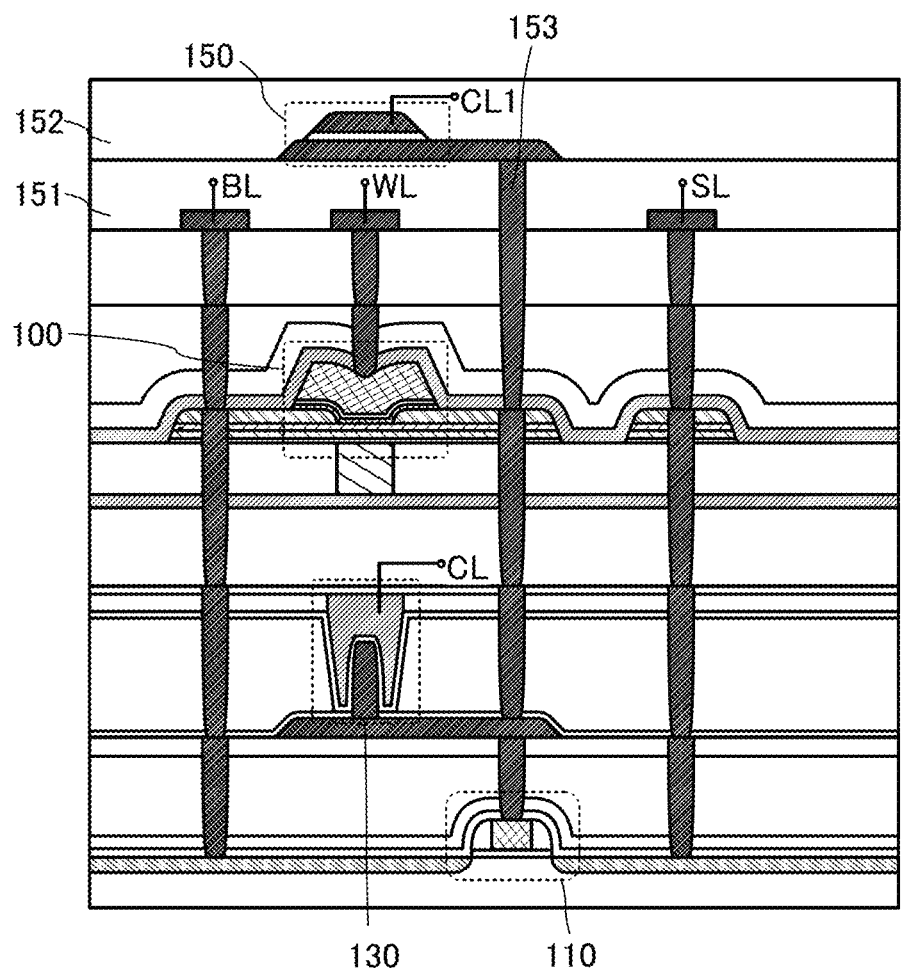
FIG. 15 illustrates a structure example of the semiconductor device of an embodiment.

FIG. 15 illustrates another modification example of this embodiment in which the capacitor 150 in FIGS. 13A and 13B is provided above the gate electrode 105 of the second transistor 100 in addition to the structure of FIG. 14.

Note that there is no need to use the same type of capacitors when a plurality of capacitors is provided; for example, the capacitor shown in FIG. 1B and the capacitor shown in FIG. 14 can be combined as appropriate.

At least part of this embodiment can be implemented in combination with any of the embodiments described in this specification as appropriate.

Embodiment 2

In this embodiment, semiconductor devices different from those in Embodiment 1 will be described.

[Structure Example]

Figure 16A:
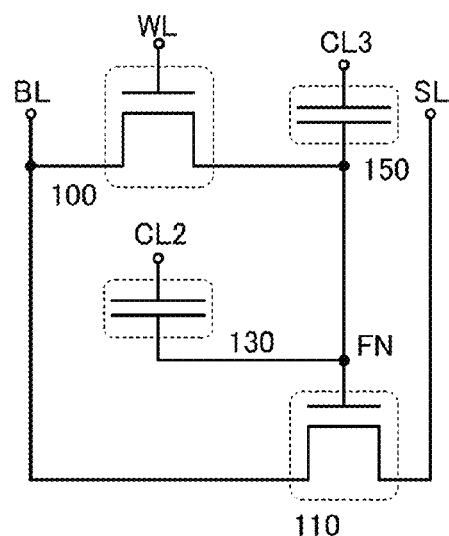
FIGS. 16A and 16B show a circuit diagram and a structure example of a semiconductor device of an embodiment.

FIG. 16A is an example of a circuit diagram of a semiconductor device of one embodiment of the present invention. The semiconductor device shown in FIG. 16A includes a first transistor 110, a second transistor 100, a capacitor 130, a capacitor 150, a wiring SL, a wiring BL, a wiring WL, a wiring CL2, and a wiring CL3.

One of a source and a drain of the first transistor 110 is electrically connected to the wiring BL, the other is electrically connected to the wiring SL, and a gate of the first transistor 110 is electrically connected to one of a source and a drain of the second transistor 100, one electrode of the capacitor 130, and one electrode of the capacitor 150. The other of the source and the drain of the second transistor 100 is electrically connected to the wiring BL, and a gate of the second transistor 100 is electrically connected to the wiring WL. The other electrode of the capacitor 130 is electrically connected to the wiring CL2. The other electrode of the capacitor 150 is electrically connected to the wiring CL3. Note that a node between the gate of the first transistor 110, the one of the source and the drain of the second transistor 100, the one electrode of the capacitor 130, and the one electrode of the capacitor 150 is referred to as a node FN.

Figure 16B:
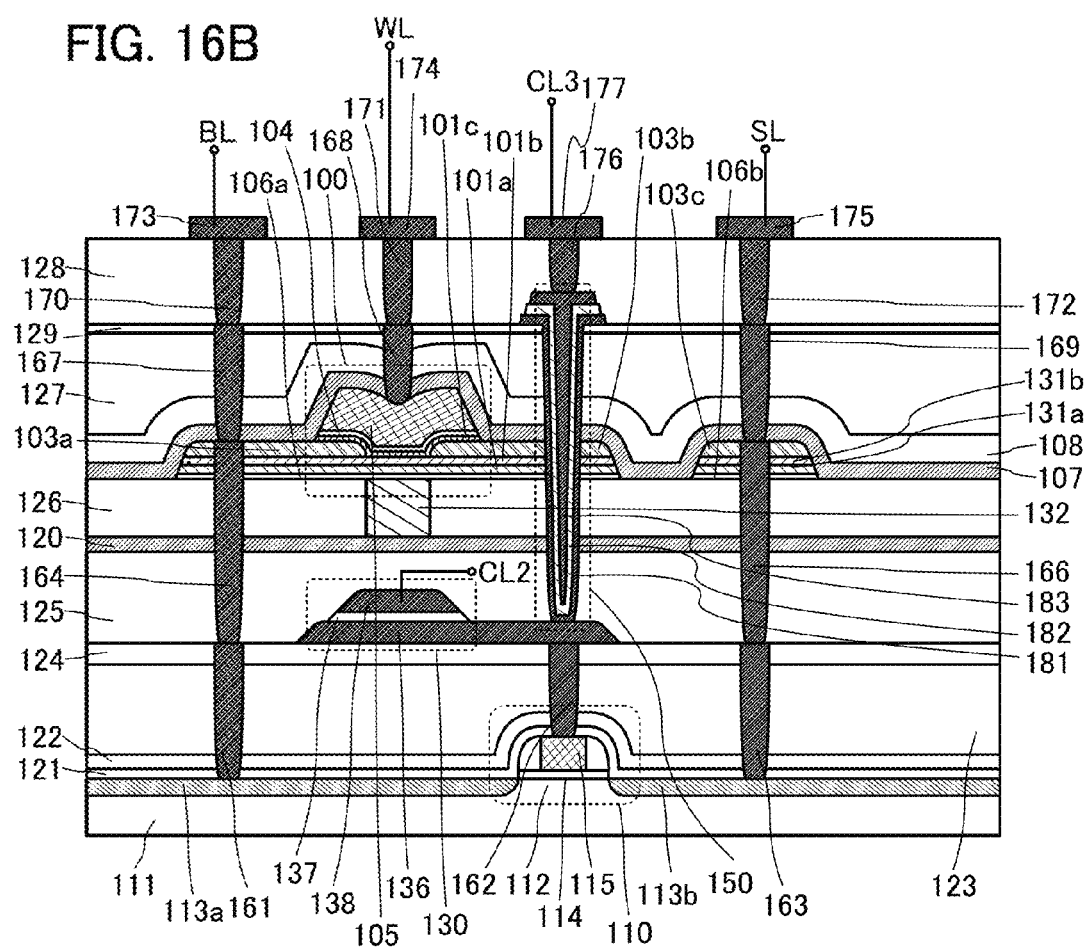

FIG. 16B illustrates an example of a cross-sectional structure of the semiconductor device in which the circuit shown in FIG. 16A is obtained. FIG. 17A illustrates a top view of arranged semiconductor devices shown in FIG. 16B. Note that the semiconductor devices share the wirings CL2 and CL3 serving as common wirings.

Figure 17:
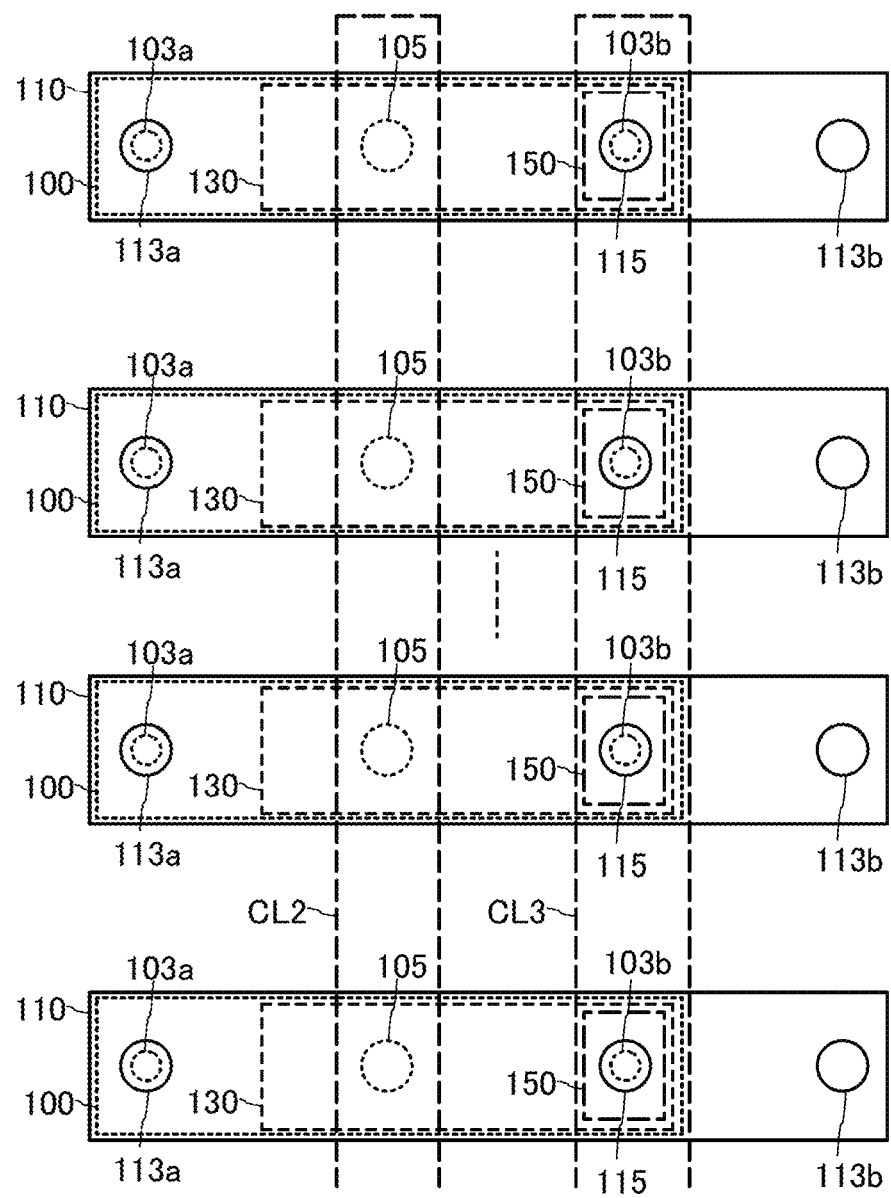
FIG. 17 is a top view of arranged semiconductor devices of an embodiment.

As shown in FIG. 17, the second transistor 100 and the capacitors 130 and 150 are provided within the area occupied by the first transistor 110.

As shown in FIG. 16B, the semiconductor device includes the first transistor 110, the second transistor 100, and the capacitors 130 and 150. The second transistor 100 is provided above the first transistor 110, and a barrier film 120 is provided between the first transistor 110 and the second transistor 100.

The description in Embodiment 1 can be referred to for elements below the barrier film 120, such as the first transistor 110 and the capacitor 130.

The barrier film 120 has openings in which plugs 164 and 166 described later and the capacitor 150 are embedded.

The wiring 132 is provided over the barrier film 120. A structure including the wiring 132 corresponds to the second wiring layer 32 in the laminated structure 10.

Part of the wiring 132 is overlapped with a channel formation region of the second transistor 100, which is described later, and functions as a second gate electrode of the second transistor 100.

The insulating film 126 is provided to cover the barrier film 120, the wiring 132, and the like. Here, a region including the insulating film 126 corresponds to the second insulating film 22 in the laminated structure 10.

It is preferable that the top surface of the insulating film 126 be planarized by planarization treatment described above.

An oxide material from which oxygen is partly released due to heating is preferably used for the insulating film 126.

The second transistor 100 is provided over the insulating film 126. A structure including the second transistor 100 corresponds to the second layer 12 in the laminated structure 10.

The second transistor 100 includes the insulating film 106a in contact with the top surface of the insulating film 126, the oxide semiconductor film 101a in contact with the top surface of the insulating film 106a, the oxide semiconductor film 101b in contact with the top surface of the oxide semiconductor film 101a, the electrode 103a and the electrode 103b in contact with the top surface of the oxide semiconductor film 101b and apart from each other in a region overlapping with the oxide semiconductor film 101b, the oxide semiconductor film 101c in contact with the top surface of the oxide semiconductor film 101b and the top surfaces of the electrodes 103a and 103b, the gate insulating film 104 over the oxide semiconductor film 101c, and gate electrode 105 overlapping with the oxide semiconductor film 101b with the gate insulating film 104 and the oxide semiconductor film 101c provided therebetween. The second transistor 100 is covered with the insulating film 107, the insulating film 108, the insulating film 127, and an insulating film 129.

The plug 164 electrically connected to the plug 161 and the electrode 103a is embedded in the insulating film 125, the barrier film 120, the insulating film 126, the insulating film 106a, the oxide semiconductor film 101a, the oxide semiconductor film 101b, and the electrode 103a. Furthermore, an electrode 181 of the capacitor 150 electrically connected to the electrode 136 and the electrode 103b is embedded in the insulating film 125, the barrier film 120, the insulating films 126 and 106a, the oxide semiconductor films 101a and 101b, the electrode 103b, and the insulating films 107, 108, 127, and 129.

At the same time the second transistor 100 is formed, the insulating film 106b, an oxide semiconductor film 131a, an oxide semiconductor film 131b, and an electrode 103c are formed, and the plug 166 electrically connected to the plug 163 and the electrode 103c is provided so as to be embedded in the insulating film 125, the barrier film 120, the insulating films 126 and 106*b*, the oxide semiconductor film 131*a*, the oxide semiconductor film 131*b*, and the electrode 103*c*.

A node including the gate electrode 115 of the first transistor 110, the electrode 136 of the capacitor 130, the electrode 181 of the capacitor 150, and the electrode 103*b* of the second transistor 100 corresponds to the node FN illustrated in FIG. 16A.

Note that the description in Embodiment 1 can be referred to for description of the second transistor 100.

The insulating film 127 covering the second transistor 100 and the insulating film 129 function as a planarization film which covers an uneven surface shape of an underlying layer. The insulating film 108 may function as a protective film when the insulating film 127 is formed. The insulating films 108 and 129 are not necessarily provided.

The plug 170 is embedded in the insulating film 128 and is electrically connected to the plug 167. The plug 171 is embedded in the insulating film 128 and is electrically connected to the plug 168. The plug 172 is embedded in the insulating film 128 and is electrically connected to the plug 169. The plug 176 is embedded in the insulating film 128 and is electrically connected to an electrode 183 of the capacitor 150.

The electrode 173 is electrically connected to the plug 170 and the wiring BL. The electrode 174 is electrically connected to the plug 171 and the wiring WL. The electrode 175 is electrically connected to the plug 172 and the wiring SL. An electrode 177 is electrically connected to the plug 176 and the wiring CL3.

The semiconductor device in one embodiment of the present invention includes the first transistor 110 and the second transistor 100 above the first transistor. Since these transistors are laminated, the area occupied by the elements can be decreased. The capacitor 130 is located under the second transistor 100; thus, the area occupied by the elements can be decreased. Since the capacitor 150 is laminated above the first transistor 110, the area occupied by the elements can be decreased. Since the wiring CL2 and the gate electrode 105 of the second transistor 100 overlap with each other, the area occupied by the elements can be further decreased. Moreover, the wiring CL3 and the gate electrode 115 of the first transistor 110 overlap with each other; thus, the area occupied by the elements can be further decreased. The barrier film 120 provided between the first transistor 110 and the second transistor 100 can suppress diffusion of impurities such as water and hydrogen from an underlying layer to the second transistor 100 side.

The above is the description of the structure example.

[Example of Manufacturing Method]

An example of a method for manufacturing the semiconductor device described in the above structure example will be described with reference to FIGS. 10A to 10D, FIGS. 11A to 11C, FIGS. 12A and 12B, FIGS. 18A and 18B, and FIGS. 19A and 19B.

The gate insulating film 104 and the gate electrode 105 of the second transistor 100 are formed (see FIG. 18A) with reference to Example of Manufacturing Method of FIGS. 10A to 10D and FIG. 12A in Embodiment 1.

At this stage, the second transistor 100 is formed.

After the insulating film 107 is formed, heat treatment is preferably performed. Through the heat treatment, oxygen can be supplied to the oxide semiconductor film 101*b* from the insulating film 126 and the like; thus, oxygen vacancies in the oxide semiconductor film 101*b* can be reduced. At this time, oxygen released from the insulating film 126 is blocked by the barrier film 120 and the insulating film 107 and does not diffuse to a film under the barrier film 120 and a film over the insulating film 107; thus, oxygen can be effectively confined. Thus, the amount of oxygen supplied to the oxide semiconductor film 101*b* can be increased, so that oxygen vacancies in the oxide semiconductor film 101*b* can be effectively reduced.

Figure 18A:
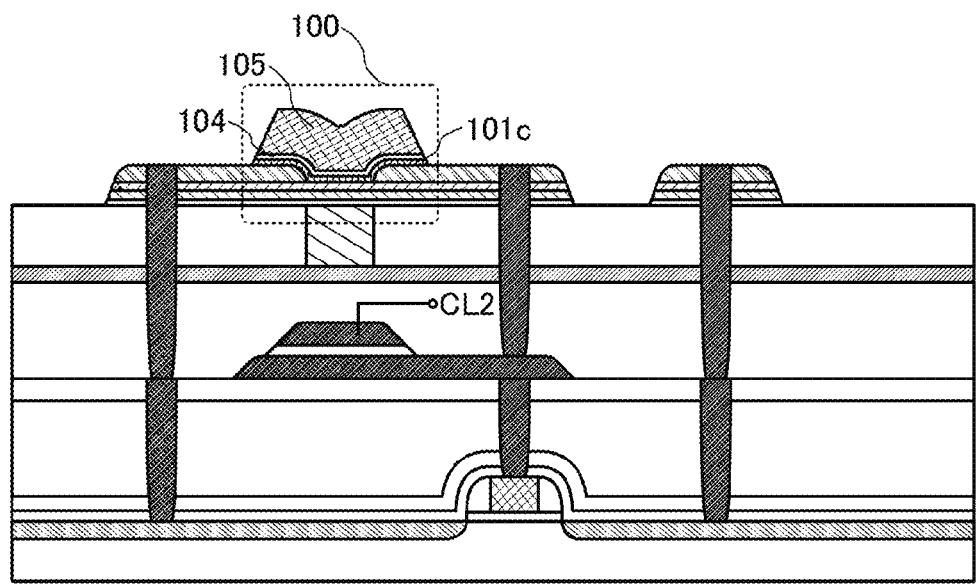
FIGS. 18A and 18B illustrate an example of a method for manufacturing the semiconductor device of an embodiment.
Figure 18B:
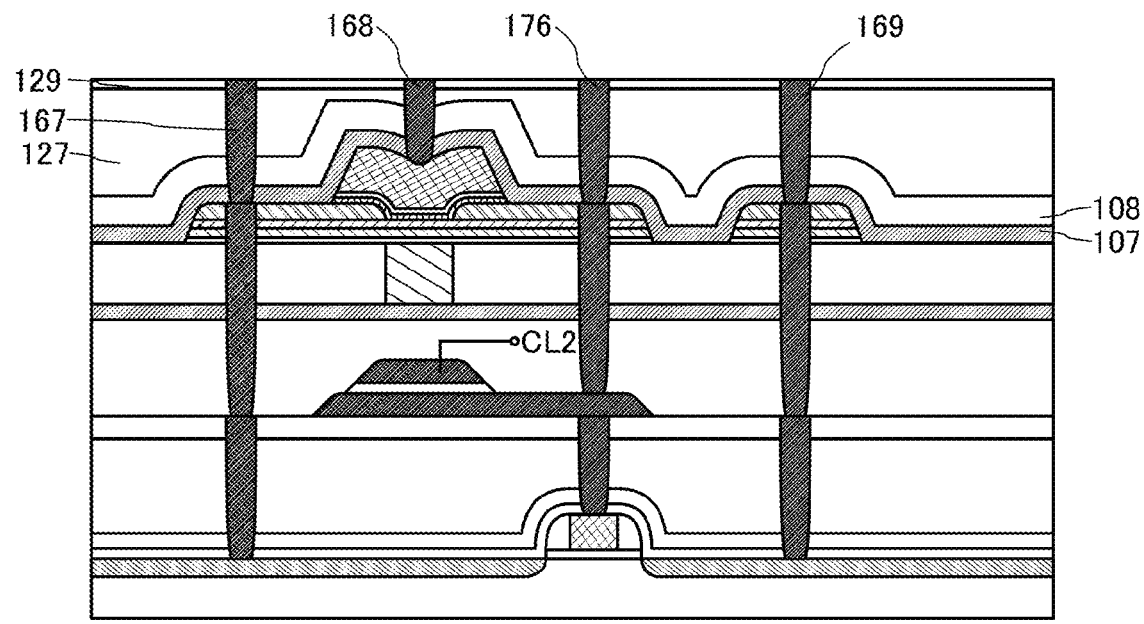
Figure 19A:
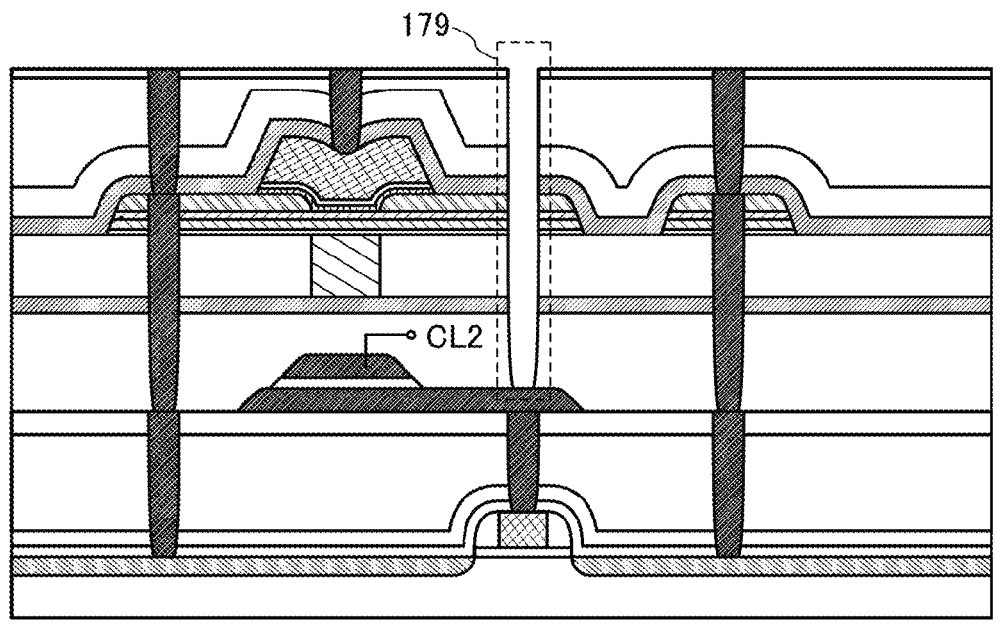
FIGS. 19A and 19B illustrate an example of a method for manufacturing the semiconductor device of an embodiment.
Figure 19B:
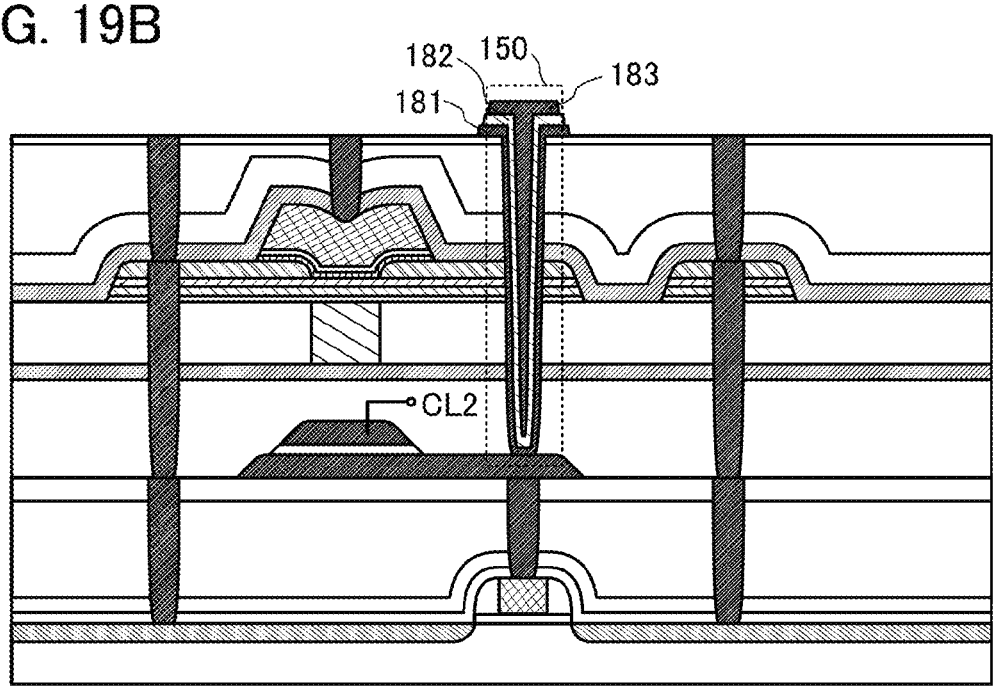

Next, the insulating film 108, the insulating film 127, and the insulating film 129 are formed in this order (FIG. 18B). The insulating films 108, 127, and 129 can be formed by, for example, a sputtering method, a CVD method (including a thermal CVD method, an MOCVD method, a PECVD method, an atmospheric pressure CVD (APCVD) method, and the like), an MBE method, an ALD method, or a PLD method. In particular, the insulating film 108 is preferably formed by a DC sputtering method, in which case a film with a high barrier property can be formed thick with high productivity. It is also preferable that the insulating film 108 be formed by an ALD method because ion damage can be reduced and good coverage can be achieved. In the case where the insulating film 127 is formed using an organic insulating material such as an organic resin, a coating method such as a spin coating method may be used. After the insulating film 127 is formed, a top surface thereof is preferably subjected to planarization treatment. It may be planarized through fluidization by heat treatment. In order to achieve higher planarity, after the insulating film 127 is formed, it is preferable that an insulating film be stacked by a CVD method and a top surface thereof be subjected to planarization treatment.

Next, by a method similar to that described above, openings are formed in the insulating film 129, the insulating film 127, the insulating film 108, and the insulating film 107, so that the plug 167 reaching the plug 164, the plug 168 reaching the gate electrode 105, and the plug 169 reaching the plug 166 are formed.

A resist mask for etching the plugs 176 and 165 is provided. The plugs 176 and 165 are etched, so that an opening 179 is obtained (see FIG. 19A).

The electrode 181 of the capacitor 150 is formed in the opening 179. An insulating film 182 is formed over the electrode 181. An electrode 183 is formed over the insulating film 182 (see FIG. 19B). Note that the material of the capacitor 130 can be used for the capacitor 150.

Next, the insulating film 128 is formed. Not that the description of the insulating film 127 can be referred to for the insulating film 128.

Next, by a method similar to that described above, openings are formed in the insulating film 128, and the plug 170 reaching the plug 167, the plug 171 reaching the plug 168, the plug 172 reaching the plug 169, and the plug 176 reaching the electrode 183 are formed.

Next, the electrode 173 electrically connected to the plug 170, the electrode 174 electrically connected to the plug 171, the electrode 175 electrically connected to the plug 172, and the electrode 177 electrically connected to the plug 176 are formed.

Furthermore, the electrodes 173, 174, 175, and 177 are electrically connected to the wirings BL, WL, SL, and CL3 respectively (see FIG. 16B). Note that the material of the wiring CL described in Embodiment 1 can be used for the wirings BL, WL, SL, and CL3 as well.

Through the above steps, the semiconductor device in one embodiment of the present invention can be manufactured.

Modification Example 4

Figure 20A:
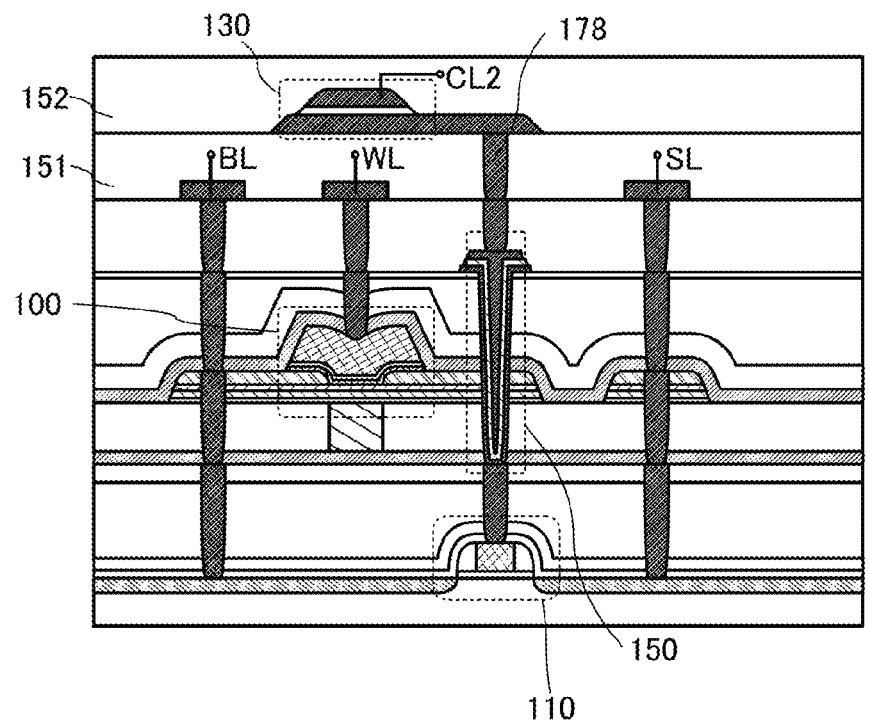
FIGS. 20A and 20B each illustrate a structure example of the semiconductor device of an embodiment.

FIG. 20A illustrates a modification example of this embodiment, in which the capacitor 130 is positioned above the second transistor 100. Specifically, the insulating film 151 is formed over the wirings BL, WL, and SL and the insulating film 128. Then, an opening is formed in the insulating film 151 to form a plug 178 therein which is electrically connected to the plug 176. The capacitor 130 electrically connected to the plug 178 is then formed. Then, the insulating film 152 covering the capacitor 130 is formed. Note that the capacitor 130 is electrically connected to the wiring CL2 and includes a region overlapping with the gate electrode 105.

Figure 20B:
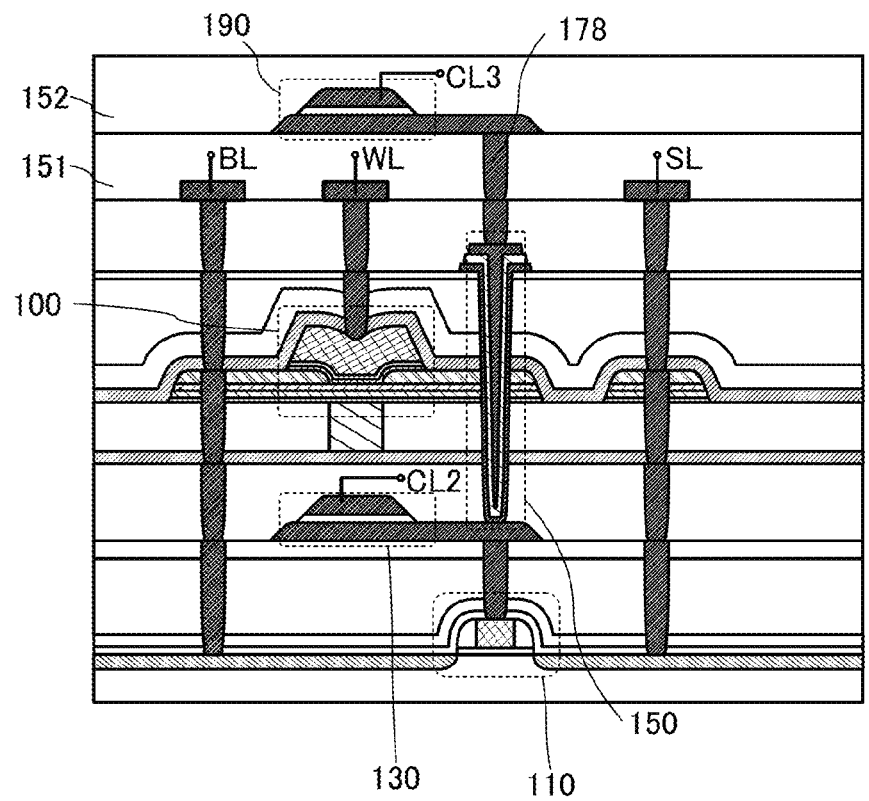
Figure 21:
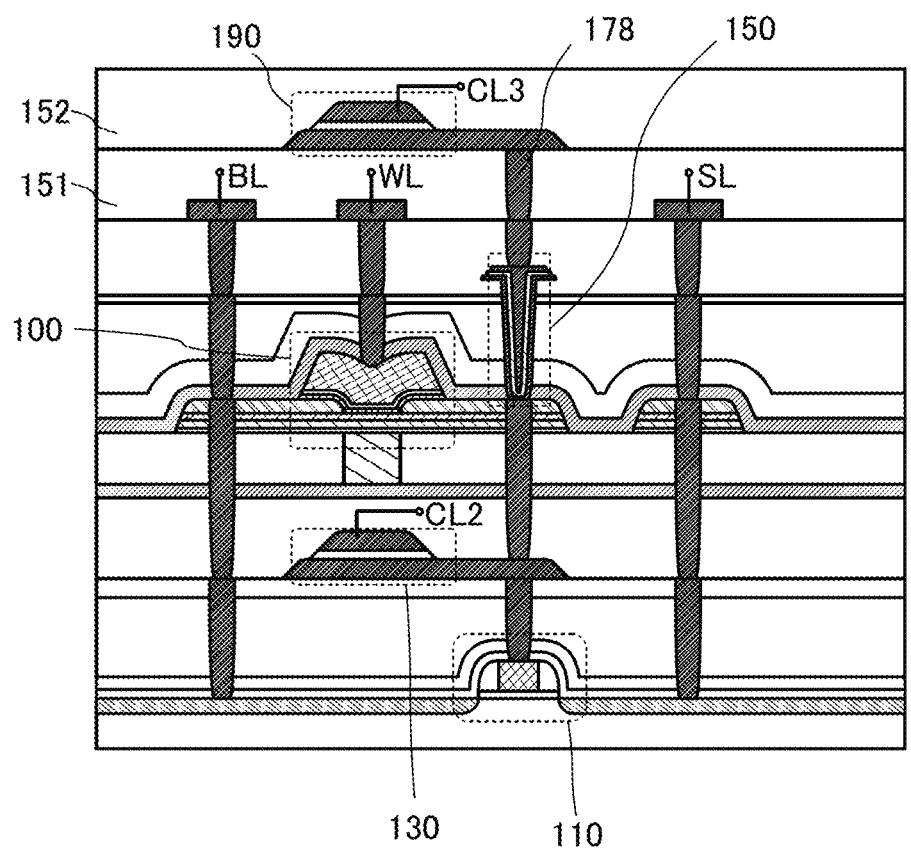
FIG. 21 illustrates a structure example of the semiconductor device of an embodiment.

FIG. 20B shows another example in which the capacitor 130 is positioned below the gate electrode 105 of the second transistor 100 and a capacitor 190 is positioned over the gate electrode 105. Note that the opening in which the capacitor 150 is formed may be deeper (see FIG. 20B) or shallower (see FIG. 21) than that in FIG. 20A.

Note that the capacitors 130 and 190 are parallel plate types capacitors; however, the shapes thereof are not limited this.

At least part of this embodiment can be implemented in combination with any of the embodiments described in this specification as appropriate.

Embodiment 3

An oxide semiconductor that can be favorably used for a semiconductor film of a semiconductor device of one embodiment of the present invention is described in this embodiment.

An oxide semiconductor has a wide energy gap of 3.0 eV or more. A transistor including an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor including silicon.

An applicable oxide semiconductor preferably contains at least indium (In) or zinc (Zn). In particular, In and Zn are preferably contained. In addition, as a stabilizer for reducing variation in electrical characteristics of the transistor including the oxide semiconductor, one or more selected from gallium (Ga), tin (Sn), hafnium (Hf), zirconium (Zr), titanium (Ti), scandium (Sc), yttrium (Y), and an lanthanoid (e.g., cerium (Ce), neodymium (Nd), and gadolinium (Gd)) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer.

For example, In—Ga—Zn-based oxide with an atomic ratio of In:Ga:Zn=1:1:1, 1:3:2, 1:3:4, 1:3:6, 3:1:2, or 2:1:3, or an oxide whose composition is in the neighborhood of the above compositions may be used.

If the oxide semiconductor film contains a large amount of hydrogen, the hydrogen and the oxide semiconductor are bonded to each other, so that part of the hydrogen serves as a donor and causes generation of an electron that is a carrier. As a result, the threshold voltage of the transistor shifts in the negative direction. It is thus preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. For that reason, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, so that the oxide semiconductor film can be an i-type (intrinsic) oxide semiconductor film or an oxide semiconductor film extremely close to an i-type oxide semiconductor (a substantially i-type oxide semiconductor). Note that "substantially intrinsic" means that the oxide semiconductor film includes extremely few (close to zero) carriers derived from a donor, and the carrier density thereof is lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

In this manner, the transistor including an i-type or substantially i-type oxide semiconductor film can have extremely favorable off-state current characteristics. For example, the drain current at the time when the transistor including an oxide semiconductor film is in an off-state at room temperature (approximately 25° C.) can be less than or equal to $1\times10^{-18}$ A, preferably less than or equal to $1\times10^{-21}$ A, and further preferably less than or equal to $1\times10^{-24}$ A; or at 85° C., less than or equal to $1\times10^{-15}$ A, preferably less than or equal to $1\times10^{-18}$ A, further preferably less than or equal to $1\times10^{-21}$ A. An off state of a transistor refers to a state where gate voltage is lower than the threshold voltage in an n-channel transistor. Specifically, the transistor is in an off state when the gate voltage is lower than the threshold voltage by 1 V or more, 2 V or more, or 3 V or more.

<Structure of Oxide Semiconductor>

A structure of an oxide semiconductor film is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is an oxide semiconductor having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 22A:
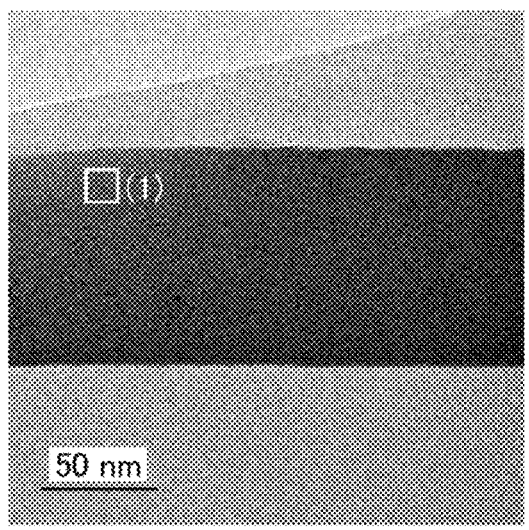
FIGS. 22A to 22D are Cs-corrected high-resolution TEM images of a cross section of a CAAC-OS and a cross-sectional schematic view of a CAAC-OS.

A CAAC-OS observed with TEM is described below. FIG. 22A shows a high-resolution TEM image of a cross section of the CAAC-OS observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 22B:
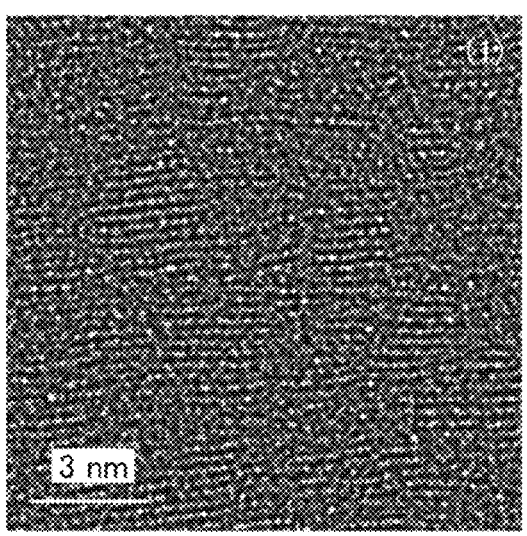

FIG. 22B is an enlarged Cs-corrected high-resolution TEM image of a region (1) in FIG. 22A. FIG. 22B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 22C:
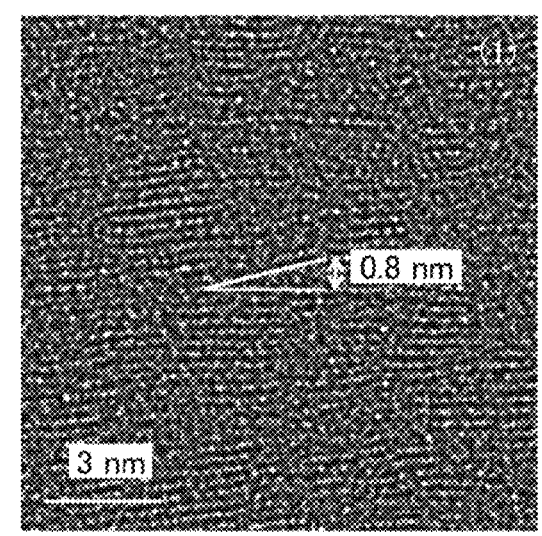

As shown in FIG. 22B, the CAAC-OS has a characteristic atomic arrangement. The characteristic atomic arrangement is denoted by an auxiliary line in FIG. 22C. FIGS. 22B and 22C prove that the size of a pellet is greater than or equal to 1 nm, or greater than or equal to 3 nm, and the size of a space caused by tilt of the pellets is approximately 0.8 nm. Therefore, the pellet can also be referred to as a nanocrystal (nc). A CAAC-OS can be referred to as an oxide semiconductor including c-axis aligned nanocrystals (CANC).

Figure 22D:
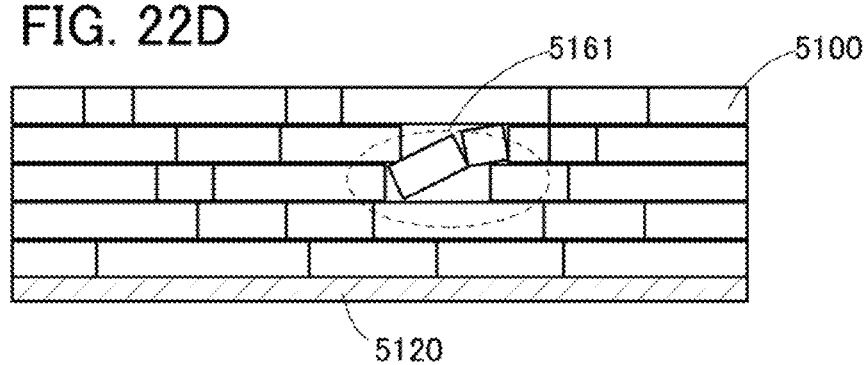

Here, according to the Cs-corrected high-resolution TEM images, the schematic arrangement of pellets 5100 of a CAAC-OS over a substrate 5120 is illustrated by such a structure in which bricks or blocks are stacked (see FIG. 22D). The part in which the pellets are tilted as observed in FIG. 22C corresponds to a region 5161 shown in FIG. 22D.

Figure 23A:
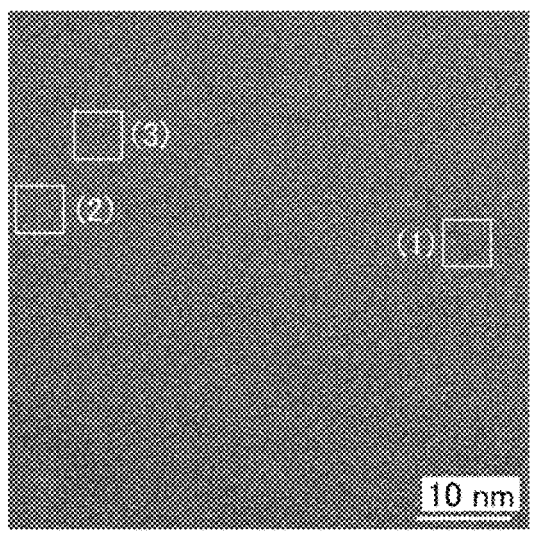
FIGS. 23A to 23D are Cs-corrected high-resolution TEM images of a plane of a CAAC-OS.
Figure 23B:
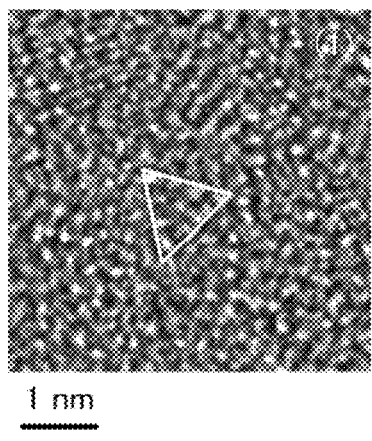
Figure 23C:
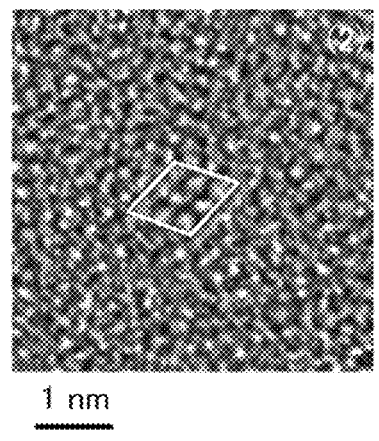
Figure 23D:
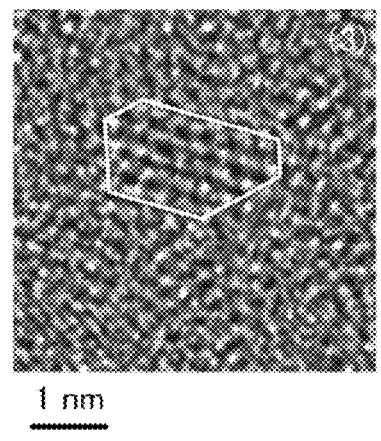

FIG. 23A shows a Cs-corrected high-resolution TEM image of a plane of the CAAC-OS observed from a direction substantially perpendicular to the sample surface. FIGS. 23B, 23C, and 23D are enlarged Cs-corrected high-resolution TEM images of regions (1), (2), and (3) in FIG. 23A, respectively. FIGS. 23B, 23C, and 23D indicate that metal atoms are arranged in a triangular, quadrangular, or hexagonal configuration in a pellet. However, there is no regularity of arrangement of metal atoms between different pellets.

Figure 24A:
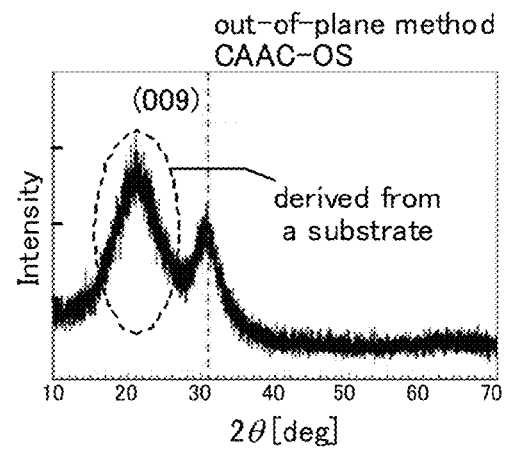
FIGS. 24A to 24C show structure analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 24A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 24B:
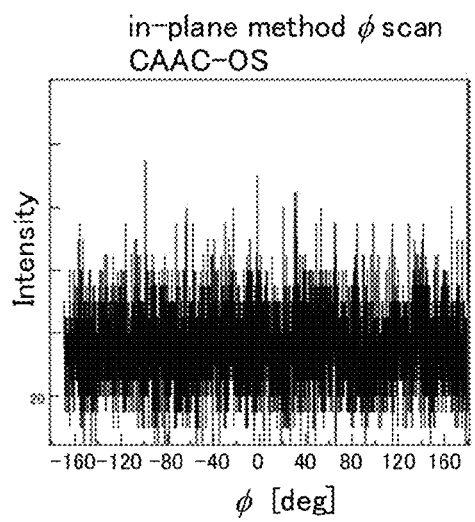
Figure 24C:
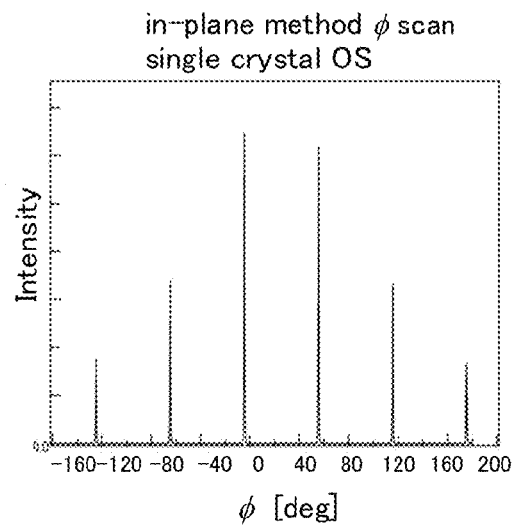

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 24B, a peak is not clearly observed. In contrast, in the case of a single crystal oxide semiconductor of InGaZnO$_4$, when φ scan is performed with 2θ fixed at around 56°, as shown in FIG. 24C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 25A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 25B shows a diffraction pattern obtained in such a manner that an electron beam with a probe diameter of 300 nm is incident on the same sample in a direction perpendicular to the sample surface. As shown in FIG. 25B, a ring-like diffraction pattern is observed. Thus, the electron diffraction also indicates that the a-axes and b-axes of the pellets included in the CAAC-OS do not have regular alignment. The first ring in FIG. 25B is considered to be derived from the (010) plane, the (100) plane, and the like of the InGaZnO$_4$ crystal. The second ring in FIG. 25B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part with a size greater than or equal to 10 nm and less than or equal to 100 nm is referred to as a microcrystalline oxide semiconductor in some cases. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS and an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots are shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS or an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 26:
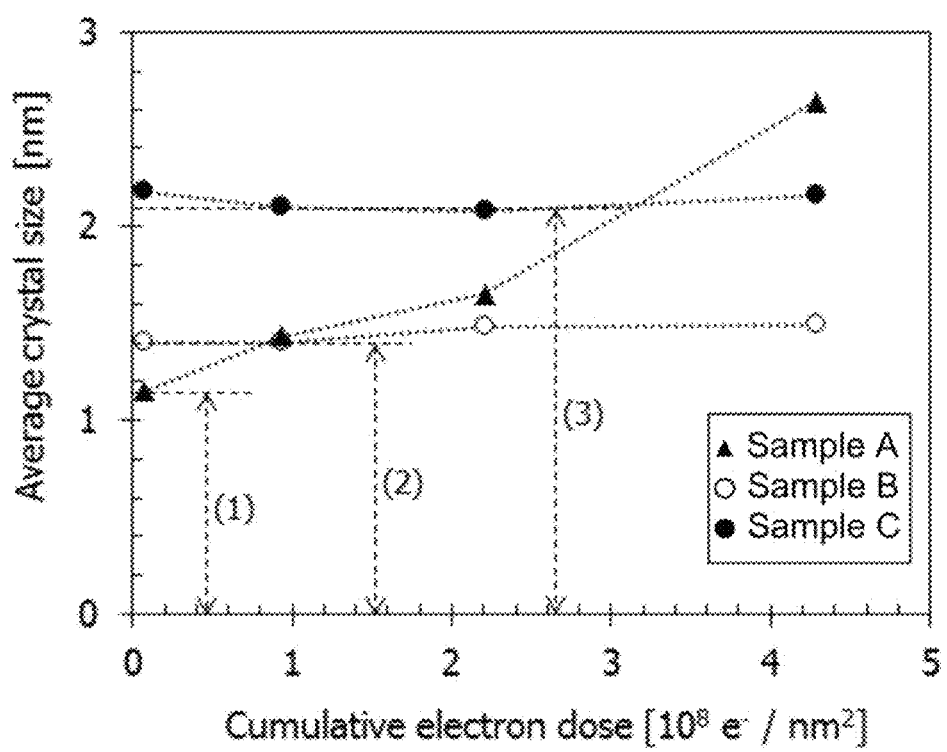
FIG. 26 shows a change of crystal parts of an In—Ga—Zn-based oxide owing to electron irradiation.

FIG. 26 shows change in the average size of crystal parts (at 22 points to 45 points) in each sample. Note that the crystal part size corresponds to the length of a lattice fringe. FIG. 26 indicates that the crystal part size in the a-like OS increases with an increase in the cumulative electron dose. Specifically, as shown by (1) in FIG. 26, a crystal part of approximately 1.2 nm (also referred to as an initial nucleus) at the start of TEM observation grows to a size of approximately 2.6 nm at a cumulative electron dose of 4.2×10$^8$ e$^-$/nm$^2$. In contrast, the crystal part size in the nc-OS and the CAAC-OS shows little change from the start of electron irradiation to a cumulative electron dose of 4.2×10$^8$ e$^-$/nm$^2$. Specifically, as shown by (2) and (3) in FIG. 26, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate the density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

At least part of this embodiment can be implemented in combination with any of the embodiments described in this specification as appropriate.

Embodiment 4

In this embodiment, an example of a circuit including the transistor of one embodiment of the present invention is described with reference to drawings.

[Circuit Configuration Example]

When a connection between transistors, wirings, or electrodes is changed from that described in Embodiment 1, a variety of circuits can be formed. Examples of circuit configurations that can be achieved by using a semiconductor device of one embodiment of the present invention are shown below.

[CMOS Circuit]

Figures 27A, 27B:
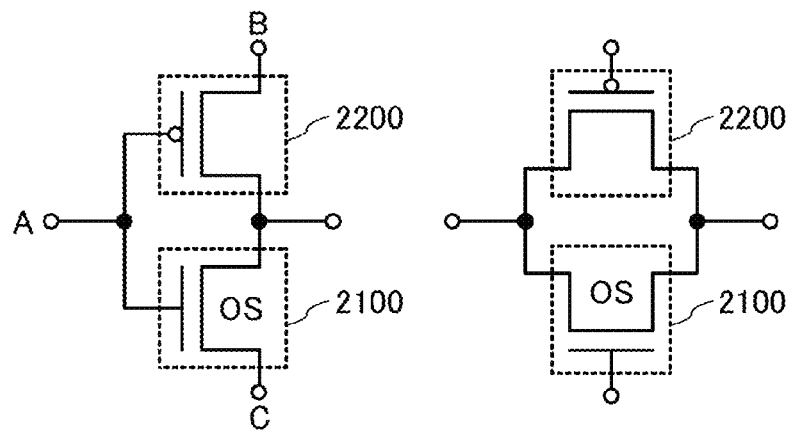
FIGS. 27A to 27D are circuit diagrams according to an embodiment.

A circuit diagram in FIG. 27A shows a configuration of a so-called CMOS circuit in which a p-channel transistor 2200 and an n-channel transistor 2100 are connected to each other in series and in which gates of them are connected to each other. Note that transistors in which a second semiconductor material is used are denoted by "OS" in drawings.

[Analog Switch]

A circuit diagram in FIG. 27B shows a configuration in which sources of the transistors 2100 and 2200 are connected to each other and drains of the transistors 2100 and 2200 are connected to each other. With such a configuration, the transistors can function as a so-called analog switch.

[Example of Memory Device]

Figure 27C:
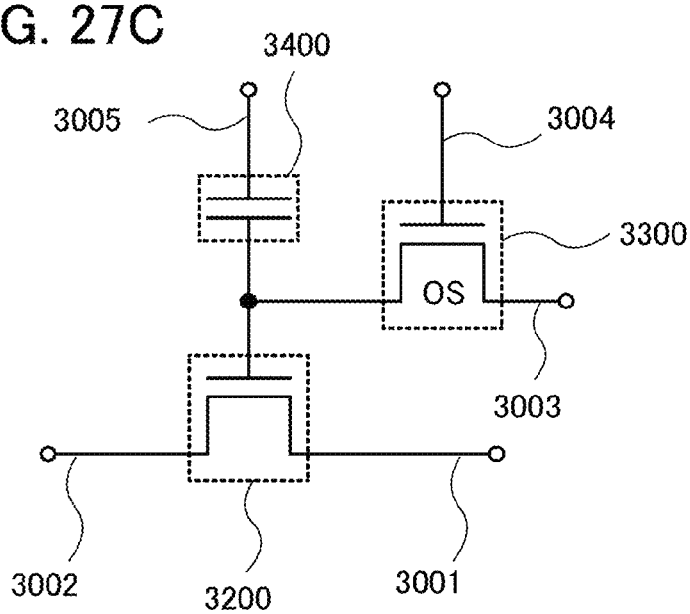

An example of a semiconductor device (memory device) that includes the transistor of one embodiment of the present invention, can retain stored data even when not powered, and has an unlimited number of write cycles is shown in FIG. 27C.

The semiconductor device illustrated in FIG. 27C includes a transistor 3200 using a first semiconductor material, a transistor 3300 using a second semiconductor material, and a capacitor 3400. Note that any of the transistors described in the above embodiments can be used as the transistor 3300.

The transistor 3300 is a transistor in which a channel is formed in a semiconductor film including an oxide semiconductor. Since the off-state current of the transistor 3300 is small, stored data can be retained for a long period. In other words, power consumption can be sufficiently reduced because a semiconductor memory device in which refresh operation is unnecessary or the frequency of refresh operation is extremely low can be provided.

In FIG. 27C, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to the gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 27C has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is retained (retaining).

Since the off-state current of the transistor 3300 is extremely small, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 that is needed to turn on the transistor 3200. Thus, the potential of the fifth wiring 3005 is set to a potential $V_0$ that is between $V_{th\_H}$ and $V_{th\_L}$, whereby charge supplied to the gate electrode of the transistor 3200 can be determined For example, in the case where the high-level charge is supplied to the gate electrode of the transistor 3200 in writing and the potential of the fifth wiring 3005 is $V_0$ ($>V_{th\_H}$), the transistor 3200 is turned on. In the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, only data of desired memory cells need to be read. The fifth wiring 3005 in the case where data is not read may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

Figure 28:
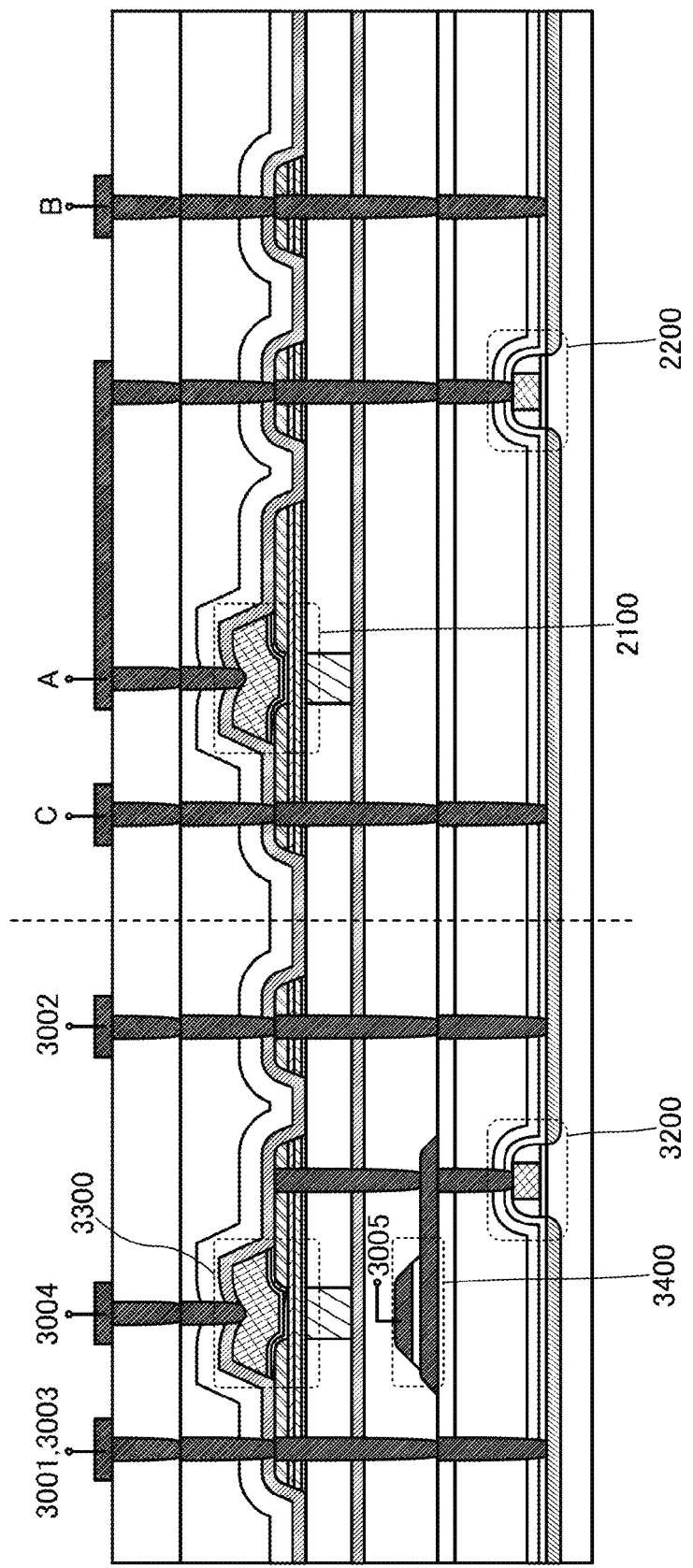
FIG. 28 illustrates an example of a schematic cross-sectional diagram of the circuit diagrams of FIGS. 27A to 27D.

Note that FIG. 28 illustrates a schematic cross-sectional view of the circuit diagram in FIG. 27A and a schematic cross-sectional view of a structure in which the wiring 3001 and the wiring 3003 in FIG. 27C (the circuit diagram of FIG. 1A) are unified. Note that the schematic cross-sectional view of FIG. 27A is illustrated on the left side of the dotted line, and the schematic cross-sectional view of the circuit diagram in FIG. 1A is illustrated on the right side of the dotted line.

As illustrated in the diagram, the transistor 3300 is laminated over the transistor 3200; thus, the area occupied by the elements can be decreased. Furthermore, the capacitor 3400 is located below the transistor 3300; thus, the area occupied by the elements can be decreased. Moreover, the wiring 3005 and the gate electrode of the transistor 3300 overlap with each other; thus, the area occupied by the elements can be further decreased.

Figure 29:
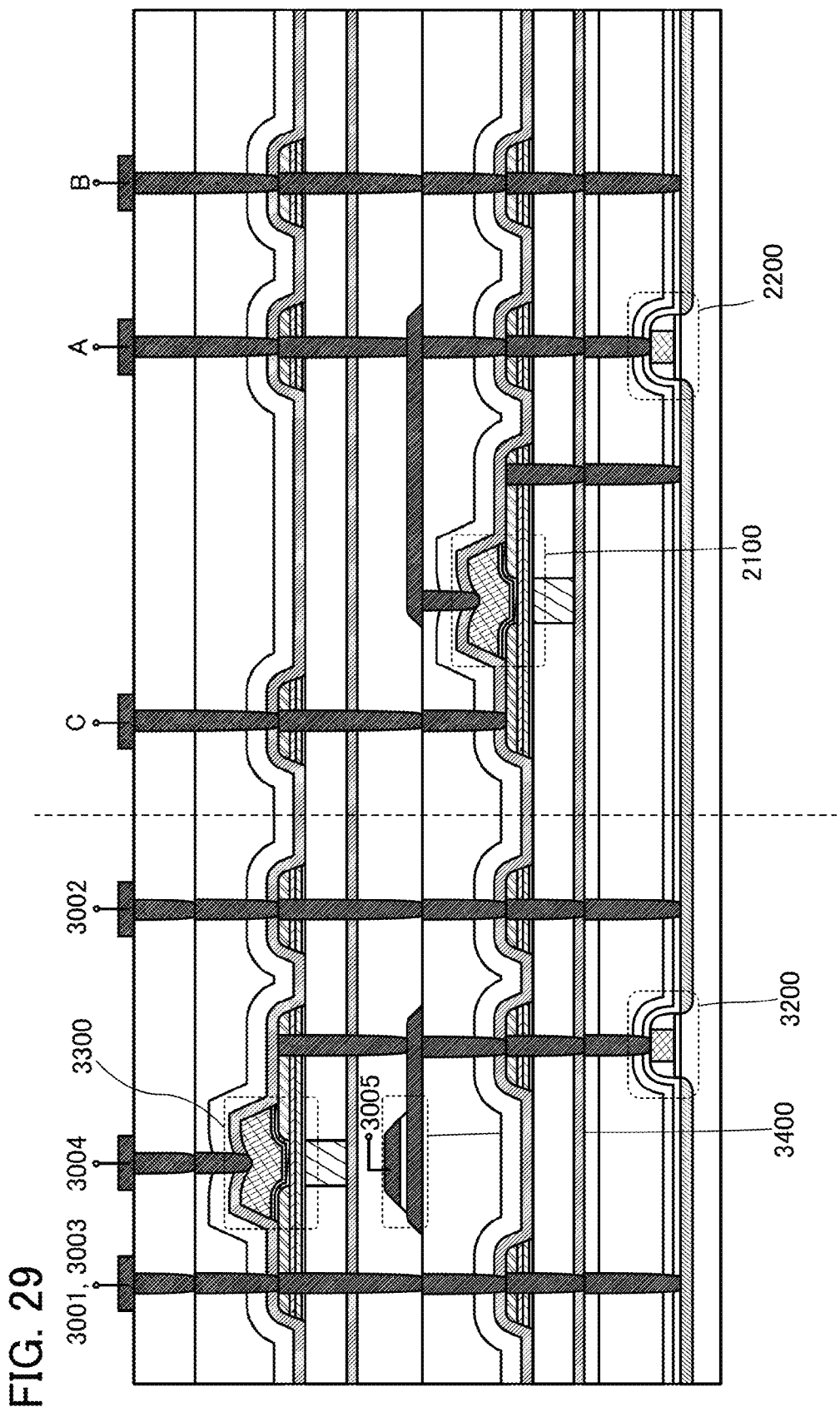
FIG. 29 illustrates an example of a schematic cross-sectional diagram of the circuit diagrams of FIGS. 27A to 27D.

The transistor 3300 and the transistor 2100 may be formed in different steps as illustrated in FIG. 29.

Figure 27D:
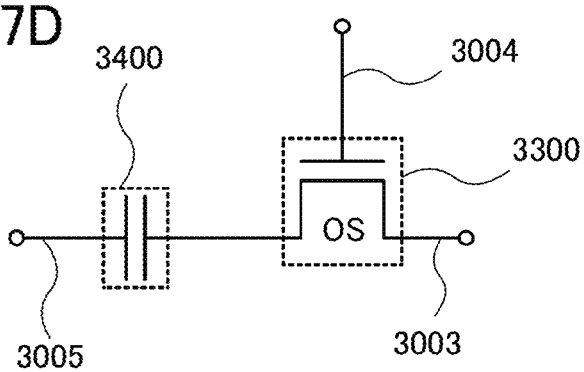

The semiconductor device illustrated in FIG. 27D is mainly different from the semiconductor device illustrated in FIG. 27C in that the transistor 3200 is not provided. Also in this case, writing and retaining operation of data can be performed in a manner similar to that of the semiconductor device illustrated in FIG. 27C.

Next, reading of data is described. When the transistor 3300 is turned on, the third wiring 3003 in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the first terminal of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the first terminal of the capacitor 3400, C is the capacitance of the capacitor 3400, GB is the capacitance component of the third wiring 3003, and $V_{B0}$ is the potential of the third wiring 3003 before the charge redistribution. Thus, it can be found that, assuming that the memory cell is in either of two states in which the potential of the first terminal of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(G_B + C)$) is higher than the potential of the third wiring 3003 in the case of retaining the potential $V_0 (=(C_B \times V_{B0} + C \times V_0)/(C_B + C))$.

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor that has a channel formation region including an oxide semiconductor and has an extremely small off-state current, the semiconductor device described in this embodiment can retain stored data for an extremely long period. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating layer is not caused. That is, the semiconductor device of the disclosed invention does not have a limit on the number of times of data rewriting, which is a problem of a conventional nonvolatile memory, and the reliability thereof is drastically improved. Furthermore, data is written depending on the state of the transistor (on or off), whereby high-speed operation can be easily achieved.

At least part of this embodiment can be implemented in combination with any of the other embodiments described in this specification as appropriate.

Embodiment 5

Figure 30:
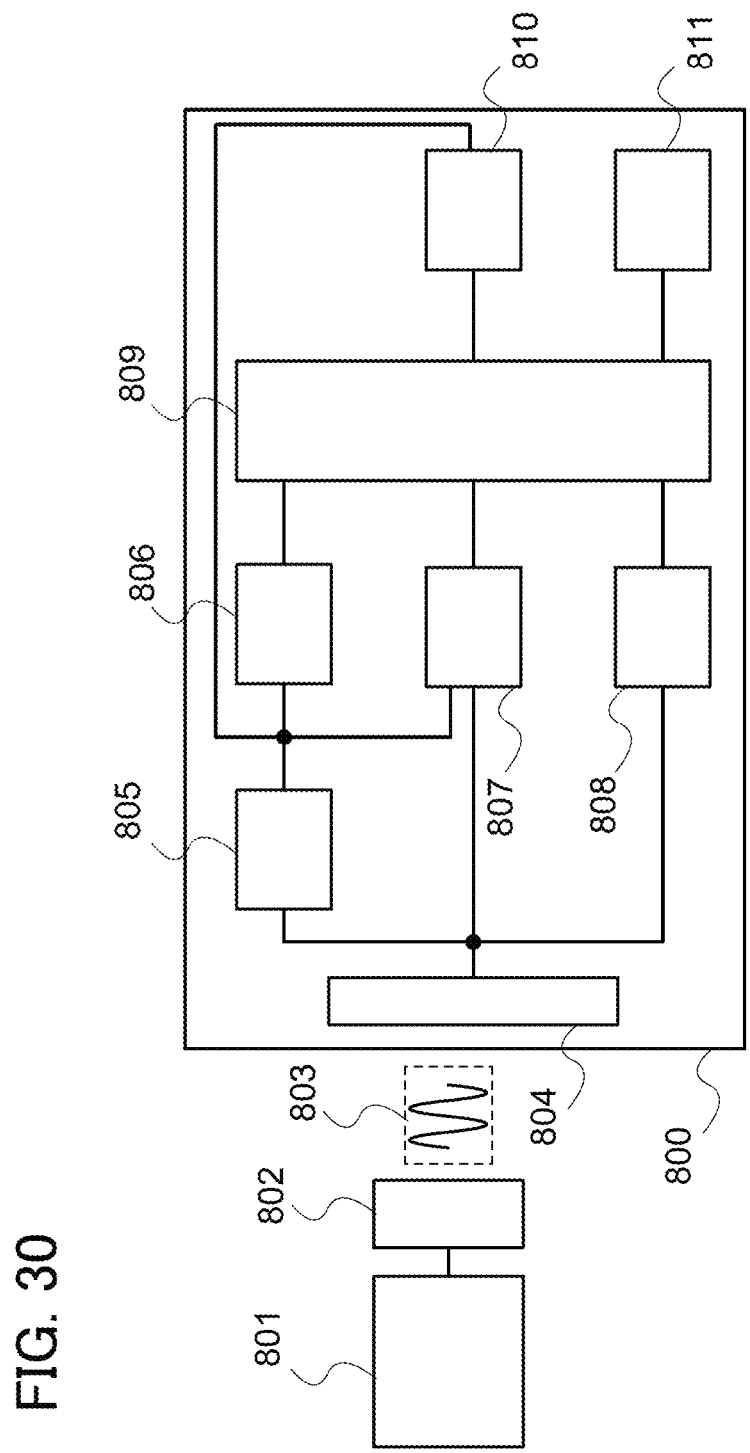
FIG. 30 illustrates a configuration example of an RF tag of an embodiment.

In this embodiment, an RF tag that includes the transistor or memory device described in any of the above embodiments is described with reference to FIG. 30.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag is described with reference to FIG. 30. FIG. 30 is a block diagram illustrating a configuration example of an RF tag As shown in FIG. 30, an RF tag 800 includes an antenna 804 that receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material that enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, a configuration of each circuit is described. The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. The modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RF tag. In addition, the memory circuit of one embodiment of the present invention needs much lower power (voltage) for data writing than a conventional nonvolatile memory; thus, it is possible to prevent a difference between the maximum communication range in data reading and that in data writing. Furthermore, it is possible to suppress malfunction or incorrect writing that is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment of products, identification numbers can be put only to good products to be shipped without putting them to all the manufactured RF tags. Thus, the identification numbers of the shipped products are in series and customer management corresponding to the shipped products is easily performed.

At least part of this embodiment can be implemented in combination with any of the other embodiments described in this specification as appropriate.

Embodiment 6

In this embodiment, a CPU in which at least the transistor described in any of the above embodiments can be used and the memory device described in the above embodiment is included is described.

Figure 31:
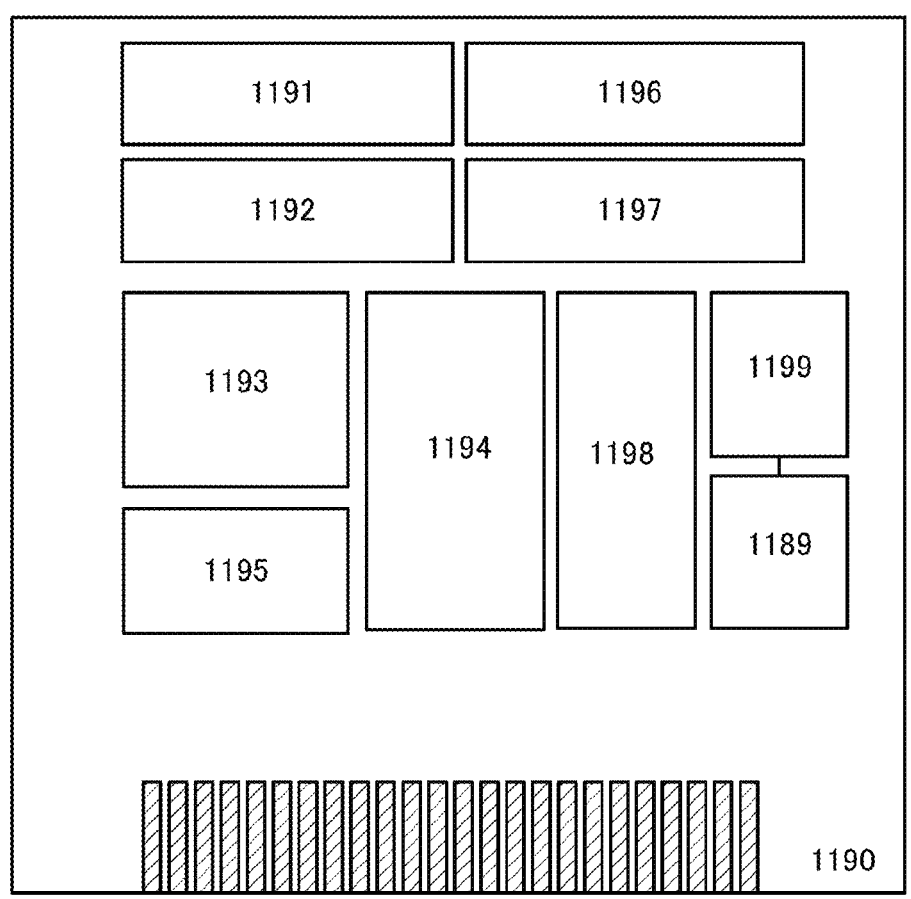
FIG. 31 illustrates a configuration example of a CPU of an embodiment.

FIG. 31 is a block diagram illustrating a configuration example of a CPU at least partly including any of the transistors described in the above embodiments.

The CPU illustrated in FIG. 31 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 31 is just an example with a simplified configuration, and an actual CPU may have a variety of configurations depending on the application. For example, the CPU may have the following configuration: a structure including the CPU illustrated in FIG. 31 or an arithmetic circuit is considered as one core; a plurality of the cores are included; and the cores operate in parallel to each other. The number of bits that the CPU can process in an internal arithmetic circuit or in a data bus can be, for example, 8, 16, 32, or 64.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 31, a memory cell is provided in the register 1196. For the memory cell of the register 1196, any of the transistors described in the above embodiments can be used.

In the CPU illustrated in FIG. 31, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 32:
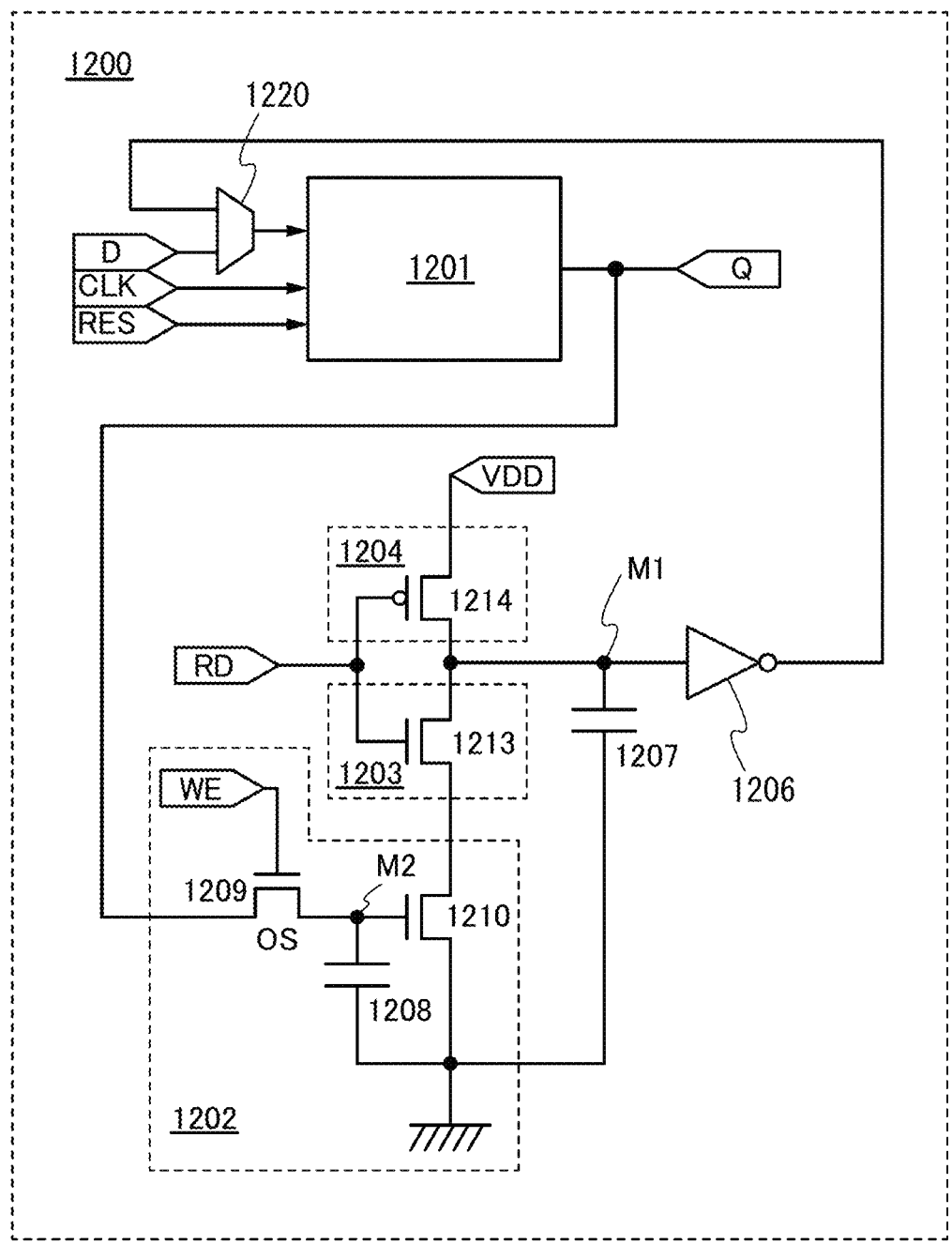
FIG. 32 is a circuit diagram of a memory element of an embodiment.

FIG. 32 is an example of a circuit diagram of a memory element that can be used for the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring that can supply a low power supply potential (e.g., a GND line). The other of the pair of electrodes of the capacitor 1208 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1208 is electrically connected to the wiring that can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 32 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 32, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 32, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor film can be used for all the transistors in the memory element 1200. Further alternatively, in the memory element 1200, a transistor in which a channel is formed in an oxide semiconductor film can be included besides the transistor 1209, and a transistor in which a channel is formed in a layer or the substrate 1190 including a semiconductor other than an oxide semiconductor can be used for the reset of the transistors.

As the circuit 1201 in FIG. 32, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 that is provided in the circuit 1202.

The off-state current of a transistor in which a channel is formed in an oxide semiconductor film is extremely small. For example, the off-state current of a transistor in which a channel is formed in an oxide semiconductor film is significantly smaller than that of a transistor in which a channel is formed in silicon having crystallinity. Thus, when the transistor is used as the transistor 1209, a signal retained in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Thus, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 changes to some degree.

By using the above-described memory element 1200 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency (RF) device.

At least part of this embodiment can be implemented in combination with any of the embodiments described in this specification as appropriate.

Embodiment 7

In this embodiment, a structure example of a display panel of one embodiment of the present invention is described.
[Structure Example]

Figure 33A:
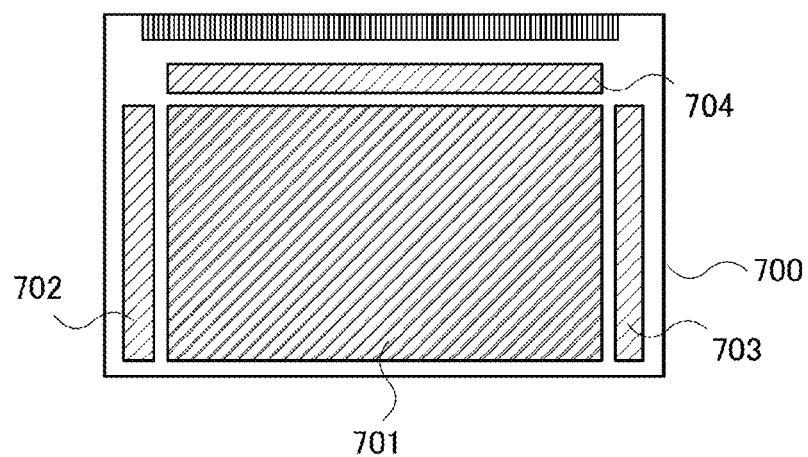
FIGS. 33A to 33C are circuit diagrams of a display device of an embodiment.
Figure 33B:
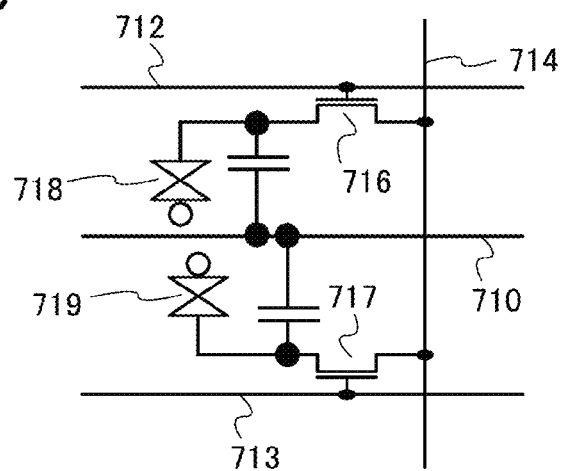
Figure 33C:
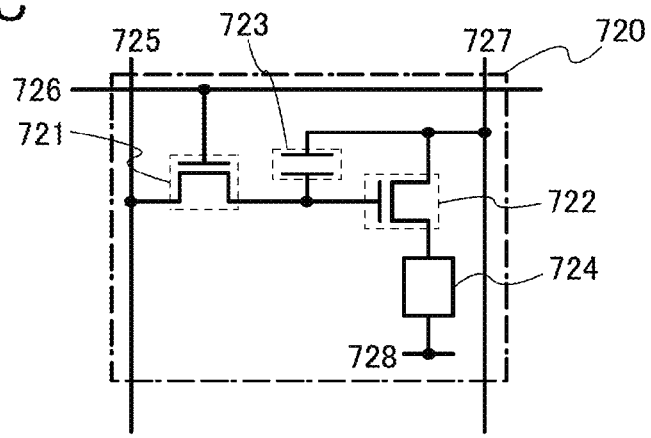

FIG. 33A is a top view of the display panel of one embodiment of the present invention. FIG. 33B is a circuit diagram illustrating a pixel circuit that can be used in the case where a liquid crystal element is used in a pixel in the display panel of one embodiment of the present invention. FIG. 33C is a circuit diagram illustrating a pixel circuit that can be used in the case where an organic EL element is used in a pixel in the display panel of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 33A illustrates an example of a block diagram of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels that include display elements are provided in a matrix in regions where the scan lines and the signal lines intersect with each other. The substrate 700 of the display device is connected to a timing control circuit (also referred to as a controller or a controller IC) through a connection portion such as a flexible printed circuit (FPC).

In FIG. 33A, the first scan line driver circuit 702, the second scan line driver circuit 703, and the signal line driver circuit 704 are formed over the substrate 700 where the pixel portion 701 is formed. Consequently, the number of components provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid Crystal Panel]

FIG. 33B illustrates an example of a circuit configuration of the pixel. Here, a pixel circuit that can be used in a pixel of a VA liquid crystal display panel is illustrated.

This pixel circuit can be applied to a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 712 of a transistor 716 and a gate wiring 713 of a transistor 717 are separated so that different gate signals can be supplied thereto. In contrast, a source or drain electrode 714 that functions as a data line is shared by the transistors 716 and 717. The transistor described in any of the above embodiments can be used as appropriate as each of the transistors 716 and 717. Thus, a highly reliable liquid crystal display panel can be provided.

A first pixel electrode is electrically connected to the transistor 716 and a second pixel electrode is electrically connected to the transistor 717. The first pixel electrode and the second pixel electrode are separated. Shapes of the first pixel electrode and the second pixel electrode are not especially limited. For example, the first pixel electrode may have a V-like shape.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

In addition, a storage capacitor may be formed using a capacitor wiring 710, a gate insulating film functioning as a dielectric, and a capacitor electrode electrically connected to the first pixel electrode or the second pixel electrode.

The multi-domain pixel includes a first liquid crystal element 718 and a second liquid crystal element 719. The first liquid crystal element 718 includes the first pixel electrode, a counter electrode, and a liquid crystal layer therebetween. The second liquid crystal element 719 includes the second pixel electrode, a counter electrode, and a liquid crystal layer therebetween.

Note that a pixel circuit of the present invention is not limited to that shown in FIG. 33B. For example, a switch, a resistor, a capacitor, a transistor, a sensor, a logic circuit, or the like may be added to the pixel shown in FIG. 33B.

[Organic EL Panel]

FIG. 33C shows another example of a circuit configuration of the pixel. Here, a pixel structure of a display panel using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. On the basis of such a mechanism, this light-emitting element is referred to as a current-excitation light-emitting element.

FIG. 33C shows an example of a pixel circuit that can be used. In this example, one pixel includes two n-channel transistors. Note that a metal oxide film of one embodiment of the present invention can be used for channel formation regions of the n-channel transistors. Digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode of the switching transistor 721 is connected to a scan line 726, a first electrode (one of a source electrode and a drain electrode) of the switching transistor 721 is connected to a signal line 725, and a second electrode (the other of the source electrode and the drain electrode) of the switching transistor 721 is connected to a gate electrode of the driver transistor 722. The gate electrode of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line provided over the same substrate.

As the switching transistor 721 and the driver transistor 722, the transistor described in any of the above embodiments can be used as appropriate. In this manner, a highly reliable organic EL display panel can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0 V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode of the driver transistor 722. Note that voltage higher than or equal to the sum of power supply line voltage and the threshold voltage $V_{th}$ of the driver transistor 722 is applied to the signal line 725.

In the case of performing analog grayscale driving, voltage greater than or equal to the sum of the forward voltage of the light-emitting element 724 and the threshold voltage $V_{th}$ of the driver transistor 722 is applied to the gate electrode of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit is not limited to that shown in FIG. 33C. For example, a switch, a resistor, a capacitor, a sensor, a transistor, a logic circuit, or the like may be added to the pixel circuit shown in FIG. 33C.

In the case where the transistor described in the above embodiments is used for the circuit shown in FIGS. 33A to 33C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

At least part of this embodiment can be implemented in combination with any of the other embodiments described in this specification as appropriate.

Embodiment 8

The semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images. Other examples of electronic devices that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 34A to 34F illustrate specific examples of these electronic devices.

Figure 34A:
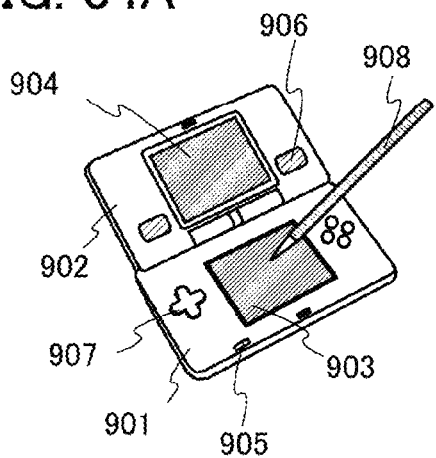
FIGS. 34A to 34F illustrate electronic devices of an embodiment.

FIG. 34A illustrates a portable game machine, which includes a housing 901, a housing 902, a display portion 903, a display portion 904, a microphone 905, a speaker 906, an operation key 907, a stylus 908, and the like. Although the portable game machine in FIG. 31A has the two display portions 903 and 904, the number of display portions included in a portable game machine is not limited to this.

Figure 34B:
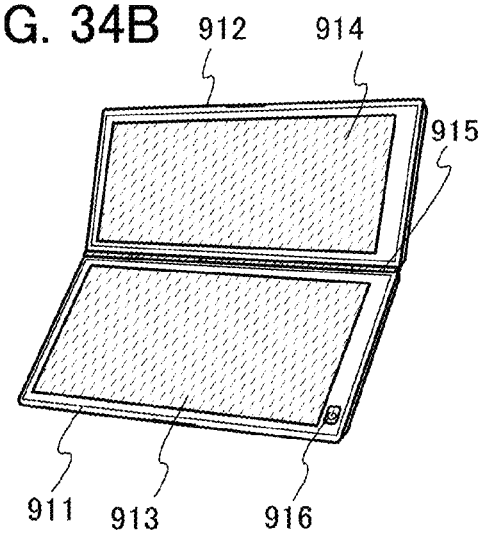

FIG. 34B illustrates a portable data terminal, which includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. Images displayed on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 34C:
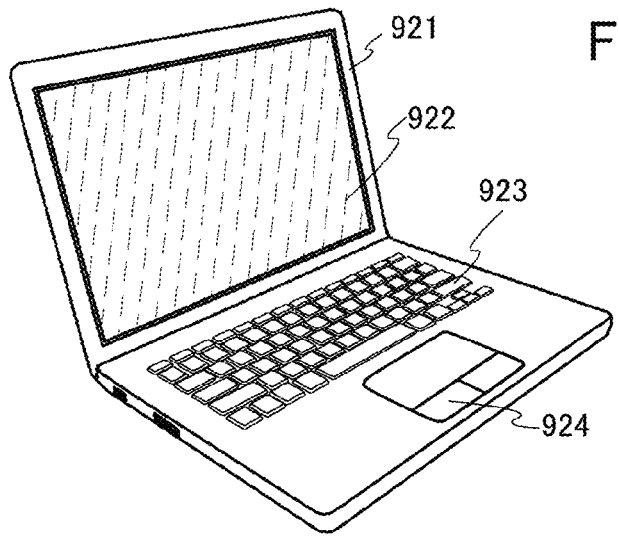

FIG. 34C illustrates a laptop personal computer, which includes a housing 921, a display portion 922, a keyboard 923, a pointing device 924, and so on.

Figure 34D:
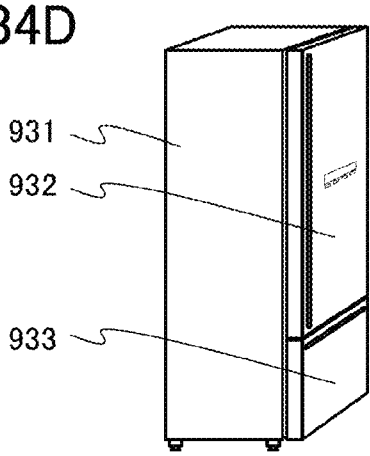

FIG. 34D illustrates an electric refrigerator-freezer, which includes a housing 931, a refrigerator door 932, a freezer door 933, and others.

Figure 34E:
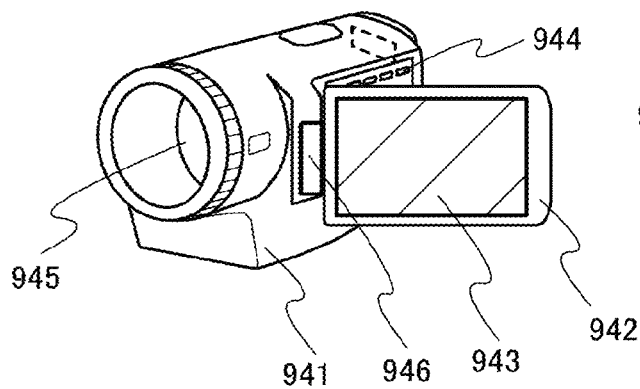

FIG. 34E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 34F:
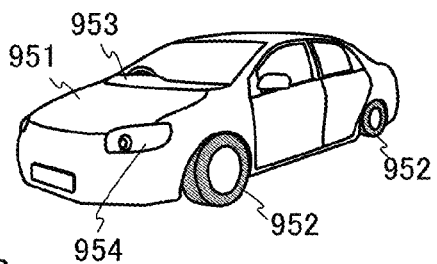
Figure 35A:
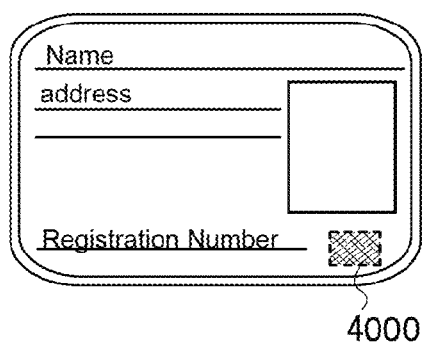
FIGS. 35A to 35F illustrate application examples of an RF device of an embodiment.
Figure 35B:
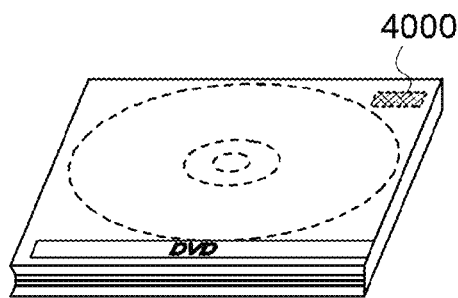
Figure 35C:
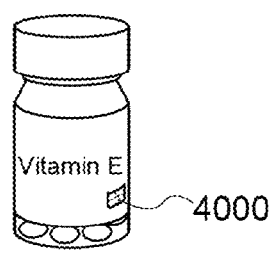
Figure 35D:
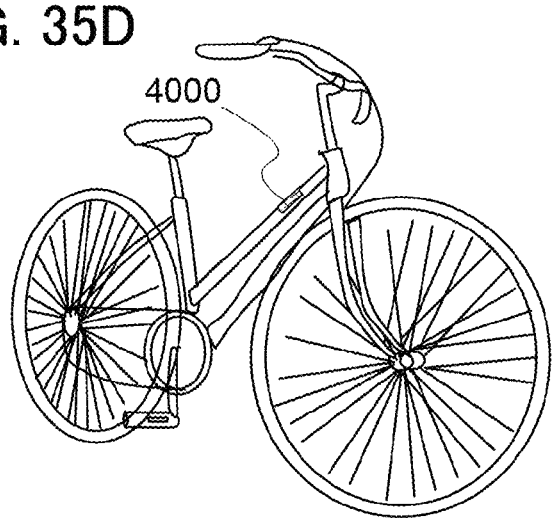
Figure 35E:
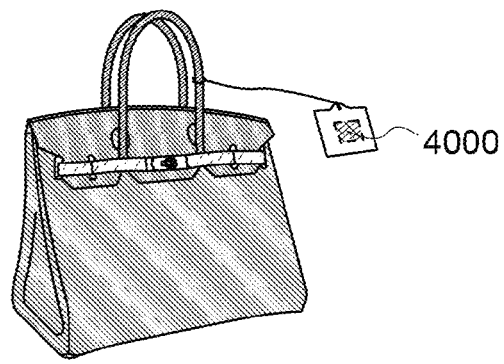
Figure 35F:
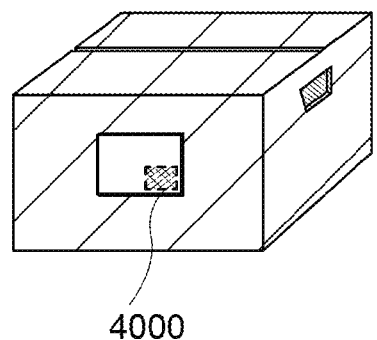

FIG. 34F illustrates a passenger car, which includes a car body 951, wheels 952, a dashboard 953, lights 954, and so on.

At least part of this embodiment can be implemented in combination with any of the other embodiments described in this specification as appropriate.

Embodiment 9

In this embodiment, application examples of an RF device of one embodiment of the present invention will be described with reference to FIGS. 35A to 35F. The RF device is widely used and can be provided for, for example, products such as bills, coins, securities, bearer bonds, documents (e.g., driver's licenses or residence cards, see FIG. 35A), recording media (e.g., DVD software or video tapes, see FIG. 35B), packaging containers (e.g., wrapping paper or bottles, see FIG. 35C), vehicles (e.g., bicycles, see FIG. 35D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 35E and 35F).

An RF device 4000 of one embodiment of the present invention is fixed to a product by being attached to a surface thereof or embedded therein. For example, the RF device 4000 is fixed to each product by being embedded in paper of a book, or embedded in an organic resin of a package. Since the RF device 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF device 4000 of one embodiment of the present invention, and the identification function can be utilized to prevent counterfeiting. Moreover, the efficiency of a system such as an inspection system can be improved by providing the RF device of one embodiment of the present invention for packaging containers, recording media, personal belongings, foods, clothing, household goods, electronic appliances, or the like. Vehicles can also have higher security against theft or the like by being provided with the RF device of one embodiment of the present invention.

As described above, by using the RF device of one embodiment of the present invention for each application described in this embodiment, power for operation such as writing or reading of data can be reduced, which results in an increase in the maximum communication distance. Moreover, data can be retained for an extremely long period even in the state where power is not supplied; thus, the RF device can be preferably used for application in which data is not frequently written or read.

At least part of this embodiment can be implemented in combination with any of the other embodiments described in this specification as appropriate.

This application is based on Japanese Patent Application serial no. 2014-044473 filed with Japan Patent Office on Mar. 7, 2014 and Japanese Patent Application serial no. 2014-048727 filed with Japan Patent Office on Mar. 12, 2014, the entire contents of which are hereby incorporated by reference.

What is claimed is:

1. A semiconductor device comprising:
a first transistor;
a second transistor overlapping with the first transistor;
a first capacitor overlapping with the second transistor; and
a first wiring electrically connected to the first capacitor,
wherein the first wiring and an electrode of the second transistor overlap each other;
wherein the first transistor, the second transistor and the first capacitor are electrically connected to each other,
wherein a channel of the first transistor comprises a single crystal semiconductor, and
wherein a channel of the second transistor comprises an oxide semiconductor.

2. The semiconductor device according to claim 1, wherein the first capacitor is positioned between the first transistor and the second transistor.

3. The semiconductor device according to claim 1, wherein the first capacitor is positioned over the second transistor.

4. The semiconductor device according to claim 1, wherein the electrode of the second transistor is a gate electrode.

5. The semiconductor device according to claim 1,
wherein the first wiring is a common wiring, and
wherein the first wiring comprises copper.

6. The semiconductor device according to claim 1,
wherein the first transistor is electrically connected to the second transistor with a plug, and
wherein the plug comprises copper or tungsten.

7. The semiconductor device according to claim 1, further comprising a second capacitor between the first transistor and the second transistor,
wherein the second capacitor is electrically connected to each of the first transistor, the second transistor and the first capacitor.

8. The semiconductor device according to claim 7, further comprising a second wiring electrically connected to the second capacitor,
wherein the second wiring and an electrode of the first transistor overlap each other.

9. The semiconductor device according to claim 8,
wherein the second wiring is a common wiring, and
wherein the second wiring comprises copper.

10. A semiconductor device comprising:
a first transistor;
a second transistor overlapping with the first transistor;
a capacitor overlapping with the second transistor; and
a first wiring electrically connected to the capacitor,
wherein the first wiring and an electrode of the second transistor overlap each other;
wherein a channel of the first transistor comprises a single crystal semiconductor,
wherein a channel of the second transistor comprises an oxide semiconductor,
wherein the first transistor, the second transistor and the capacitor are electrically connected to each other,
wherein one electrode of the capacitor comprises a projected portion, and
wherein the other electrode of the capacitor comprises a depressed portion.

11. The semiconductor device according to claim 10, wherein the capacitor is positioned between the first transistor and the second transistor.

12. The semiconductor device according to claim 10, wherein the capacitor is positioned over the second transistor.

13. The semiconductor device according to claim 10, wherein the electrode of the second transistor is a gate electrode.

14. The semiconductor device according to claim 10,
wherein the first wiring is a common wiring, and
wherein the first wiring comprises copper.

15. The semiconductor device according to claim 10,
wherein the first transistor is electrically connected to the second transistor with a plug, and
wherein the plug comprises copper or tungsten.

16. A semiconductor device comprising:
a first transistor;
a second transistor overlapping with the first transistor;
a first capacitor overlapping with the first transistor;
a second capacitor overlapping with the second transistor; and
a first wiring electrically connected to the second capacitor,
wherein the first wiring and an electrode of the second transistor overlap each other;
wherein the first transistor, the second transistor, the first capacitor and the second capacitor are electrically connected to each other,
wherein a channel of the first transistor comprises a single crystal semiconductor,
wherein a channel of the second transistor comprises an oxide semiconductor,
wherein one electrode of the first capacitor comprises a projected portion, and
wherein the other electrode of the first capacitor comprises a depressed portion.

17. The semiconductor device according to claim 16, wherein the electrode of the second transistor is a gate electrode.

18. The semiconductor device according to claim 16,
wherein the first wiring is a common wiring, and
wherein the first wiring comprises copper.

19. The semiconductor device according to claim 16,
wherein the first transistor is electrically connected to the second transistor with a plug, and
wherein the plug comprises copper or tungsten.

20. The semiconductor device according to claim 16, further comprising a second wiring electrically connected to the first capacitor,
wherein the second wiring and an electrode of the first transistor overlap each other.

21. The semiconductor device according to claim 16,
wherein the second wiring is a common wiring, and
wherein the second wiring comprises copper.

* * * * *